United States Patent [19]
Rackoff et al.

[11] Patent Number: 5,574,890
[45] Date of Patent: Nov. 12, 1996

[54] COMPUTER DESIGN TOOL FOR ROTARY SLITTING OF METAL AND A METHOD OF USE THEREOF

[75] Inventors: William H. Rackoff, Pittsburgh; Albert R. Zelt, Bethel Park, both of Pa.

[73] Assignee: Asko, Inc., Homestead, Pa.

[21] Appl. No.: 298,571

[22] Filed: Aug. 31, 1994

[51] Int. Cl.$^6$ ............................ G06F 17/50; G01B 21/02
[52] U.S. Cl. ........................ 395/500; 364/551.01; 364/563
[58] Field of Search ................................. 395/500, 904, 395/920; 364/188, 148, 149, 151, 152, 551.01, 551.02, 554, 563, 571.01; 83/13, 14, 425.3, 481, 433, 492, 675, 553

[56] References Cited

U.S. PATENT DOCUMENTS 4,222,297  9/1980  Jackson ............................ 83/481
4,352,561 10/1982  Tohyama et al. ..................... 29/433
4,680,851  7/1987  Legg ................................ 356/332

OTHER PUBLICATIONS

Maryama et al., "Range Sensing by Projecting Multi–Slits With Random Cuts", IEEE 1989, pp. 163–168.
Schoenwandt, "A Multiprocessor Controlled Roll Slitting and Winding Machine", IEEE 1989, pp. 1–5.

Primary Examiner—Kevin J. Teska
Assistant Examiner—Tan Nguyen
Attorney, Agent, or Firm—Reed Smith Shaw & McClay

[57] ABSTRACT

A computer design tool for determining a predictive indication of slit width variation to adjust an arbor setup in rotary slitting of metal in accordance with the indication of slit width variation. A method of using such a design tool is also provided. The design tool performs an analysis on historical slitting runs to provide the predictive indication of slit width variation.

19 Claims, 16 Drawing Sheets

| Date | Material Thickness | Tensile | RC | Width Ordered |
|---|---|---|---|---|
| 7/1/94 | 0.020 | * | * | 3.000 |
| 7/31/94 | 0.050 | * | * | 10.000 |

| Date | Material Thickness | Tensile | RC | Width Ordered | Width Actual | Difference |
|---|---|---|---|---|---|---|
| 7/27/94 | 0.0320 | 50 | 0.0030 | 3.0000 | 2.9980 | 0.0020 |
| 7/27/94 | 0.0320 | 50 | 0.0030 | 5.0000 | 4.9970 | 0.0030 |
| 7/27/94 | 0.0320 | 50 | 0.0030 | 7.0000 | 6.9990 | 0.0010 |
| 7/27/94 | 0.0320 | 50 | 0.0030 | 9.0000 | 9.0000 | 0.0000 |
| 7/27/94 | 0.0240 | 50 | 0.0025 | 5.5000 | 5.4990 | 0.0010 |
| 7/27/94 | 0.0240 | 50 | 0.0025 | 5.5000 | 5.4980 | 0.0020 |
| 7/27/94 | 0.0240 | 50 | 0.0025 | 7.5000 | 7.5000 | 0.0000 |
| 7/27/94 | 0.0240 | 50 | 0.0025 | 7.5000 | 7.4970 | 0.0030 |
| 7/27/94 | 0.0240 | 50 | 0.0025 | 9.5000 | 9.4990 | 0.0010 |
| 7/27/94 | 0.0240 | 50 | 0.0025 | 9.5000 | 9.4990 | 0.0010 |
| 7/27/94 | 0.0240 | 50 | 0.0025 | 5.5000 | 5.4990 | 0.0010 |
| 7/27/94 | 0.0240 | 50 | 0.0025 | 5.5000 | 5.5000 | 0.0000 |
| 7/27/94 | 0.0240 | 50 | 0.0025 | 7.5000 | 7.4980 | 0.0020 |

Query Statistics
Count: 26
Average: .002
Minimum: .005
Maximum: 0
Std Dev: .001

*Figure 6*

|  | DATES | MATERIAL THICKNESS | TENSILE | HORIZONTAL CLEARANCE | WIDTH ORDERED |
|---|---|---|---|---|---|
| Lower: | * | 0.020 | 150 | 0.0005 | 16.00 |
| Upper: | * | 0.070 | 150 | 0.0070 | 60.00 |

Count: 38.0
Average: -0.006 in
Minimum: -0.011 in
Maximum: -0.001 in
StdDev: 0.003 in

*Figure 7*

| | | Head 1 Setup | | | | | |
|---|---|---|---|---|---|---|---|
| Master Coil Data | | Knife | Weight Ordered (lb) | Width Ordered (in) | Width Built (in) | # of Mults | Actual Weight (lb) |
| 62.000 | Master Coil Width in. | 0.5000 ▼ | | | 10.000 | | |
| 12345.0 | Master Coil Weight lb. | ▼ | | | | | |
| 199.1 | Weight per in. | ▼ | | | | | |
| 0.250 | Shoulder Scrap in. | | | | | | |
| 0.250 | Outboard Scrap in. | | | | | | |
| 0.4971 | Width Used in. | | | | | | |
| 61.506 | Width Remaining in. | | | | | | |
| 99.6 | Weight Used lb. | | | | | | |
| 12245.4 | Weight Remaining lb. | | | | | | |
| 0.0% | Coil Yield % | | | | | | |

Interface
Extra amount to add to Width Ordered in.
.01
1 Observations Found
Accept  Change  View Detail Input  Delete
OK  Screen1

Figure 10B

| Master Coil Data | | Knife | Weight Ordered (lb) | Width Ordered (in) | Width Built (in) | # of Mults | Actual Weight (lb) |
|---|---|---|---|---|---|---|---|
| 62.000 | Master Coil Width in. | 0.5000 ▼ | | 10.000 | 10.010 | 2 | 3984.8 |
| 12345.0 | Master Coil Weight lb. | ▼ | | | | | |
| 199.1 | Weight per in. | ▼ | | | | | |
| 0.250 | Shoulder Scrap in. | ▼ | | | | | |
| 0.250 | Outboard Scrap in. | ▼ | | | | | |
| 20.511 | Width Used in. | ▼ | | | | | |
| 41.492 | Width Remaining in. | ▼ | | | | | |
| 4084.4 | Weight Used lb. | ▼ | | | | | |
| 8260.6 | Weight Remaining lb. | ▼ | | | | | |
| 32.3% | Coil Yield % | ▼ | | | | | |

Input  Delete

OK  Screen1

*Figure 10C*

COMPUTER DESIGN TOOL FOR ROTARY SLITTING OF METAL AND A METHOD OF USE THEREOF

FIELD OF THE INVENTION

The present invention relates to a computer design tool for rotary slitting of metal and a method of use of such a design tool, and especially to a design tool for improving the accuracy of slit width in the continuous rotary slitting of coiled metal.

BACKGROUND OF THE INVENTION

Slitting is the dividing of a single, wide strip of metal into narrower strips or slits (also called mults or strands). Some products made from slit metal stock include cans, razor blades, Venetian blinds, office furniture, automobile parts, electrical equipment, appliances, aerospace parts, medical equipment, building materials, jewelry and blanks for minting coins. Slitting is also applied to nonmetallic materials including paper, plastic, film and fiber.

Although metal slitting machines may vary in size from so-called "tabletop" slitters with small motors (used for foil to light gauge material) to those using motors of several hundred horsepower and requiring a building hundreds of feet in length, all slitting machines require essentially the same type of tooling, and vary only in the size, quantity and customization of the end use. A comprehensive review of metal slitting machinery and a discussion of many of the system parameters relevant to such machinery may be found in Rogers, J. W. and Millan, W. H., *Coil Slitting*, Pergamon Press (1972), the disclosure of which is incorporated herein by reference.

In general, all slitting machines have three major components: (1) a means to get the metal to the slitter—for coil slitters it is an uncoiler (also referred to as an unwinder or payoff reel); (2) a slitter head—for holding the rotary knives and associated tooling (such as spacers, stripper rings etc.) and (3) a recoiler (also referred to as a rewinder or take-up reel)—for rewinding the mults (strands).

Operators of slitting machines generally find that the actual slit width of a particular mult varies from the theoretical slit width as determined by the distance between the slitting knives positioned upon an arbor. For most metals, the actual slit width is found to be narrower than the theoretical slit width. To account for "slit width shrinkage" with such metals, operators generally adjust the position of the slitting knives to provide a theoretical slit width slightly greater than the ordered or desired slit width.

Although slit width variation is well known in the metal slitting industry, the understanding of the physical mechanisms underlying the phenomenon is incomplete. Nonetheless, certain system parameters such as the tensile strength of the metal, the thickness of the metal, the horizontal clearance between opposing knives and the slit width are known to influence the amount of variation. In that regard, practitioners often keep a journal of such system variables and the experienced slit width variation as a reference for attempting to forecast slit width variation in future runs.

Still, adjustment of knife position to account for slit width variation remains very much an art rather than a science. In the art of predicting slit width variation there are several rules of thumb, including: (1) slit width shrinkage is more pronounced in heavier gauge materials and (2) the slit width shrinkage is approximately one half of the horizontal clearance between two adjacent, opposing knives.

Given the increasingly precise mult width specifications required of metal providers, a design tool for assisting operators of slitting machinery to more accurately adjust mult width to account for slit width variation is very desirable.

SUMMARY OF THE INVENTION

Accordingly, the present invention provides a design tool that assists an operator to arrive at an estimate of slit width variation and thereby an estimate of the adjustment required of slitter knife position to achieve a desired mult width.

In general, the present design tool comprises a control module which includes a central processing unit. The design tool further comprises an input means in communicative connection with the control module for entering commands to the control module by an operator and for entering of data. This data may be entered by the operator or collected using automated instrumentation. The data to be entered comprise data sets. Each data set comprises a set of values of system variables affecting slit width variation. Each set of such values of system variables preferably corresponds to an actual slitting run performed upon a slitting machine. Each data set also comprises the slit width variation experienced (under the conditions of the corresponding values of system variables with the data set) in each of the actual slitting runs. The present design tool may thus be used to create a historical record of slitting operations upon a particular slitter head.

The design tool further comprises a memory in communicative connection with the control module. The memory operates to store the data sets. Preferably, the data sets are arranged in a list so that each set of values of the system variables is linked to and retrievable with the corresponding slit width experienced.

The control module preferably includes a means for identifying and retrieving data from the list. In any data set so identified/retrieved, the values of the system variables thereof fall within defined ranges for such values. These defined ranges may be input by the operator as query ranges via the input means. Preferably, however, the design tool determines a suitable query range for each system variable based upon input values for such system variables to be used in a future slitting operation.

The control module further includes a means for performing an analysis upon the retrieved data to provide a predictive indication of slit width variation to be experienced in such future slitting operation.

The design tool also preferably includes means for determining an arbor setup accounting for the predictive indication of slit width variation. This means for determining an arbor setup may comprise an independently operating design tool adapted to communicate with a design tool which provides a predictive indication of slit width variation. Alternatively, the processes of slit width variation estimation and determining an arbor setup may be combined into a single, integrated design tool.

The present design tool further preferably comprises means for creating supplemental data tables from the data sets stored in the memory using statistical data fitting procedures. Such supplemental data tables may be used, for example, to supplement queries over ranges of a particular system variable in which there is little or no data.

Preferably, data sets from slitting runs in which the arbor setup was determined using the slit width variation estimated by the present design tool are stored in the memory of the design tool. Preferably, as additional data sets are stored in the list (whether comprising data sets created using the design tool or not), n-dimensional models of the data sets, wherein n is the number of system variables represented in such an n-dimensional model, are created. Upon creation of an n-dimensional model, an estimate of slit width variation for a particular set of system variables can be determined by the design tool by direct reference to the n-dimensional model, without the need to specify a query range. An arbor setup can then be determined from this modeled estimate of slit width variation using the means for determining the arbor setup.

The present design tool thus provides an apparatus for providing an estimation of slit width variation with substantially greater accuracy than presently achievable in metal slitting. Moreover, the accuracy of the present design tool continually improves as additional slitting runs are performed using the design tool and the information comprising the resultant data sets corresponding to such slitting runs becomes part of the design tool.

The present invention also provides a method of predicting slit width variation using a design tool as described above. In general, the method comprises the steps of:

a) entering data sets comprising sets of values of system variables affecting slit width variation using the input means, each of the sets of values of system variables corresponding to an actual slitting run performed on a slitting machine, each of the data sets further comprising a slit width variation experienced corresponding to the set of values of system variables in the data set, b) storing the data in the memory in the form of a list, the slit width experienced corresponding to each of the sets of values of system variables being linked to the corresponding set of system variables to enable identification therewith, c) defining a query range for each of the system variables, d) identifying data sets in which the value of each of the system variables in the identified sets falls within the corresponding defined query range upon providing a query command to the command module, the values of the actual slit width experienced corresponding to each of the identified sets of values of system variables being identified with its corresponding set of values of system variables, and e) performing a statistical analysis upon the identified values of slit width variation experienced to provide a predictive indication of a slit width variation to be experienced in a future slitting run in which the values of the system variables fall within the defined query ranges.

BRIEF DESCRIPTION OF THE DRAWINGS

FIG. 6 illustrates an embodiment of a query screen for use in the present invention.

FIG. 7 illustrates an embodiment of a query report screen for use in the present invention.

FIGS. 10A through 10C illustrate embodiments of data screens for use in an embodiment of the present design tool in which an arbor setup is calculated.

DETAILED DESCRIPTION OF THE INVENTION

1. Description of the Slitting Process

In discussing the present invention, it is first necessary to set forth in some detail the design of slitting heads and the slitting process.

Although there are many variations of slitter heads, all slitter heads have essentially the following design: (1) a pair of arbors which hold the knives, spacers and stripper rings (if stripper rings are used); (2) a pair of housings which hold the arbors in position; and (3) a method of adjusting the arbors vertically. Some slitter heads also include a motor to drive the arbors.

Figure 1:
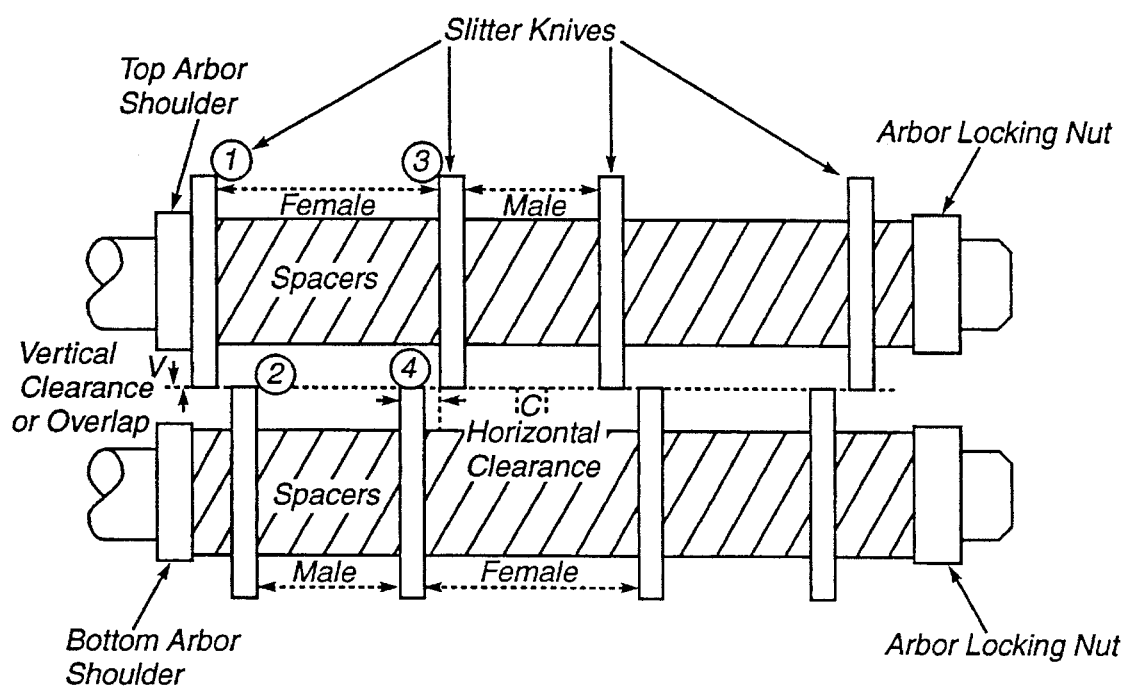
FIG. 1 illustrates an arbor setup.

Referring to FIG. 1, slitting is accomplished by two sets of circular slitting hives, mounted on parallel shafts (arbors) and set in a staggered sequence. The theoretical width of a slit, mult or strand is generally approximated by the distance between consecutive slitter hives upon an arbor. The slitting knives are so aligned and overlapped (between arbors) as to cause a shearing action to take place when a piece of metal is forced therebetween.

Spacers fit over the arbors between the knives to position each knife correctly to obtain desired slit or mult widths. Because slitter operators slit a variety of widths, the operators must inventory spacers of differing width. Additionally, plastic shims traditionally have been used to increase a slitter operators ability to accommodate a number of mult widths. Shims are inserted between spacers or between spacers and knives to make the final adjustments to mult width and horizontal clearance. "Horizontal clearance" refers to the horizontal separation between the shearing planes of opposing knives as illustrated in FIG. 1.

The use of shims has decreased in recent years because the thickness of plastic shims is not held to the accuracy required in current slitting operations and, even if such thickness is accurately known, such plastic shims are compressible and will change size when inserted in the setup.

Current tolerance and quality requirements thus often mandate the use of "metal-to-metal" tooling and "shimless" slitting. Whereas, in the past, tooling has been supplied in tolerances in tenths of thousandths of an inch (0.0001"), suppliers, such as American Shear Knife Division of ASKO, Inc. of Pittsburgh, Pa., currently supply shimless tooling with tolerances in ten millionths of an inch, or, in metric units, tolerances in microns.

A Computer Assisted Shimless Slitting (CASS®) system is also available from ASKO® that uses a computer program in conjunction with a customized set of tooling manufactured to achieve tolerances within 1 μm. The CASS design tool and tooling eliminates the need for plastic shims and the inaccuracy inherent in their use. CASS also generates a parts list and arbor loading sequence and suggests the horizontal clearance for the material being slit. In one embodiment, CASS determines the horizontal clearance from parameters including the thickness of the material and the tensile strength of the material. The data entered into the CASS program also allows the user to maintain historical records of mult slitting.

The knife arrangement shown in FIG. 1 is a typical slitter knife arrangement, known as a male-and-female arrangement. This knife arrangement is meant only to be exemplary, however. The present invention is suitable for use with any knife arrangement.

In the male-and-female arrangement, the first knife is placed on the top arbor against the inboard locating shoulder. A spacer (or spacers or a combination of spacers and shims) equal in thickness to the width of the knife plus the desired clearance is placed on the bottom arbor against the shoulder. Then the second knife is placed on the bottom arbor. A spacer (or spacers) usually equal to the width of the strip to be slit is placed on the top arbor and a third knife is added. A spacer (or spacers) of suitable width (to accommodate horizontal clearance) is placed on the bottom arbor and a fourth knife is added. This pattern is repeated across the arbors.

Figure 2A:
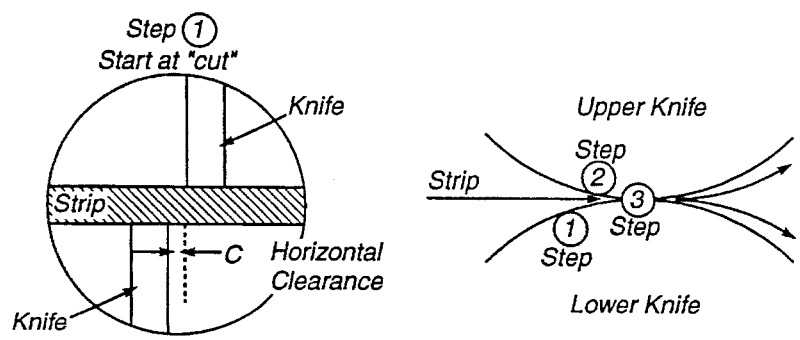
FIGS. 2A through 2C illustrate the sequence of events occurring in the slitting of a sheet of metal between opposing rotary slitting hives.
Figure 2B:
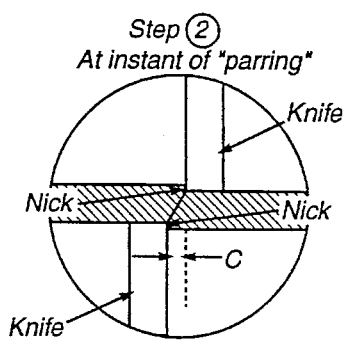
Figure 2C:
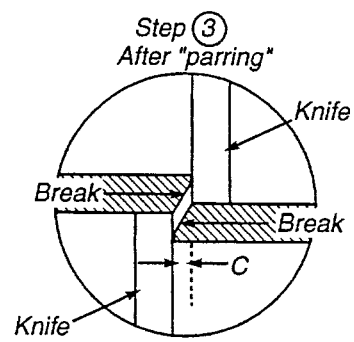

During slitting operations, as the metal strip enters between the arbors (see FIG. 2A), the knives penetrate the strip (see FIG. 2B) until the shear forces upon the strip exceed the ultimate tensile strength of the material and the strip separates (see FIG. 2C). The penetration is commonly referred to as the "nick" and the separation is commonly referred to as the "break." The depth of penetration is influenced by the ultimate tensile strength of the material and its relationship to the yield strength and the thickness of the strip.

When the horizontal clearance is correct and the knives are in good condition, a good slit edge results. An "ideal" slit edge has: (1) a shiny penetration zone (nick); (2) a smooth, matte gray separation zone (break) and (3) a relatively straight demarcation between the two zones. The most important factor in achieving an "ideal" slit edge is the horizontal clearance between a pair of slitter knives. The proper horizontal clearance depends primarily upon the thickness of the material and the tensile strength of the material. In general, as the gauge of the strip and/or its tensile strength increases, the horizontal clearance between opposing knife blades should be increased. Other important parameters that effect proper horizontal clearance are: (i) the condition of the equipment, including arbor parallelism, (ii) the condition of the arbor bearings, (iii) arbor deflection, (iv) the condition of the slitter tooling (e.g., knives, spacers and shims) and (v) the cleanliness of the setup.

Figure 3:
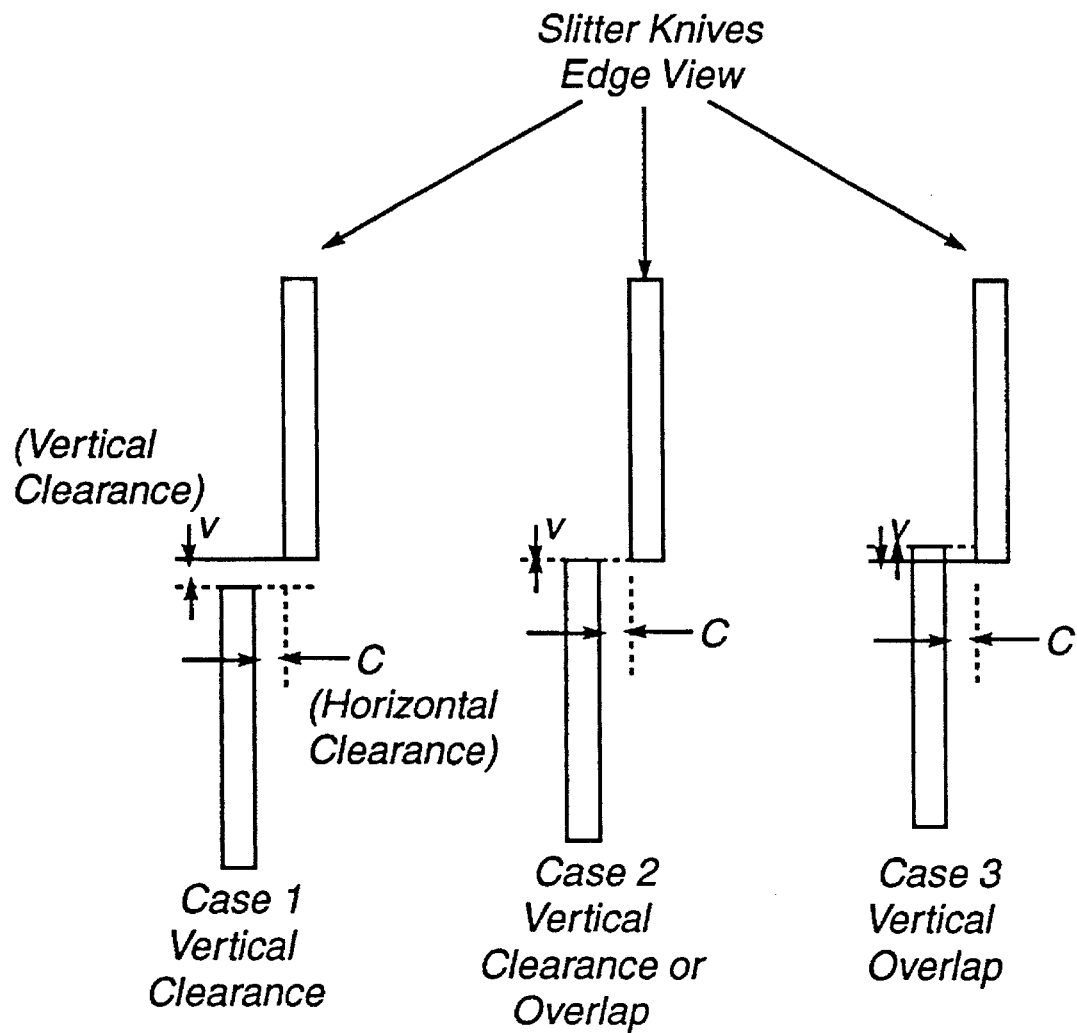
FIG. 3 illustrates the adjustment of vertical clearance between opposing knives.

Another important factor in producing a quality slit edge is the vertical positional relation of the top and bottom knives. The correct vertical position depends on the strip gauge, its tensile strength, the horizontal clearance and the condition of the equipment. FIG. 3 illustrates vertical arbor position resulting in vertical clearance, no vertical clearance and vertical overlap. A general rule in setting the vertical position of the knives is to bring the arbors together until a cut is produced, then close them slightly more to compensate for such factors as variation in strip thickness, condition of the bearings, tolerance in the arbor position device, arbor deflection, knife wear and other system variables.

Figure 4:
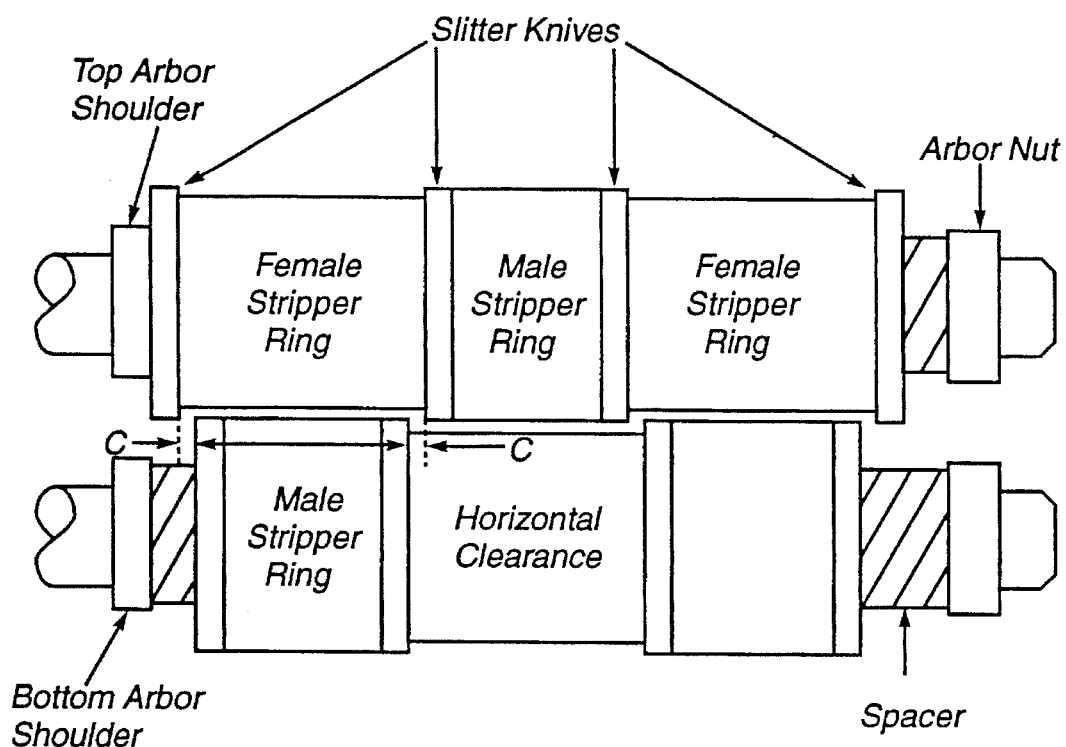
FIG. 4 illustrates a typical male-and-female type arbor setup.

FIG. 4 illustrates the use of strippers which have the following functions: (1) forcing ("stripping") the slit mult from between the knives as the slit mult leaves the slitter head; (2) supporting the strip between the knives so that it is held flat during slitting and (3) in some machines, doubling a pinch rolls to drive the material through the arbors.

2. The Present Design Tool

Figure 5:
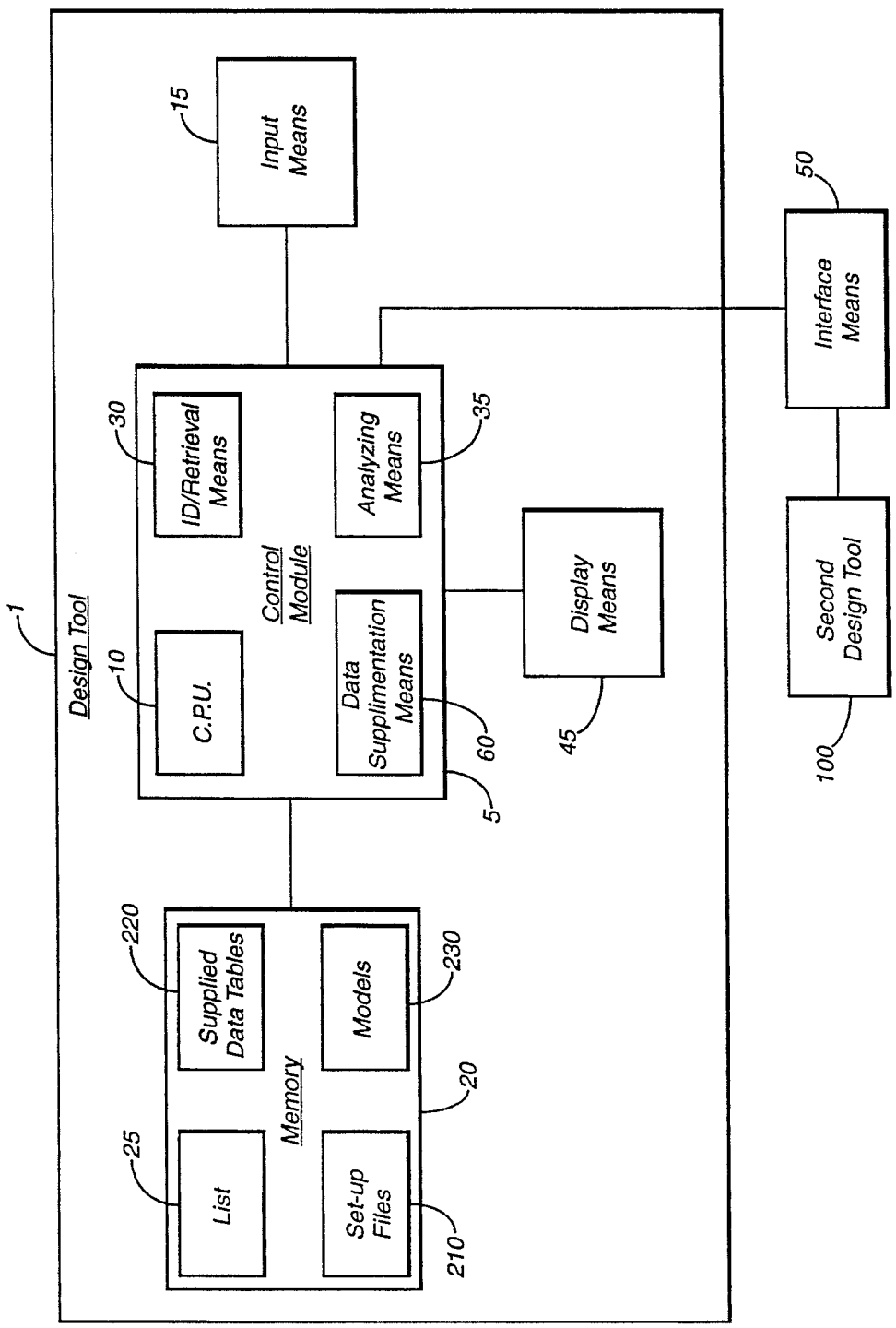
FIG. 5 illustrates an embodiment of the present design tool.

Referring to FIG. 5, design tool 1 comprises a control module 5. Control module 5 preferably comprises a central processing unit 10. Design tool 1 also comprises an input means 15 in communicative connection with control module 5 for entering data and/or commands. Input means 15 may, for example, comprise a keyboard, a mouse and/or instrumentation for automated input of data. Such an automated instrument may, for example, comprise a measuring device or devices for measuring actual slit width, horizontal clearance, arbor position, vertical clearance and/or arbor deflection as known in the art. Design tool 1 further comprises a memory 20 for storing data entered via input means 15. An embodiment of the source code for operation of one embodiment of design tool 1 is included in Appendix A hereto. This embodiment of source code is designed for use in the WINDOWS operating system of Microsoft Corporation.

In operation of design tool 1, data sets comprising sets of values of system variables are entered via input means 15. As used herein, the phrase "system variables" refers to variables or parameters affecting slit width variation. Each of the sets of values of system variables preferably corresponds to sets of values of system variables as occurred in an actual slitting run performed on a single, identified machine (slitter head). The slit width variation experienced under the conditions of each of the sets of values of system variables is also entered. Of course, the actual slit width and the theoretical slit width may be entered, and design tool 1 may calculate the experienced slit width difference or variation. Thus, reference to the storage in memory 20 of the value of slit width variation experienced as discussed herein refers to either the storage of the slit width variation experienced or to storage of data from which such slit width variation can be calculated.

Design tool 1, thus, provides a means for creating a historical record of slit width variation experienced under specified conditions as defined, at least in part, by the set of system variables. Such historical record may be maintained for one or more slitting heads.

The sets of values of system variables and the corresponding slit width variation experienced are stored in memory 20. Preferably, the data sets are stored in a list 25 within memory 20. Preferably, each set of values of system variables and the corresponding slit width variation experienced under those conditions are linked within a single data set stored in list 25, enabling identification and retrieval of both the values of the system variables and the corresponding slit width variation experienced upon an appropriate command to control module 5. This result may be accomplished by creating appropriately dimensioned arrays of data sets as known in the computer arts.

An example of a portion of such a list for a particular machine or slitter head is provided in Table 1. A separate list 25 as set forth in Table 1 is preferably created for each slitter head of interest.

TABLE 1

| Date (1994) | Material Thickness (in.) | Tensile Strength (kpsi) | Horiz. Clearance (in.) | Theoretical Width (in.) | Width Actual (in.) | Diff. (in.) |
|---|---|---|---|---|---|---|
| 7/27 | 0.0320 | 50 | 0.0030 | 1.0000 | 0.9990 | 0.0010 |
| 7/27 | 0.0320 | 50 | 0.0030 | 3.0000 | 2.9980 | 0.0020 |
| 7/27 | 0.0320 | 50 | 0.0030 | 5.0000 | 4.9970 | 0.0030 |
| 7/27 | 0.0320 | 50 | 0.0030 | 7.0000 | 6.9990 | 0.0010 |
| 7/27 | 0.0320 | 50 | 0.0030 | 9.0000 | 9.0000 | 0.0000 |
| 7/27 | 0.0320 | 50 | 0.0030 | 11.0000 | 10.9980 | 0.0020 |
| 7/27 | 0.0320 | 50 | 0.0030 | 13.0000 | 12.9970 | 0.0030 |
| 7/27 | 0.0320 | 50 | 0.0030 | 15.0000 | 14.9950 | 0.0050 |
| 7/27 | 0.0320 | 50 | 0.0030 | 17.0000 | 16.9990 | 0.0010 |
| 7/27 | 0.0320 | 50 | 0.0030 | 19.0000 | 18.9970 | 0.0030 |
| 7/27 | 0.0580 | 45 | 0.0030 | 2.0000 | 1.9990 | 0.0010 |
| 7/27 | 0.0580 | 45 | 0.0030 | 4.0000 | 3.9970 | 0.0030 |
| 7/27 | 0.0580 | 45 | 0.0030 | 6.0000 | 5.9980 | 0.0020 |
| . | . | . | . | . | . | . |
| . | . | . | . | . | . | . |
| . | . | . | . | . | . | . |

In Table 1, the system variables in each data set include the material thickness, the tensile strength, the horizontal clearance and the theoretical slit width for which the arbors were set. Each data set may also include identifying parameters other than system variables affecting slit width variation such as the date of the corresponding slitting run and the customer order number. As illustrated in Table 1, the date of each slitting run is included in each data set with the corresponding set of system variables.

By identifying the customer in the data sets, design tool 1 enables analysis of slitting runs performed on a per-customer basis. For example, in addition to estimating slit width variation, design tool 1 may be used to determine a $C_{pk}$ on an overall or per-customer basis. $C_{pk}$ is an industry wide statistical measurement of slit width accuracy. See e.g., Continuing Process Control and Process Compatibility Improvement, distributed by Ford Motor Company.

Values of substantially each system variable known to affect slit width may be included in each data set. These system variables include, but are not limited to the following: material thickness, theoretical mult width, tensile strength, horizontal clearance, yield strength, vertical clearance, strip thickness variability, material ductility, position of a mult on the arbor, knife diameter, knife thickness, knife edge condition (for example, (i) when reground, (ii) quality of grind, (iii) surface finish, (iv) knife metallurgy, and (v) knife tolerances), spacer diameter, stripper ring conditions (for example, (i) stripper ring material hardness and (ii) the striper ring mechanics/physical characteristics), uncoiler tension, recoiler tension, slitter speed synchronization, system tension (tension leveler), pass line configuration (that is, the positional relationship between, for example, the uncoiler, the arbor and the recoiler), speed of operation, condition of spacers, condition of slitter head, condition of the arbor lock-up system (for example, the condition of the nut or hydraulic nut, if applicable), temperature of tooling and material, spacer materials (for example, steel, aluminum or ceramic), arbor deflection during slitting, system lubricity (that is, if a lubricant used, and, if used, what type), strip shape and tooling tolerances. In cases of system variables such as the knife edge condition, which require subjective judgment, an operator is preferably provided with several specified conditions/values for such system variables from which one condition/value is chosen.

Although it may be preferable in certain cases to include values of as many system variables known to affect slit width variation as available, very good results are achievable upon storing data sets comprising the material thickness, the mult width and the material tensile strength. Preferably horizontal clearance is also included in the data sets. Preferably, the position of the mult or slit on the arbor is also considered.

In preparing to set up an arbor for a future slitting run, the operator first uses design tool 1. In that regard, control module 5 further comprises a means for identifying/retrieving data 30 and a means for analyzing data 35. Preferably, upon issuance of an appropriate command (for example, "query") to control module 5, a query screen 40 as illustrated in FIG. 6 is displayed upon a display means 45, such as a CRT. The particular query screen 40 illustrated in FIG. 6 and other screens discussed hereafter are designed for use in the WINDOWS operating system.

Referring to FIG. 6, query screen 40 preferably comprises a data entry area 47 in which an operator may enter data comprising ranges of values of system variables. The operator may choose a range as broadly or a narrowly as desired. For example, if the operator wishes only to identify and analyze data corresponding to slitting runs in which the material had a tensile strength of 50 kpsi, the operator may enter 50 kpsi as both the upper and lower limits of the tensile strength system variable in the operator's query. Likewise, the operator may extend his or her query to encompass all the data available for a particular system variable upon entering a range known to encompass all the data for that system variable. As illustrated in the embodiment of the present invention set forth in FIG. 6 (for the tensile strength and horizontal clearance entries), a code character such as an asterisk is preferably defined to indicate that the operator desires the upper and lower limit of a particular system variable to be unbounded.

The query set forth in FIG. 6 will, therefore, identify all data sets corresponding to slitting runs occurring between the dates of Jul. 1, 1994 and Jul. 31, 1994 in which the material thickness was between 0.020 and 0.050 in. and the theoretical mult width was between 3 and 10 in. The query ranges for the tensile strength and the horizontal clearance are unbounded.

Alternatively, the values of the system variable for a future slitting run may be entered and a query may be executed using predefined ranges of system variable stored in memory 20. Preferably, these predefined ranges of system variable are identified empirically for a particular slitter head. In general, the more sensitive the slit width variation is to a particular variable (over a particular range of that variable), the narrower the preferred query range for that variable should be.

Examples of empirically specified query ranges for the system variables material thickness, tensile strength, horizontal clearance and mult width are provided in Table 2 below. In Table 2, horizontal clearance is expressed as a percentage of material thickness.

TABLE 2

| Material Thickness (in.) | Tensile Strength (kpsi) | Horizontal Clearance (%) | Mult Width (in.) |
| --- | --- | --- | --- |
| 0.0 to 0.0249 | 0.0 to 39.99 | 0.0 to 7.99 | 0.0 to .999 |
| 0.025 to 0.0639 | 40.0 to 64.99 | 8.0 to 11.99 | 1.0 to 2.999 |
| 0.064 to 0.1009 | 65 to 100.99 | 12.0 to 17.99 | 3.0 to 9.999 |
| 0.101 to 0.1499 | 101 to 200 | 18.0 to 24.99 | 10.0 to 19.999 |
| 0.15 to 0.2009 | | 25 and above | 20 to 60 |
| 0.201 to 0.2759 | | | |
| 0.276 to 0.50 | | | |

Referring to Table 2, if the following values of the material thickness, tensile strength, percent horizontal clearance and desired mult width, respectively, for a future slitting run were entered: 0.13 in., 50 kpsi, 22% and 30 in., the respective query ranges would be as follows: 0.101 to 0.1499 in., 40.0 to 64.99 kpsi, 18.0 to 24.99% and 20 to 60 in.

Predefined query ranges may also be specified simply by evenly dividing the full range over which a particular system variable is expected to vary into even intervals (query ranges). For example, if tensile strength is expected to vary between 50 and 300 kpsi, ten query ranges of 25 kpsi each may be specified. The specified query ranges, can be changed in light of results obtained.

Upon completion/identification of appropriate query ranges, a query command is issued to command module 5 to identify/retrieve data from list 25 within the query ranges. Design tool 1 may identify/retrieve only data corresponding to actual slit width variation experienced for data sets in which the values of each system variable falls within the specified query ranges, but, preferably, the data comprising each such set of system variables as well as the slit width variations corresponding thereto are identified/retrieved and are displayable in view area 48 as shown in FIG. 6. In this manner, the operator may scroll/browse through identified data sets.

Once the slit width variations experienced (and the data sets) within the query ranges are identified, analysis of the data corresponding to the slit width variations experienced is executed by a means for analyzing data 35 included in control module 5. Preferably a statistical analysis is performed. Preferably, incomplete data sets (or data sets in which a value of one or more of the system variables for which a query range has been defined are not present) are not considered in the analysis to determine a predictive indication of slit width variation.

Figure 8:
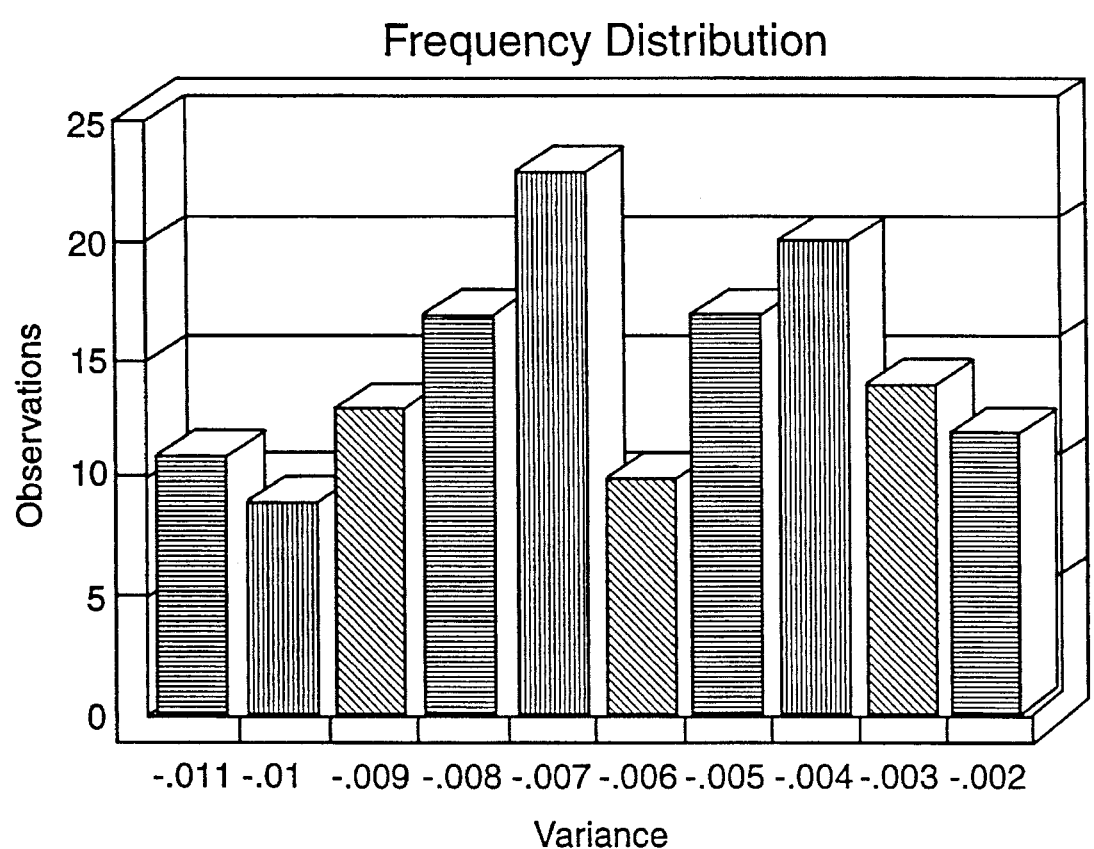
FIG. 8 illustrates a graphical representation of the results of a query.

As shown in FIGS. 6 and 7, the analysis preferably includes: (i) a count of the number of data sets within the query range, (ii) the average slit width variation experienced corresponding to the data sets within the query range, (iii) the minimum slit width variation experienced, (iv) the maximum slit width variation experienced and (v) the standard deviation ($\sigma$). Moreover, graphical representations of the data such as the frequency distribution of FIG. 8 (generated by control module 5 upon receiving an appropriate command such as "chart") are preferably displayable upon display means 45 to provide additional information to the operator for assistance in analyzing the data.

Preferably, the average slit width variation as determined and displayed upon display means 45 is used to provide an indication or estimate of the amount of variation from the theoretical slit width to be expected when the system variables of a particular slitting run are within the specified ranges. Other statistical measurements such as the mean slit width variation may be used, however. After an estimate of slit width variation is determined, an arbor setup is built accounting for the predicted slit width variation.

Design tool 1 preferably includes means for determining such arbor setup, including an arbor loading sequence. This result may be accomplished in several manners. First, design tool 1 can be placed in communicative connection with at least a second, independently operative, computer-based design tool 100 that operates to determine an arbor setup from available tooling, but does not provide a predictive indication of slit width variation. An example of such a design tool is the CASS design tool available from the American Shear Knife Division of ASKO, Inc.

Design tool 100 may share completely the same resources (for example, control module 5, input means 15, memory 20, and display means 45) as design tool 1, or, alternatively, design tool 100 may comprise its own resources and be connected to design tool 1 via an interface means 50, as in a network system. The latter alternative is illustrated in FIG. 5.

Reference to second design tool 100 is made herein for purpose of the present description only. It is understood by one skilled in the art that design tool 1 and design tool 100 may be viewed and/or constructed as a single design tool. In that regard, design tool 1, may itself include all means necessary for determining an arbor setup and, thus, not require independently operative design tool 100.

Figure 9:
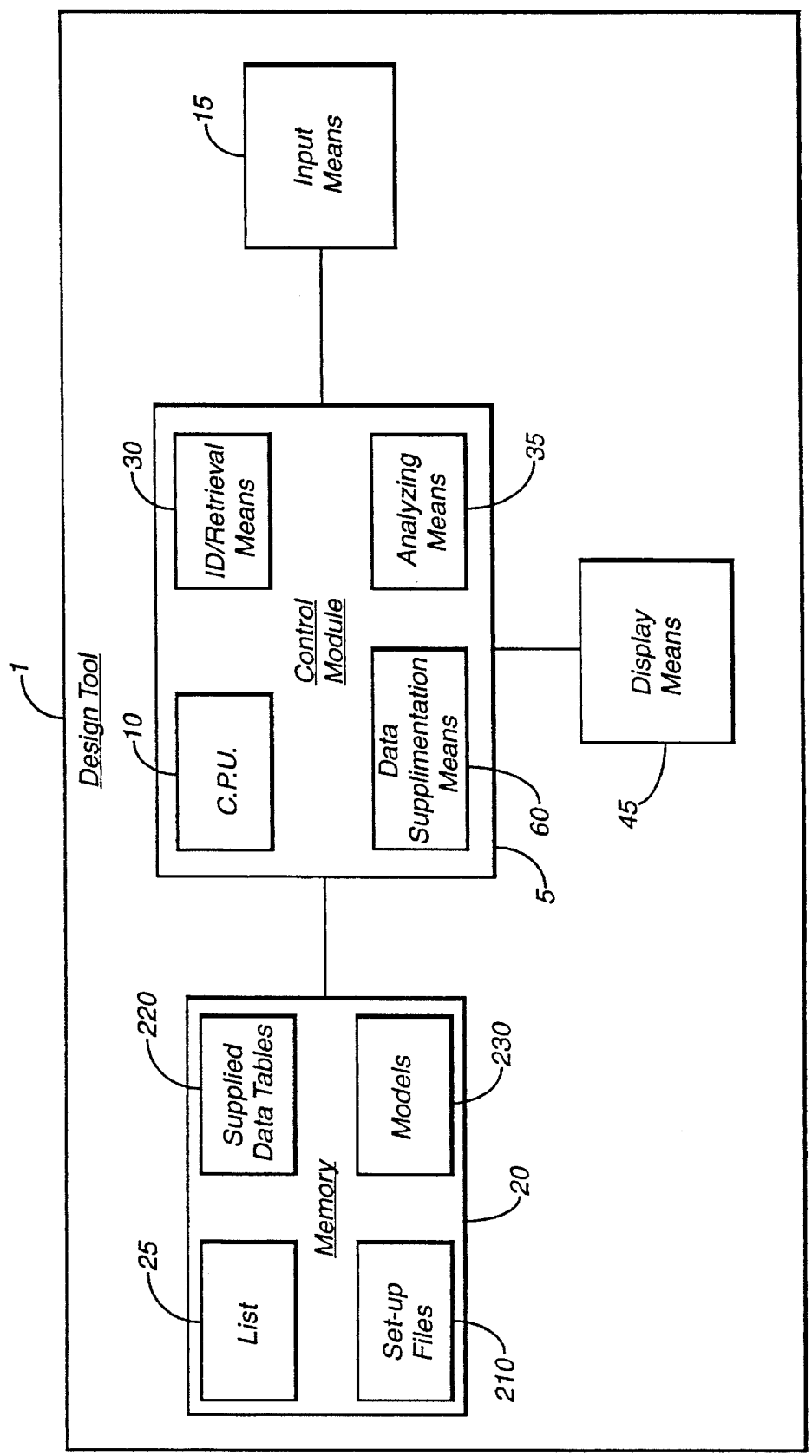
FIG. 9 illustrates an embodiment of the present invention in which the design tool determines an arbor setup.

FIG. 9 illustrates an embodiment of a design tool 1 in which design tool 1 either fully incorporates all means necessary to determine an arbor setup, or, in which design tool 1 communicatively operates with independently operable design tool 100 sharing each of memory 20, control module 5, input means 15 and display means 45. In the latter case, all executable files and non-executable files of each of design tool 1 and design tool 100 are preferably stored in memory 20. The following discussion describes this latter embodiment.

In using the design tool 100, relevant system variables are input via input means 15, and design tool 100 determines an appropriate arbor loading sequence to match the entered data. One embodiment of this process will be described referring to FIGS. 10A, 10B and 10C.

Figure 10A:
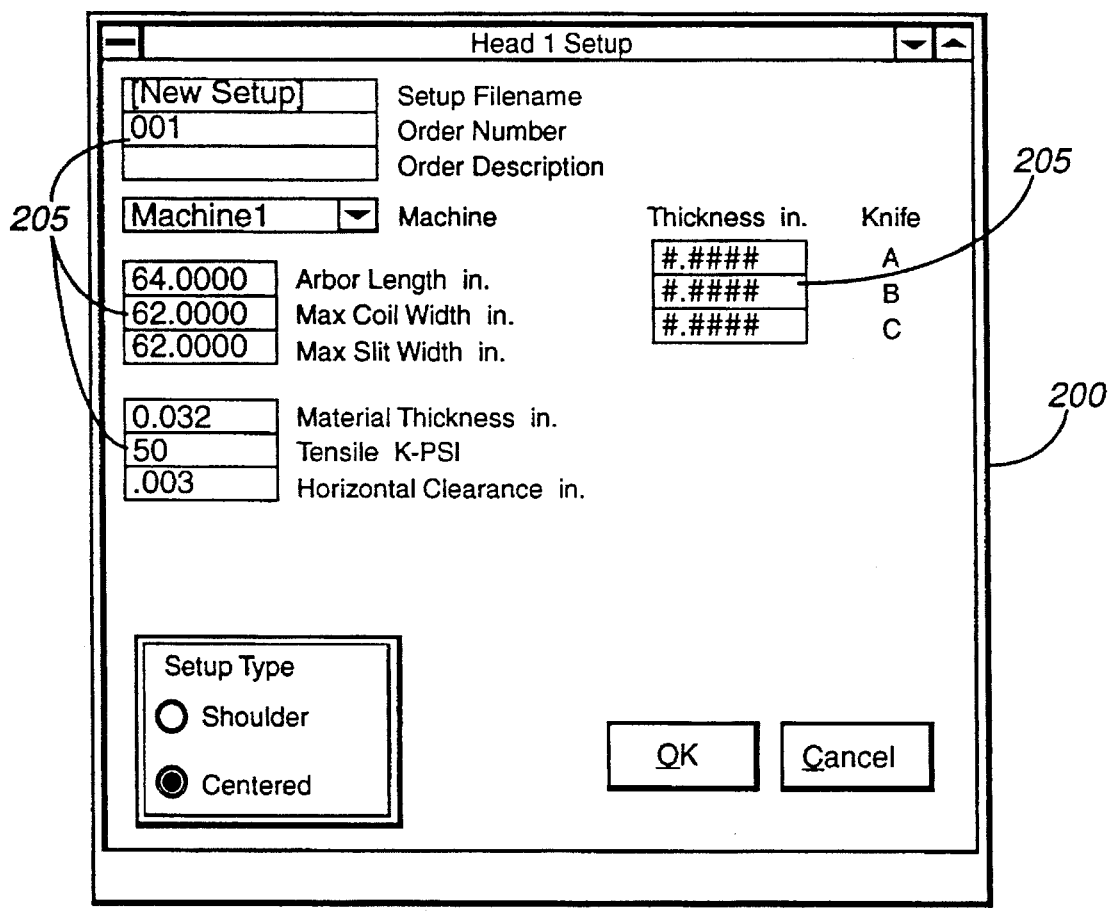

FIG. 10A illustrates an initial setup screen 200 of design tool 100 (or design tool 1), which is displayed upon display means 45. Setup screen 200 facilitates creation of a setup file 210 in which system variables and other parameters, entered via input means 15, are stored in memory 20.

Setup screen 200 includes several data areas 205 for entrance of identifying parameters such as a filename for setup file 210, an order number and an order description. Setup screen 200 also comprises a means for selection of the appropriate machine or slitter head, which may comprise a pull-down menu. Setup screen 200 further comprises one or more data areas 205 for entrance/calculation of the values of system variables. The system variables set forth in setup screen 200 include the material thickness, the tensile strength, the horizontal clearance and the knife thickness.

Preferably, default values are set for some of the parameters and/or system variables which do not often vary between slitting runs. Such parameters include the arbor length, the maximum coil width, the setup type (for example, shouldered or centered) and the maximum slit width.

Figure 11:
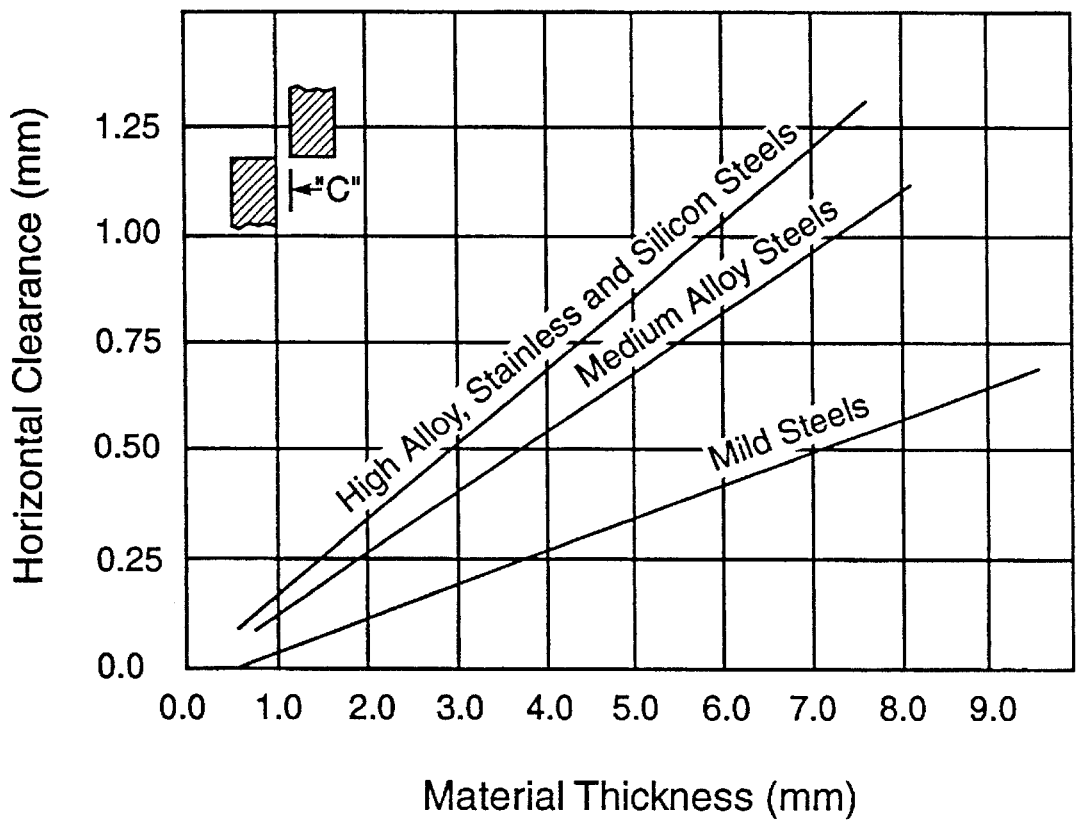
FIG. 11 illustrates a model for calculating horizontal clearance from material thickness and material tensile strength.

In the case of the system variable, horizontal clearance, it is possible to calculate a value therefor from other system variables. For example, the horizontal clearance can be calculated from the material thickness and the tensile strength using models/formulas known in the art. An example of one such model is illustrated in FIG. 11.

Upon entrance of the data required in setup screen 200, the operator enters a command (for example, "OK") via input means 15. Thereafter, as illustrated in FIG. 10B, a second setup screen 250 is preferably displayed on display means 45. Setup screen 250 includes a number of data areas 255. As illustrated in FIG. 11B, master coil data, including the master coil width and the master coil weight are entered via input means 15. The weight per inch can be calculated from other data input. The shoulder side scrap (or the amount of scrap on the inboard side of the setup) and the outboard side scrap (or the amount of scrap on the outboard side of the setup) are also entered.

In data area 255 shown on the right side of setup screen 250 a number of system variables relevant to the arbor setup, including the desired mult width (the width ordered) and the knife thickness are entered via input means 15. As illustrated in FIG. 11B, upon entrance/calculation of a predetermined number of system variables (in this case, the material thickness, the theoretical slit width, the tensile strength and the horizontal clearance), design tool 100 communicates with design tool 1 to acquire a predictive indication of the slit width variation for use in determining the arbor setup. In effect, design tool 1 may act as a subroutine of design tool 100.

An interface screen 300 is preferably displayed upon display means 45. Preferably, (when using query ranges to determine an estimate of slit width variation) default query ranges are set forth in design tool 1 (as discussed in connection with Table 2) and the average slit width variation for the data sets identified by design tool 1 is automatically displayed upon interface screen 300. Alternatively, an operator can enter query ranges as discussed above to arrive at a predictive indication of slit width variation such as the average slit width variation over a query range.

In the embodiment of FIG. 11B, the operator is given the choice of accepting or altering the suggested amount to add to or subtract from the theoretical slit width (using the estimated slit width variation provided by design tool 1 over the specified query range) in creating an arbor setup using design tool 100. The operator is preferably also provided a choice to view the details of a query executed by design tool 1 (as such details are discussed above).

Upon accepting the suggested adjustment to the theoretical slit width provided through the interface with design tool 1, interface screen 300 is preferably removed and the width to be built is calculated by design tool 100 and set forth upon setup screen 250. At this point, master coil data, such as the coil width used, the coil width remaining, the coil weight used, the coil weight remaining and the coil yield can be calculated as illustrated in FIG. 10C. In the example of FIGS. 10A through 10C, an estimated slit width variation of −0.01 was determined. Therefore, 0.01 in. is added to the slit width ordered to arrive at the slit width to be built (that is, 10.010 in).

The above procedure is repeated for each mult to be slit in a particular slitting run. After the last mult to be slit in the slitting run is entered, the arbor loading sequence can be calculated by design tool 100 using the adjusted slit widths calculated via the interface with design tool 1.

In determining the arbor setup, design tool 100 preferably refers to a tooling set file 260 stored in memory 20. Tooling set file 260 includes a list of tools (spacers and knives) available. Preferably, spacers are provided to build any theoretical slit width in increments of approximately 0.001 in. An example of such list of spacers in provided in Table 3.

TABLE 3

| Spacer Size (in.) |
| --- |
| 3.000 |
| 2.000 |
| 1.000 |
| 0.500 |
| 0.300 |
| 0.200 |
| 0.100 |
| 0.164 |
| 0.150 |
| 0.132 |
| 0.125 |
| 0.116 |
| 0.108 |
| 0.104 |
| 0.102 |
| 0.101 |
| 0.1005 |

In one example, design tool 1 may provide an estimate of slit width variation of −0.004 in the case of a mult having a desired slit width of 5.323 in. Therefore, design tool 100 will determine that the slit width to be built is 5.327 in. Preferably, design tool 100, via control module 5, first builds the second and third decimal places with spacers and/or knives referred to as gauge spacers and/or knives (that is, narrow spacers and/or knives having widths with non-zero second and/or third decimal places as listed in the last ten rows of Table 3). Thus design tool 100 first builds a combination of spacers and/or knives in which the second and third decimal places comprise 27.

Preferably, design tool 100 builds the required spacing with as few parts as possible. Using the fewest spacers and/or knives possible, in the present example, design tool 100 selects gauge spacers and/or knives of the following sizes: 0.125 in. and 0.102 in., resulting in a combined width of 0.227 in. Control module 5 then subtracts this width from the slit width to be built, leaving 5.100 in. remaining. The remaining width may be built upon combining spacers and/or knives of the following sizes: 3.000 in., 2.000 in. and 0.100 in. This process is repeated for each slit width to be built in a slitting run until a complete arbor setup is determined.

The values of the system variables entered into or calculated by design tool 100 may be imported into list 25 of design tool 1 to be used as at least part of a data set of list 25. Therefore, design tool 1 is preferably adapted to access stored setup files 210 of design tool 100 (that is, a file comprising the values of system variables input for use by design tool 100 and corresponding to particular slitting runs) upon provision of the filename of setup files 210.

If a system variable such as the horizontal clearance is calculated by design tool 100 or design tool 1, the calculated system variable is not an independent variable, and, thus is preferably not considered in a query of system variables using design tool 1. Preferably, therefore, system variables that are calculated using a design tool (via an equation/ model using other system variables) are flagged as such upon storage of the corresponding set of system variables.

As will be appreciated from the above description, the accuracy of the predictive indication of the slit width variation determined by design tool 1 increases as additional data sets are stored in list 25. Preferably, such additional data sets correspond to actual slitting runs in which design tool 1 was used in determining the arbor setup.

However, even after storage of numerous data sets, there may be certain ranges of a particular system variable over which no data is available. This problem may be alleviated by providing control module 5 with a means for supplementing list 25. Data supplementation means 60 may comprise, for example, a means for performing an interpolation/ data fit between/among adjacent sets of system variables. For this purpose, adjacent sets of system variable are defined as sets of system variables that have the equivalent values for all but one of the system variables therein.

Figure 12A:
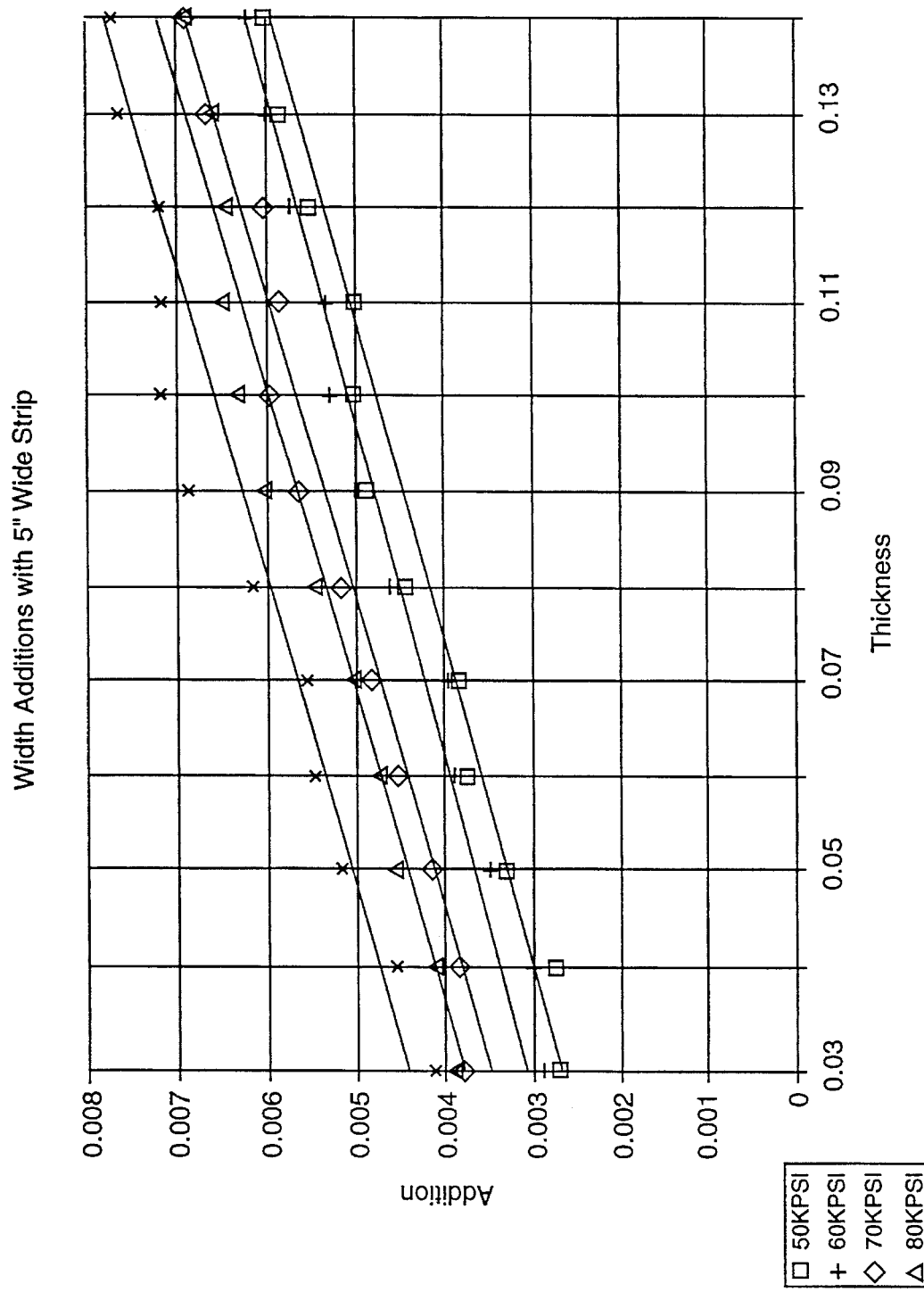
FIGS. 12A and 12B illustrate models of data from actual slitting runs produced via a linear regression.
Figure 12B:
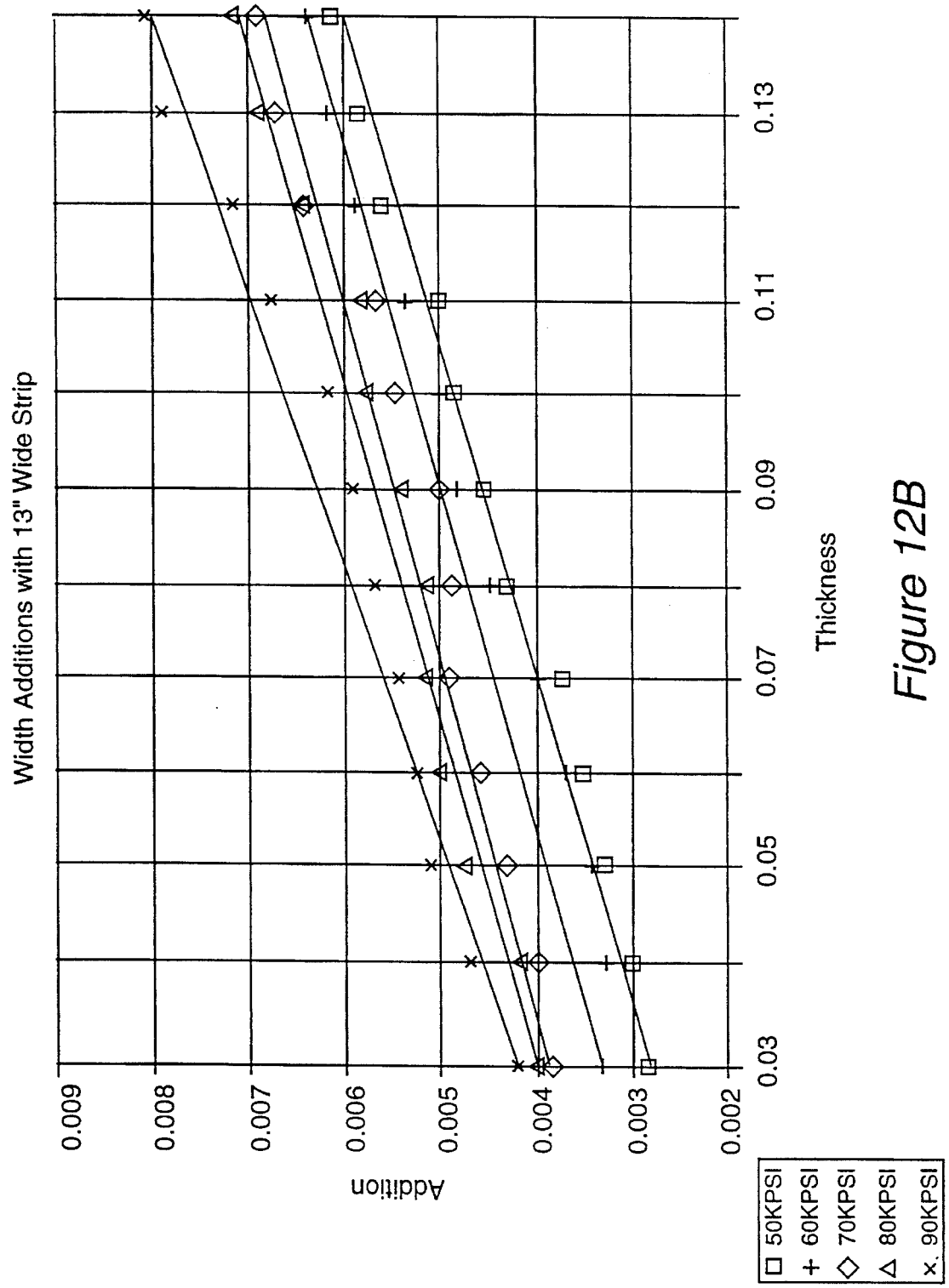

For example, Table 4 sets forth adjacent sets of system variables in which only the theoretical mult width differs between the two adjacent sets. Table 5 then illustrates a supplemental set of system variables with an intermediate theoretical mult width and a corresponding intermediate slit width variation calculated via interpolation. Linear interpolation was used in the example of Tables 4 and 5, but many methods of data fitting as known in the art can be used to create supplemental sets of system variables and corresponding calculated slit width variations. For example, more than two adjacent data sets may be used in a nonlinear, curve-fitting model.

lines drawn upon FIG. 12A represent linear regressions of the data at each material tensile strength. FIG. 12B illustrates a similar model wherein the theoretical slit width was maintained at 13.0 inches.

In the slitting runs plotted/modeled in FIGS. 12A and 12B, the horizontal clearance was determined from the material thickness and the tensile strength as discussed above. There are, therefore, three independent variables represented in FIGS. 12A and 12B, material thickness, slit width and tensile strength.

Models 230 such as set forth in FIGS. 12A and 12B are preferably developed using data fitting methods such as regression models (for example, a linear regression or a least squares method) upon collection and storage of sufficient data in list 25 to provide a statistically satisfactory correlation factor/"goodness of fit" between such a model and the actual data as known in the statistical art. Models 230 are thereby produced to which reference can be made to estimate slit width variations to be experienced in future slitting runs.

Preferably, one or more n-dimensional supplemental models 230 of the data sets stored in list 25 are created wherein n is the number of independent system variables represented in a model 230. Preferably, n is equal to the number of independent system variables enterable in each data set. Preferably, data sets in which a value of one or more of the n system variables are missing (that is, incomplete data sets) are not considered in creating n-dimensional model 230.

A three-dimensional model 230 (for example, a three-dimensional surface) can easily be developed from data such as represented in FIGS. 12A and 12B using a number of readily available statistical tools/algorithms which may be

TABLE 4

| Date (1994) | Material Thickness (in.) | Tensile Strength (kpsi) | Horiz. Clearance (in.) | Theoretical Width (in.) | Width Actual (in.) | Diff. (in.) |
| --- | --- | --- | --- | --- | --- | --- |
| 7/27 | 0.0320 | 50 | 0.0030 | 1.0000 | 0.9990 | 0.0010 |
| 7/27 | 0.0320 | 50 | 0.0030 | 3.0000 | 2.9980 | 0.0020 |

TABLE 5

| Date (1994) | Material Thickness (in.) | Tensile Strength (kpsi) | Horiz. Clearance (in.) | Theoretical Width (in.) | Width Actual (in.) | Diff. (in.) |
| --- | --- | --- | --- | --- | --- | --- |
| (supp) | 0.0320 | 50 | 0.0030 | 2.0000 | 0.9985 | 0.0015 |

Preferably, supplemented data tables 220, comprising supplemental data sets as described above are stored within memory 20 and can be accessed for queries by design tool 1.

Most preferably, supplemental models 230 are created based upon the data sets stored in list 25. Two examples of supplemental models 230 are provided in FIGS. 12A and 12B.

In FIG. 12A, the adjustment (addition) to theoretical slit width required to account for slit width variation experienced (shrinkage in this case) is plotted as a function of material thickness for a number of material tensile strengths. In FIG. 12A, the theoretical slit width (slit width actually built) was maintained constant at a value of 5.0 inches. The incorporated into design tool 1. One such statistical tool is available from Jandel Scientific Software of California. Upon creation of n-dimensional model 230, a predictive indication/estimate of slit width variation for a particular set of system variables can very quickly be provided by design tool 1 by reference to n-dimensional model 230.

It is also possible to create n-dimensional model 230 using a method such as solving over-determined linear equations using a least squares fit. An example of a tool/ algorithm for achieving such a fit is MAPLE Version 5, available from Waterloo Maple Software of Waterloo, Ontario, Canada.

Query ranges need not be specified when referring to model 230. The slit width variation is estimated directly from the model using the values of the system variables to be used in a future slitting run being analyzed. These values of system variables to be used in the future slitting run are entered via input means 15. Upon providing an appropriate command (for example, "MODEL") to control module 5, control module 5 determines a modeled estimate of slit width variation by referring to model 230. Such a command may be provided, for example, by the operator or by independently operative design tool 100.

Design tool 1 thus preferably operates in two or more stages. In the first stage, relatively little data has been stored in list 25 and a predictive indication of slit width variation is provided using specified query ranges as described above. In a second stage, the data stored in list 25 is supplemented by creating supplemental data tables. Finally, upon development/storage of sufficient data within list 25 to provide a model 230 having a sufficient statistical correlation to actual data, as such sufficiency is determined by the user of design tool 1, n-dimensional model(s) 230 can be created. For example, the user may wish to achieve a correlation factor of at least 0.9 before using model 230 to estimate slit width variation.

The operator of design tool 1 (and/or design tool 100) is preferably informed by design tool 1 of whether design tool 1 is providing an estimation of slit width adjustment required using query ranges applied to actual data, using query ranges applied to actual data as supplemented by supplemental data tables 220, and/or using direct queries of model 230. More preferably, the operator is provided with a choice of using one or more such techniques.

In general, the accuracy (that is, the correlation to experimental data) of any mathematical/statistical model of experimental data depends upon the quality of the data used to develop that model. Design tool 1 provides a means of producing well correlated n-dimensional models from data sets of system variables by first providing estimations of slit width variation using a statistical analysis of query ranges applied to relatively little data. The resultant estimated slit width variations are used to design arbor setups for future slitting runs. The values of the system variables and the slit width experienced from these slitting runs are, in turn, preferably stored as additional data sets within list 25, constantly improving the predictive accuracy of design tool 1.

Figure 13:
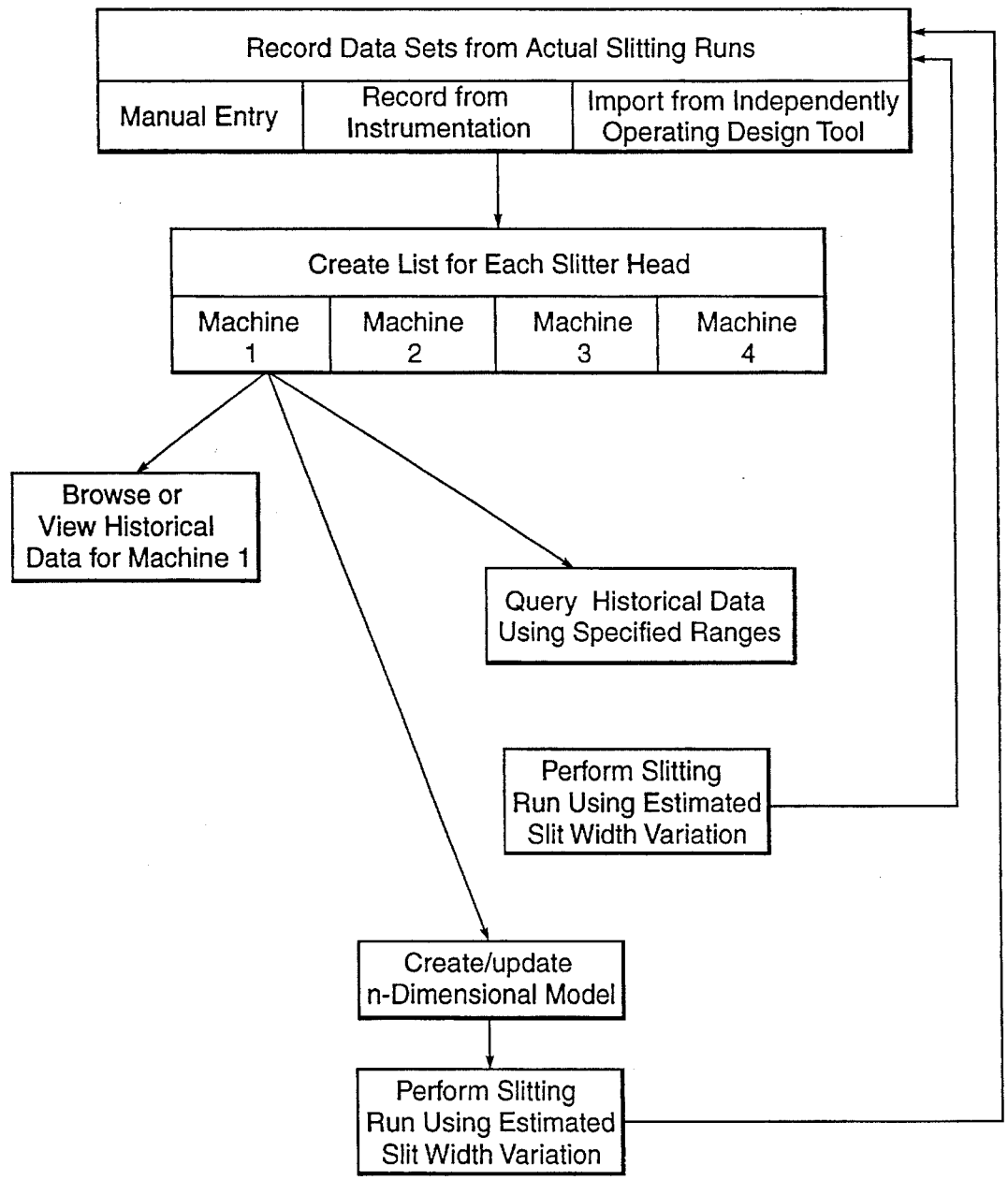
FIG. 13 illustrates a flow chart of the operation and development of an embodiment of the present design tool.

Upon storage of sufficient data in list 25, one or more n-dimensional models 230 are created and stored in memory 20. Slit width variation in future slitting runs may now be estimated by reference to n-dimensional models 230. The values of the system variables and the slit width variation experienced in such slitting runs are, in turn, preferably stored as data sets within list 25. Preferably, n-dimensional model 230 is periodically updated using such newly acquired data, once again improving the predictive accuracy of design tool 1. A schematic representation of this process is illustrated in FIG. 13.

Although, the present invention has been described in detail in connection with the above examples, it is to be understood that such detail is solely for that purpose and that variations can be made by those skilled in the art without departing from the spirit of the invention except as it may be limited by the following claims.

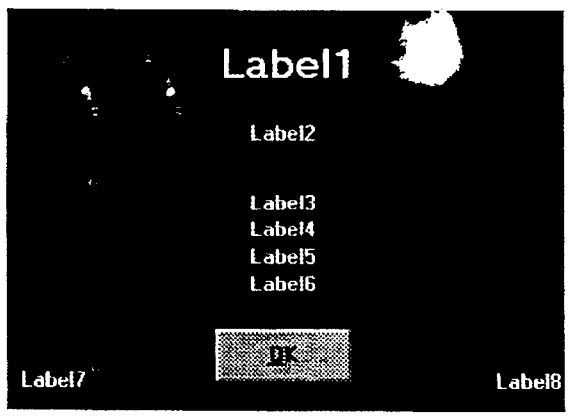
APPENDIX A

ABOUT.FRM - 1

```
VERSION 2.00
Begin Form About
    BackColor       =   &H00FF0000&
    Caption         =   "About..."
    ClientHeight    =   3480
    ClientLeft      =   2655
    ClientTop       =   2820
    ClientWidth     =   4830
    Height          =   3885
    Left            =   2595
    LinkTopic       =   "Form1"
    ScaleHeight     =   3480
    ScaleWidth      =   4830
    Top             =   2475
    Width           =   4950
    Begin SSCommand Command3D1
        Caption     =   "&OK"
        Font3D      =   0  'None
        Height      =   495
        Left        =   1800
        Picture     =   (none)
        TabIndex    =   8
        Top         =   2760
        Width       =   1215
    End
    Begin Label Label8
        Alignment   =   1  'Right Justify
        BackStyle   =   0  'Transparent
        Caption     =   "Label8"
        ForeColor   =   &H00FFFFFF&
        Height      =   255
        Left        =   3360
        TabIndex    =   7
        Top         =   3120
        Width       =   1455
    End
    Begin Label Label7
        BackStyle   =   0  'Transparent
        Caption     =   "Label7"
        ForeColor   =   &H00FFFFFF&
        Height      =   255
        Left        =   120
        TabIndex    =   6
        Top         =   3120
        Width       =   1575
    End
    Begin Label Label6
        Alignment   =   2  'Center
        BackStyle   =   0  'Transparent
        Caption     =   "Label6"
        ForeColor   =   &H00FFFFFF&
        Height      =   255
        Left        =   840
        TabIndex    =   5
        Top         =   2280
        Width       =   3135
    End
    Begin Label Label5
        Alignment   =   2  'Center
        BackStyle   =   0  'Transparent
        Caption     =   "Label5"
```

```
ABOUT.FRM - 2

ForeColor       =   &H00FFFFFF&   &H00FFFFFF&
      Height          =   255
      Left            =   840
      TabIndex        =   4
      Top             =   2040
      Width           =   3135
   End
   Begin Label Label4
      Alignment       =   2  'Center
      BackStyle       =   0  'Transparent
      Caption         =   "Label4"
      ForeColor       =   &H00FFFFFF&
      Height          =   255
      Left            =   1200
      TabIndex        =   3
      Top             =   1800
      Width           =   2415
   End
   Begin Label Label3
      Alignment       =   2  'Center
      BackStyle       =   0  'Transparent
      Caption         =   "Label3"
      ForeColor       =   &H00FFFFFF&
      Height          =   255
      Left            =   1200
      TabIndex        =   2
      Top             =   1560
      Width           =   2415
   End
   Begin Label Label2
      Alignment       =   2  'Center
      BackStyle       =   0  'Transparent
      Caption         =   "Label2"
      ForeColor       =   &H00FFFFFF&
      Height          =   495
      Left            =   1200
      TabIndex        =   1
      Top             =   960
      Width           =   2415
   End
   Begin Label Label1
      Alignment       =   2  'Center
      BackStyle       =   0  'Transparent
      Caption         =   "Label1"
      FontBold        =   -1 'True
      FontItalic      =   0  'False
      FontName        =   "MS Sans Serif"
      FontSize        =   18
      FontStrikethru  =   0  'False
      FontUnderline   =   0  'False
      ForeColor       =   &H00FFFFFF&
      Height          =   495
      Left            =   480
      TabIndex        =   0
      Top             =   240
      Width           =   3975
   End
End
```

ABOUT.FRM - 1

```
Option Explicit

Sub Command3D1_Click ()
    Unload About
End Sub

Sub Form_Load ()
    'Set the screen position to center
    About.Left = (Screen.Width - About.Width) / 2
    About.Top = (Screen.Height - About.Height) / 2

'Set form background color
    About.BackColor = BackgroundColor

'Set program name and developer information
    Label1.Caption = ProgramName$
    Label2.Caption = Copyright$
    Label3.Caption = DeveloperName$
    Label4.Caption = DeveloperAddress1$
    Label5.Caption = DeveloperAddress2$
    Label6.Caption = DeveloperPhone$
    Label7.Caption = "Version " + Version$
    Label8.Caption = "License # " + License$ End Sub
```

| Date | Material Thickness. | Tensile. | | Percent Clearance | Width Ordered. | Width Actual | Difference. |
|---|---|---|---|---|---|---|---|
| Table1 | | | | | | | |
| | | | | | | | |
| | | | | | | | |
| | | | | | | | |
| | | | | | | | |
| | | | | | | | |
| | | | | | | | |
| | | | | | | | |
| | | | | | | | |
| | | | | | | | |
| | | | | | | | |
| | | | | | | | |
| | | | | | | | |

BROWSE.FRM - 1

```
VERSION 2.00
Begin Form Browse
    BackColor       =   &H00C0C0C0&
    Caption         =   "Browse.Caption"
    ClientHeight    =   5265
    ClientLeft      =   135
    ClientTop       =   1080
    ClientWidth     =   9285
    Height          =   5670
    HelpContextID   =   4000
    Left            =   75
    LinkTopic       =   "Form1"
    ScaleHeight     =   5265
    ScaleWidth      =   9285
    Top             =   735
    Width           =   9405
    Begin TrueGrid Table1
        AllowArrows     =   -1  'True
        AllowTabs       =   -1  'True
        BackColor       =   &H00FFFFFF&
        DataSource      =   "Data1"
        Editable        =   -1  'True
        EditDropDown    =   -1  'True
        ExposeCellMode  =   0   'Expose upon selection
        FetchMode       =   0   'By cell
        HeadingHeight   =   3
        Height          =   4095
        HorzLines       =   1   'Single LayoutIndex     =   1
        Left            =   0
        LinesPerRow     =   1
        MarqueeUnique   =   -1  'True
        SplitPropsGlobal=   -1  'True
        SplitTabMode    =   0   'Don't tab across splits
        TabCapture      =   0   'False
        TabIndex        =   2
        Top             =   0
        UseBookmarks    =   -1  'True
        Width           =   9255
        WrapCellPointer =   0   'False
    End
    Begin Data Data1
        Connect         =   ""
        DatabaseName    =   "C:\SWIM\SWIM.MDB"
        Exclusive       =   0   'False
        Height          =   270
        Left            =   0
        Options         =   0
        ReadOnly        =   0   'False
        RecordSource    =   "RECORD"
        Top             =   4080
        Width           =   1575
    End
    Begin SSCommand Command3D4
        Caption         =   "&Delete"
        Font3D          =   0   'None
        ForeColor       =   &H00000000&
        Height          =   495
        Left            =   7560
        Picture         =   (none)
```

```
BROWSE.FRM - 2
     TabIndex        =    3
     Top             =    4560
     Width           =    1215
  End
  Begin SSCommand Command3D3
     Caption         =    "&Insert"
     Font3D          =    0  'None
     ForeColor       =    &H00000000&
     Height          =    495
     Left            =    6240
     Picture         =    (none)
     TabIndex        =    4
     Top             =    4560
     Width           =    1215
  End
  Begin SSCommand Command3D2
     Caption         =    "&Cancel"
     Font3D          =    0  'None
     ForeColor       =    &H00000000&
     Height          =    495
     Left            =    1440
     Picture         =    (none)
     TabIndex        =    1
     Top             =    4560
     Width           =    1215
  End
  Begin SSCommand Command3D1
     Caption         =    "&OK"
     Font3D          =    0  'None
     ForeColor       =    &H00000000&
     Height          =    495
     Left            =    120
     Picture         =    (none)
     TabIndex        =    0
     Top             =    4560
     Width           =    1215
  End
End
```

BROWSE.FRM - 1

Option Explicit

Sub Command3D1_Click ()

CommitTrans
    Unload Browse

End Sub

Sub Command3D2_Click ()

Rollback
    Unload Browse

End Sub

Sub Command3D3_Click ()
    'Add a new user to the database
    Data1.Recordset.AddNew
    Data1.Recordset.Update
    Data1.Recordset.MoveLast
    Table1.ColumnIndex = 5
    Table1.SetFocus
End Sub Sub Command3D4_Click ()

' Delete the current user/record from the database
    Data1.Recordset.Delete
    If Data1.Recordset.EOF = False Then
        Data1.Recordset.MoveNext
    End If
    Table1.SetFocus End Sub Sub Form_Load ()

'Center the form on the screen
    CenterForm Browse

'Set form caption
    Browse.Caption = "Browse Data " & CurrentTableDescription$ 'Add units to column titles
    Table1.ColumnName(2) = Table1.ColumnName(2) + Distance(Units%)
    Table1.ColumnName(3) = Table1.ColumnName(3) + Pressure(Units%)
    Table1.ColumnName(4) = Table1.ColumnName(4) + Distance(Units%)
    Table1.ColumnName(6) = Table1.ColumnName(6) + Distance(Units%)
    Table1.ColumnName(7) = Table1.ColumnName(7) + Distance(Units%)
    Table1.ColumnName(8) = Table1.ColumnName(8) + Distance(Units%)

'Set datasource
    Data1.DatabaseName = CurrentDatabaseName$
    Data1.RecordSource = CurrentTableName$
    Data1.Refresh 'Set focus to ActualWidth column of table
    Table1.ColumnIndex = 6
    'Table1.SetFocus

BROWSE.FRM - 2

```
    BeginTrans

End Sub

Sub Table1_RowChange ()
    'Data1.Caption = "Mult: " + Str(Data1.Recordset("ID"))
End Sub
```

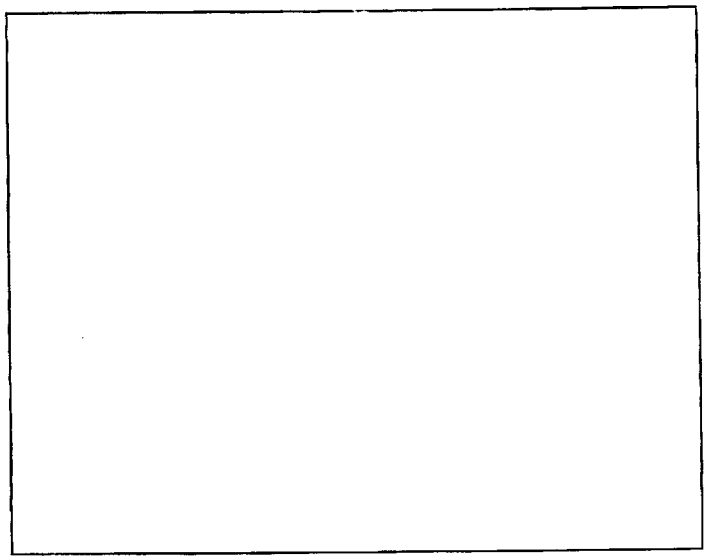

```
CHART.FRM - 1

VERSION 2.00
Begin Form Chart
    Caption         =   "Chart.Caption"
    ClientHeight    =   5820
    ClientLeft      =   1470
    ClientTop       =   1065
    ClientWidth     =   7365
    Height          =   6510
    Left            =   1410
    LinkTopic       =   "Form1"
    ScaleHeight     =   5820
    ScaleWidth      =   7365
    Top             =   435
    Width           =   7485
    Begin GRAPH Graph1

AsciiData       =   "100~80~60~40~10"

AsciiFSize      =   "500~150~100~100"

AsciiLabel      =   ".001~.002~.003~.004~.005"

BottomTitle     =   "Variance"

GraphCaption    =   "Frequency Distribution"

GraphTitle      =   "Frequency Distribution"
        GraphType       =   4   '3D Bar
        GridStyle       =   1   'Horizontal
        Height          =   5535

Left            =   120
        LeftTitle       =   "Observations"

RandomData      =   0   'Off

TabIndex        =   0
        Top             =   120
        Width           =   7095

End
    Begin Menu File_Menu
        Caption         =   "&File"
        Begin Menu Clipboard_Menu
            Caption         =   "&Copy to Clipboard"
        End
        Begin Menu Metafile_Menu
            Caption         =   "Copy to Windows &Metafile"
        End
        Begin Menu Print_Menu
            Caption         =   "&Print"
        End
```

```
CHART.FRM - 2
      Begin Menu Sep_Menu
         Caption         =    "-"
      End
      Begin Menu Exit_Menu
         Caption         =    "E&xit"
      End
   End
End
```

CHART.FRM - 1

```
Option Explicit
    Dim Lower#
    Dim Upper#
    Dim Range#
    Dim Mean#

Sub CalculateFrequency ()
    Dim i%
    Dim ThisVariance#

'Initilize Chart
    Graph1.NumPoints = Int((Abs(StatMin# - StatMax#)) / .001) + 1
    Graph1.BottomTitle = "Variance"
    Graph1.DrawMode = 2

'Set class intervals
    ReDim Class(Graph1.NumPoints)
    Class(0).Lower# = Roundx(StatMin#, .001, 3)
    Class(0).Upper# = StatMin# + .00099
    For i% = 1 To (Graph1.NumPoints - 1)
        Class(i%).Lower# = Class(i% - 1).Lower# + .001
        Class(i%).Upper# = Class(i% - 1).Upper# + .001
        Debug.Print Class(i%).Lower#, Class(i%).Upper#
    Next i%

'Show gauge
    Status.Show
    Status.Caption = "Calculating Frequencies"
    Status.Gauge1.Value = 0
    Query.Data1.Recordset.MoveFirst
    Query.Data1.Recordset.MoveLast
    Status.Gauge1.Max = Query.Data1.Recordset.RecordCount 'Calculate Frequencies
    Query.Data1.Recordset.MoveFirst
    Do While Query.Data1.Recordset.EOF = False
        Status.Gauge1.Value = Status.Gauge1.Value + 1
        ThisVariance# = Query.Data1.Recordset("Difference")
        ThisVariance# = Roundx(ThisVariance#, .001, 3)
        For i% = 0 To (Graph1.NumPoints - 1)
            If Formatx(ThisVariance#, 3) = Formatx(Class(i%).Lower#, 3) Then 'An
d ThisVariance# <= Class(i%).Upper# Then
                Class(i%).Frequency% = Class(i%).Frequency% + 1
                Exit For
            End If
        Next i%
        Query.Data1.Recordset.MoveNext
    Loop 'Calculate Relative Frequencies
    'Class(0).RelativeFrequency# =Class(0).Frequency
    'Class(0).Upper# = Lower# + .00099
    'For i% = 1 To (Graph1.NumPoints - 1)
    '    Class(i%).Lower# = Class(i% - 1).Lower# + .001
    '    Class(i%).Upper# = Class(i% - 1).Upper# + .001
    'Next i%

'Reset Gauge
    Status.Show
    Status.Caption = "Graphing Chart"
```

CHART.FRM - 2

```
    Status.Gauge1.Value = 0
    Status.Gauge1.Max = Graph1.NumPoints

'Chart frequencies
    For i% = 1 To Graph1.NumPoints
        Status.Gauge1.Value = Status.Gauge1.Value + 1
        Graph1.ThisPoint = i%
        Graph1.GraphData = Class(i% - 1).Frequency%
        'Graph1.DrawMode = 2
        Graph1.ThisPoint = i%
        Graph1.LabelText = Str(Class(i% - 1).Lower#)'Str((i% - 1) * .001)
        Graph1.DrawMode = 2
    Next i%

'Hide gauge
    Unload Status

'Class(i%).Lower
    'Class(i%).Upper

Graph1.DrawMode = 2

End Sub

Sub CalculateStats1 (Lower#, Upper#, Range#, Mean#)
    Dim Count%
    Dim Total#

Lower# = 9999
    Upper# = 0
    Total# = 0
    Count% = 0

Query.Data1.Recordset.MoveFirst
    Do While Query.Data1.Recordset.EOF = False
        Count% = Count% + 1
        Total# = Total# + Query.Data1.Recordset("WidthActual") - Query.Data1.Rec
ordset("WidthOrdered")
        If Query.Data1.Recordset("WidthActual") - Query.Data1.Recordset("WidthOr
dered") < Lower# Then
            Lower# = Query.Data1.Recordset("WidthActual") - Query.Data1.Recordse
t("WidthOrdered")
        End If
        If Query.Data1.Recordset("WidthActual") - Query.Data1.Recordset("WidthOr
dered") > Upper# Then
            Upper# = Query.Data1.Recordset("WidthActual") - Query.Data1.Recordse
t("WidthOrdered")
        End If
        Query.Data1.Recordset.MoveNext
    Loop Range# = Upper# - Lower#
    Mean# = Total# / Count%

End Sub

Sub OldCalcFreq ()
    Dim i%
    Dim ThisVariance#
```

CHART.FRM - 3

```
    'Initilize Chart
    Graph1.NumPoints = Int((Abs(StatMin# - StatMax#)) / .001) + 1
    Graph1.BottomTitle = "Variance"
    Graph1.DrawMode = 2

'Set class intervals
    ReDim Class(Graph1.NumPoints)
    Class(0).Lower# = Roundx(StatMin#, .001, 3)
    Class(0).Upper# = StatMin# + .00099
    For i% = 1 To (Graph1.NumPoints - 1)
        Class(i%).Lower# = Class(i% - 1).Lower# + .001
        Class(i%).Upper# = Class(i% - 1).Upper# + .001
        Debug.Print Class(i%).Lower#, Class(i%).Upper#
    Next i%

'Calculate Frequencies
    Query.Data1.Recordset.MoveFirst
    Do While Query.Data1.Recordset.EOF = False
        ThisVariance# = Query.Data1.Recordset("Difference")
        ThisVariance# = Roundx(ThisVariance#, .001, 3)
        For i% = 0 To (Graph1.NumPoints - 1)
            If ThisVariance# >= Class(i%).Lower# And ThisVariance# <= Class(i%).
Upper# Then
                Class(i%).Frequency% = Class(i%).Frequency% + 1
                Exit For
            End If
        Next i%
        Query.Data1.Recordset.MoveNext
    Loop 'Calculate Relative Frequencies
    'Class(0).RelativeFrequency# =Class(0).Frequency
    'Class(0).Upper# = Lower# + .00099
    'For i% = 1 To (Graph1.NumPoints - 1)
    '    Class(i%).Lower# = Class(i% - 1).Lower# + .001
    '    Class(i%).Upper# = Class(i% - 1).Upper# + .001
    'Next i%

'Chart frequencies
    For i% = 1 To Graph1.NumPoints
        Graph1.ThisPoint = i%
        Graph1.GraphData = Class(i% - 1).Frequency%
        'Graph1.DrawMode = 2
        Graph1.ThisPoint = i%
        Graph1.LabelText = Str(Class(i%).Lower#) 'Str((i% - 1) * .001)
        Graph1.DrawMode = 2
    Next i%

'Class(i%).Lower
    'Class(i%).Upper

Graph1.DrawMode = 2

End Sub

Sub Clipboard_Menu_Click ()
    Graph1.DrawMode = 4
    MsgBox "Graph copied to clipboard.", 64, ProgramName$ End Sub
```

CHART.FRM - 4

```
Sub Exit_Menu_Click ()

'Unload chart form
    Unload Chart

End Sub

Sub Form_Load ()
    Dim I%
    Dim ThisPoint#

'Center form on screen
    CenterForm Chart

'Set form caption
    Chart.Caption = ProgramName$

'Call CalculateStats1(Lower#, Upper#, Range#, Mean#)
    'Call CalculateStats2(Mean#, Variance#, StandardDeviation#)

Call CalculateFrequency
    Form_Resize

End Sub

Sub Form_Resize ()
    Graph1.Width = Chart.ScaleWidth
    Graph1.Height = Chart.ScaleHeight End Sub Sub Metafile_Menu_Click ()

Graph1.ImageFile = "SWIM.WMF"
    Graph1.DrawMode = 2
    Graph1.DrawMode = 6
    MsgBox "Graph saved as SWIM.WMF", 64, ProgramName$ End Sub Sub Print_Menu_Click ()
    Graph1.DrawMode = 5
End Sub
```

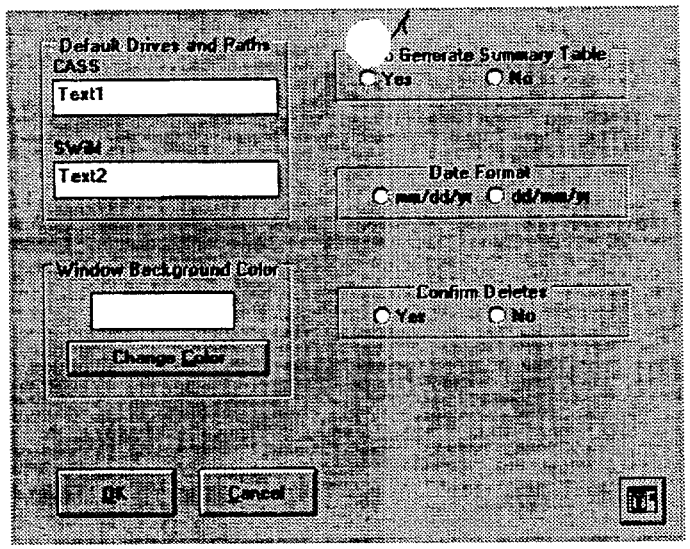

```
CONFIG.FRM - 1

VERSION 2.00
Begin Form Config
   BackColor       =   &H00C0C0C0&
   Caption         =   "SWiM Configuration"
   ClientHeight    =   5445
   ClientLeft      =   1650
   ClientTop       =   2370
   ClientWidth     =   6915
   ForeColor       =   &H00808080&
   Height          =   5850
   HelpContextID   =   2300
   Left            =   1590
   LinkTopic       =   "Form1"
   ScaleHeight     =   5445
   ScaleWidth      =   6915
   Top             =   2025
   Width           =   7035
   Begin SSFrame Frame3D1
      Alignment       =   2  'Center
      Caption         =   "Default Drives and Paths"
      Font3D          =   3  'Inset w/light shading
      ForeColor       =   &H00000000&
      Height          =   1935
      Left            =   360
      TabIndex        =   14
      Top             =   240
      Width           =   2535
      Begin TextBox Text2
         ForeColor       =   &H00FF0000&
         Height          =   375
         Left            =   120
         TabIndex        =   13
         Text            =   "Text2"
         Top             =   1320
         Width           =   2295
      End
      Begin TextBox Text1
         ForeColor       =   &H00FF0000&
         Height          =   375
         Left            =   120
         TabIndex        =   16
         Text            =   "Text1"
         Top             =   480
         Width           =   2295
      End
      Begin Label Label1
         BackStyle       =   0  'Transparent
         Caption         =   "SWiM"
         Height          =   255
         Left            =   120
         TabIndex        =   17
         Top             =   1080
         Width           =   1215
      End
      Begin Label Label3
         BackStyle       =   0  'Transparent
         Caption         =   "CASS"
         ForeColor       =   &H00000000&
         Height          =   255
         Left            =   120
         TabIndex        =   15
```

CONFIG.FRM - 2

```
         Top            =    240
         Width          =    1095
      End
   End
   Begin CommonDialog CMDialog1
      Left              =    6240
      Top               =    4800
   End
   Begin SSFrame Frame3D2
      Alignment         =    2    'Center
      Caption           =    "Window Background Color"
      Font3D            =    3    'Inset w/light shading
      ForeColor         =    &H00000000&
      Height            =    1455
      Left              =    360
      TabIndex          =    11
      Top               =    2520
      Width             =    2535
      Begin SSCommand Command3D1
         Caption        =    "Change &Color"
         Font3D         =    0    'None
         ForeColor      =    &H00000000&
         Height         =    375
         Left           =    240
         Picture        =    (none)
         TabIndex       =    12
         Top            =    840
         Width          =    2055
      End
      Begin Shape Shape1
         BackStyle      =    1    'Opaque
         Height         =    375
         Left           =    480
         Top            =    360
         Width          =    1455
      End
   End
   Begin SSFrame Frame3D4
      Alignment         =    2    'Center
      Caption           =    "Date Format"
      Font3D            =    3    'Inset w/light shading
      ForeColor         =    &H00000000&
      Height            =    615
      Left              =    3360
      TabIndex          =    8
      Top               =    1560
      Width             =    3015
      Begin SSOption Option3D4
         Caption        =    "dd/mm/yr"
         Font3D         =    0    'None
         ForeColor      =    &H00000000&
         Height         =    255
         Index          =    1
         Left           =    1560
         TabIndex       =    10
         Top            =    240
         Width          =    1215
      End
      Begin SSOption Option3D4
         Caption        =    "mm/dd/yr"
         Font3D         =    0    'None
```

```
CONFIG.FRM - 3
         ForeColor       =    &H00000000&
         Height          =    255
         Index           =    0
         Left            =    360
         TabIndex        =    9
         Top             =    240
         Width           =    1095
      End
   End
   Begin SSFrame Frame3D5
      Alignment       =    2  'Center
      Caption         =    "Confirm Deletes"
      Font3D          =    3  'Inset w/light shading
      ForeColor       =    &H00000000&
      Height          =    615
      Left            =    3360
      TabIndex        =    5
      Top             =    2760
      Width           =    3015
      Begin SSOption Option3D5
         Caption         =    "Yes"
         Font3D          =    0  'None
         ForeColor       =    &H00000000&
         Height          =    255
         Index           =    0
         Left            =    360
         TabIndex        =    7
         Top             =    240
         Width           =    735
      End
      Begin SSOption Option3D5
         Caption         =    "No"
         Font3D          =    0  'None
         ForeColor       =    &H00000000&
         Height          =    255
         Index           =    1
         Left            =    1560
         TabIndex        =    6
         Top             =    240
         Width           =    735
      End
   End
   Begin CommandButton Cancel_Command
      Caption         =    "&Cancel"
      Height          =    495
      Left            =    1920
      TabIndex        =    3
      Top             =    4680
      Width           =    1215
   End
   Begin CommandButton OK_Command
      Caption         =    "&OK"
      Height          =    495
      Left            =    480
      TabIndex        =    2
      Top             =    4680
      Width           =    1215
   End
   Begin SSFrame Frame3D3
      Alignment       =    2  'Center
      Caption         =    "Auto Generate Summary Table"
```

```
CONFIG.FRM - 4
    Font3D          =    3  'Inset w/light shading
    ForeColor       =    &H00000000&
    Height          =    615
    Left            =    3360
    TabIndex        =    0
    Top             =    360
    Width           =    3015
    Begin SSOption Option3D3
        Caption     =    "No"
        Font3D      =    0   'None
        ForeColor   =    &H00000000&
        Height      =    255
        Index       =    1
        Left        =    1560
        TabIndex    =    4
        Top         =    240
        Width       =    975
    End
    Begin SSOption Option3D3
        Caption     =    "Yes"
        Font3D      =    0   'None
        ForeColor   =    &H00000000&
        Height      =    255
        Index       =    0
        Left        =    240
        TabIndex    =    1
        Top         =    240
        Width       =    975
    End
  End
 End
End
```

CONFIG.FRM - 1

```vb
Option Explicit
Dim i%

Sub SaveConfig ()
' Save SWiM configuration to file
    Dim FileNum%
    Dim i%

ChDrive StartupDrive$
    FileNum% = FreeFile
    Open StartupPath$ + "\SWIM.INI" For Output As FileNum%
    Print #FileNum%, "[Path]"
    Print #FileNum%, "Path=" + CassDefaultPath$
    Print #FileNum%, "Path=" + SwimDefaultPath$
    Print #FileNum%, BackgroundColor Print #FileNum%, AutoGenerate%
    Print #FileNum%, DateFormat%
    Print #FileNum%, ConfirmDeletes%

Close #FileNum%

End Sub

Sub Cancel_Command_Click ()
' Unload CASS Configuration window without saving changes
    Unload Config
End Sub Sub Command3D1_Click ()
'Display the color chart and allow user to select
'desired backgroun color for forms
    On Error Resume Next
    CMDialog1.Flags = CC_RGBINIT Or CC_PREVENTFULLOPEN
    CMDialog1.Color = Shape1.BackColor
    CMDialog1.Action = 3
    Shape1.BackColor = CMDialog1.Color End Sub Sub Form_Load ()

'Set default drives and paths
    Text1.Text = CassDefaultPath$
    Text2.Text = SwimDefaultPath$ 'Set form background color
    Shape1.BackColor = BackgroundColor If AutoGenerate% = True Then
        Option3D3(0).Value = True
    Else
        Option3D3(1).Value = True
    End If If DateFormat% = 0 Then
        Option3D3(0).Value = True
    Else
        Option3D3(1).Value = True
```

CONFIG.FRM - 2

```
    End If

If ConfirmDeletes% = True Then
        Option3D5(0).Value = True
    Else
        Option3D5(1).Value = True
    End If 'Center the form on the screen
    CenterForm Config End Sub Sub OK_Command_Click ()

'Cass Default drive/path
    CassDefaultPath$ = Text1.Text
    CassDefaultDrive$ = Left$(CassDefaultPath$, 2)
    If Right$(CassDefaultPath$, 1) = "\" Then
        CassDefaultPath$ = Left$(CassDefaultPath$, Len(CassDefaultPath$) - 1)
    End If 'Swim Default drive/path
    SwimDefaultPath$ = Text2.Text
    SwimDefaultDrive$ = Left$(SwimDefaultPath$, 2)
    If Right$(SwimDefaultPath$, 1) = "\" Then
        SwimDefaultPath$ = Left$(SwimDefaultPath$, Len(SwimDefaultPath$) - 1)
    End If 'Default Report Length
    If Option3D3(0).Value = True Then
        AutoGenerate% = True
    ElseIf Option3D3(1).Value = True Then
        AutoGenerate% = False
    End If 'Default Report Length
    If Option3D4(0).Value = True Then
        DateFormat% = 0
    ElseIf Option3D4(1).Value = True Then
        DateFormat% = 1
    End If 'Default OverArmSeperator
    If Option3D5(0).Value = True Then
        ConfirmDeletes% = True
    Else
        ConfirmDeletes% = False
    End If 'Default background color
    BackgroundColor = Shape1.BackColor 'Save configuration changes to SWIM.INI file
    Call SaveConfig Unload Config 'Set form background color of CASS form
```

CONFIG.FRM - 3

```
    Swim.BackColor = BackgroundColor   BackgroundColor

End Sub

Sub Text1_GotFocus ()
'Highlight all text
    Text1.SelStart = 0
    Text1.SelLength = Len(Text1.Text)

End Sub

Sub Text1_LostFocus ()
    If Mid$(Text1.Text, 2, 1) <> ":" Then
        Beep
        Text1.SetFocus
        MsgBox "Path must include drive", MB_ICONSTOP, ProgramName$
        Exit Sub
    End If
End Sub Sub Text2_GotFocus ()
'Highlight all text
    Text2.SelStart = 0
    Text2.SelLength = Len(Text2.Text)

End Sub

Sub Text2_LostFocus ()
    If Mid$(Text2.Text, 2, 1) <> ":" Then
        Beep
        Text2.SetFocus
        MsgBox "Path must include drive", MB_ICONSTOP, ProgramName$
        Exit Sub
    End If End Sub
```

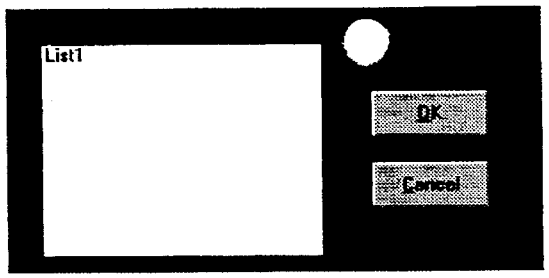

```
FROMFILE.FRM - 1

VERSION 2.00
Begin Form FromFile
   BackColor       =   &H00FF0000&
   Caption         =   "FromFile.Caption"
   ClientHeight    =   2685
   ClientLeft      =   2265
   ClientTop       =   3240
   ClientWidth     =   5475
   Height          =   3090
   HelpContextID   =   4000
   Left            =   2205
   LinkTopic       =   "Form1"
   ScaleHeight     =   2685
   ScaleWidth      =   5475
   Top             =   2895
   Width           =   5595
   Begin SSCommand Command3D3
      Caption         =   "&Delete"
      Font3D          =   0  'None
      ForeColor       =   &H00000000&
      Height          =   495
      Left            =   3720
      Picture         =   (none)
      TabIndex        =   3
      Top             =   840
      Width           =   1215
   End
   Begin SSCommand Command3D2
      Caption         =   "&Cancel"
      Font3D          =   0  'None
      ForeColor       =   &H00000000&
      Height          =   495
      Left            =   3720
      Picture         =   (none)
      TabIndex        =   2
      Top             =   1560
      Width           =   1215
   End
   Begin SSCommand Command3D1
      Caption         =   "&OK"
      Font3D          =   0  'None
      ForeColor       =   &H00000000&
      Height          =   495
      Left            =   3720
      Picture         =   (none)
      TabIndex        =   1
      Top             =   840
      Width           =   1215
   End
   Begin ListBox List1
      Height          =   2175
      Left            =   360
      TabIndex        =   0
      Top             =   360
      Width           =   2880
   End
End
```

FROMFILE.FRM - 1

```vb
Option Explicit

Dim DbVar As Database
Dim TableVar As Table

Sub Command3D1_Click ()

'Verify a tablename was selected
    If List1.ListIndex = -1 Then
        Beep
        List1.SetFocus
        MsgBox "No tablename was selected !", MB_ICONSTOP, ProgramName$
        Exit Sub
    End If 'Set CurrentTableName$ & Description$ based on user's selection from list
    CurrentTableName$ = List1.List(List1.ListIndex)
    CurrentTableDescription$ = List1.List(List1.ListIndex)

'Indicate that user exited with OK
    ExitMethod% = C_OK

'Unload form
    Unload FromFile

End Sub

Sub Command3D2_Click ()

'Indicate that user exited with CANCEL
    ExitMethod% = C_CANCEL

'Unload form
    Unload FromFile

End Sub

Sub Command3D3_Click ()

'Verify a tablename was selected
    If List1.ListIndex = -1 Then
        Beep
        List1.SetFocus
        MsgBox "No tablename was selected !", MB_ICONSTOP, ProgramName$
        Exit Sub
    End If 'Delete the table based on user's selection from list
    FromFile.MousePointer = Hourglass
    DbVar.TableDefs.Delete List1.List(List1.ListIndex)

'Reset Listbox
    List1.RemoveItem (List1.ListIndex)
    'For i% = 0 To (DbVar.TableDefs.Count - 1)
    '    If (DbVar.TableDefs(i%).Attributes And DB_SYSTEMOBJECT) = 0 Then
    '        List1.AddItem DbVar.TableDefs(i%).Name
    '    End If
    'Next i%

FromFile.MousePointer = Arrow
```

FROMFILE.FRM - 2

```
End Sub

Sub Form_Load ()
    Dim i%   'loop counter

'Set form background color
    FromFile.BackColor = BackgroundColor

'Center the form on the screen
    CenterForm FromFile

'Set form caption
    FromFile.Caption = "Select File"

'Initialize database
    Set DbVar = OpenDatabase(CurrentDatabaseName$)

'Initialize Listbox
    For i% = 0 To (DbVar.TableDefs.Count - 1)
        If (DbVar.TableDefs(i%).Attributes And DB_SYSTEMOBJECT) = 0 Then
            List1.AddItem DbVar.TableDefs(i%).Name
        End If
    Next i%

End Sub
```

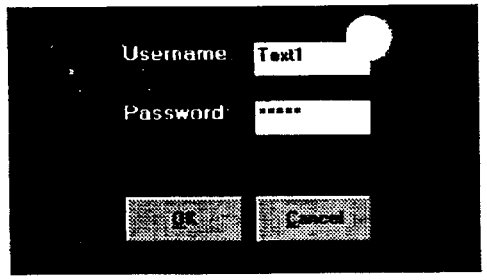

```
LOGON.FRM - 1

VERSION 2.00
Begin Form Logon
    BackColor       =   &H00FF0000&
    Caption         =   "SWiM Logon"
    ClientHeight    =   2715
    ClientLeft      =   2790
    ClientTop       =   2925
    ClientWidth     =   4830
    Height          =   3120
    Left            =   2730
    LinkTopic       =   "Form1"
    ScaleHeight     =   2715
    ScaleWidth      =   4830
    Top             =   2580
    Width           =   4950
    Begin SSCommand Command3D2
        Caption         =   "&Cancel"
        Font3D          =   0  'None
        Height          =   495
        Left            =   2520
        Picture         =   (none)
        TabIndex        =   5
        Top             =   1920
        Width           =   1215
    End
    Begin SSCommand Command3D1
        Caption         =   "&OK"
        Enabled         =   0   'False
        Font3D          =   0   'None
        Height          =   495
        Left            =   1200
        Picture         =   (none)
        TabIndex        =   4
        Top             =   1920
        Width           =   1215
    End
    Begin TextBox Text2
        ForeColor       =   &H00000000&
        Height          =   375
        Left            =   2520
        PasswordChar    =   "*"
        TabIndex        =   3
        Text            =   "Text2"
        Top             =   960
        Width           =   1215
    End
    Begin TextBox Text1
        ForeColor       =   &H00000000&
        Height          =   375
        Left            =   2520
        TabIndex        =   2
        Text            =   "Text1"
        Top             =   360
        Width           =   1215
    End
    Begin Label Label2
        BackStyle       =   0   'Transparent
        Caption         =   "Password:"
        FontBold        =   -1  'True
        FontItalic      =   0   'False
        FontName        =   "MS Sans Serif"
```

LOGON.FRM - 2

```
        FontSize        =   9.75  9.75
        FontStrikethru  =   0    'False
        FontUnderline   =   0    'False
        ForeColor       =   &H00FFFFFF&
        Height          =   375
        Left            =   1200
        TabIndex        =   1
        Top             =   960
        Width           =   1215
    End
    Begin Label Label1
        BackStyle       =   0    'Transparent
        Caption         =   "Username:"
        FontBold        =   -1   'True
        FontItalic      =   0    'False
        FontName        =   "MS Sans Serif"
        FontSize        =   9.75
        FontStrikethru  =   0    'False
        FontUnderline   =   0    'False
        ForeColor       =   &H00FFFFFF&
        Height          =   375
        Left            =   1200
        TabIndex        =   0
        Top             =   360
        Width           =   1215
    End
End
```

LOGON.FRM - 1

'Option Explicit

Dim DbVar As Database
Dim TableVar As Table

Sub FindInitialPath ()

hModule% = GetModuleHandle("SWIM.EXE")
    Buffer$ = Space$(255)
    Length% = GetModuleFileName(hModule%, Buffer$, Len(Buffer$))
    Buffer$ = Left$(Buffer$, Length%)
    Temp1$ = Buffer$ If Len(Command$) > 0 Then
        StartupPath$ = Command$
    Else
        For i = 1 To Len(Temp1$)
            If Mid$(Temp1$, i, 1) = "\" Then
                LastSlash = i
            End If
        Next
        StartupPath$ = Left$(Temp1$, LastSlash - 1)
    End If
    StartupDrive$ = Left$(StartupPath$, 2)

ChDrive StartupDrive$
    ChDir StartupPath$
    test = Len(Dir$("SWIM.INI", 0))    'Test the path.
    If test > 0 Then
        Exit Sub                        'Current path is correct.
    Else
        Msg$ = "Initialization files could not be found.  "
        Msg$ = Msg$ + "Initialization files must exist in either the " + Program
Name$ + " startup "
        Msg$ = Msg$ + "directory, or in a directory specified "
        Msg$ = Msg$ + "by a command line argument.  "
        Msg$ = Msg$ + "Note that the current Windows directory is " + CurDir$
        Msg$ = Msg$ + " and the startup directory was " + Temp1$
        MsgBox Msg$, MB_ICONSTOP, ProgramName$ + " Startup Error"
        End
    End If End Sub Function OK_Password ()
'Check the entered password against the USER database 'Return TRUE if backdoor password was entered
    If UCase(PasswordLogon$) = "ASKO" Then
        OK_Password = True
        Exit Function
    End If If UCase(PasswordLogon$) <> UCase(TableVar!Password) Then
        OK_Password = False
    Else
        OK_Password = True
    End If End Function
```

LOGON.FRM - 2

```
Function OK_Username ()
'Check the entered username against the USER database 'Return TRUE if backdoor password
    If UCase(UsernameLogon$) = "SWIM" Then
        OK_Username = True
        Exit Function
    End If 'Seek the user's name
    TableVar.MoveFirst
    TableVar.Index = "PrimaryKey"
    TableVar.Seek "=", UCase(UsernameLogon$)

If TableVar.NoMatch = True Then
        OK_Username = False
    Else
        OK_Username = True
    End If End Function Sub ReadConfig (FileName$)

FileNum% = FreeFile
    Open FileName$ For Input As FileNum%
    Do While Not EOF(FileNum%) And A$ <> "[PATH]"
        Line Input #FileNum%, A$
        A$ = UCase$(Left$(A$, Len(A$)))
    Loop 'Read CASS default drive and path
    Line Input #FileNum%, A$
    CassDefaultPath$ = Right$(A$, Len(A$) - InStr(A$, "="))

'Read SWIM default drive and path
    Line Input #FileNum%, A$
    SwimDefaultPath$ = Right$(A$, Len(A$) - InStr(A$, "="))

'Read default form background color
    Line Input #FileNum%, A$
    BackgroundColor = Val(A$)

Line Input #FileNum%, A$
    If Val(A$) = True Then
        AutoGenerate% = True
    Else
        AutoGenerate% = False
    End If Line Input #FileNum%, A$
    If Val(A$) = 0 Then
        DateFormat% = 0
    Else
        DateFormat% = 1
    End If Line Input #FileNum%, A$
    If Val(A$) = True Then
        ConfirmDeletes% = True
```

LOGON.FRM - 3

```
    Else
        ConfirmDeletes% = False
    End If

Close FileNum%

'Determine CASS default drive
    If Mid$(CassDefaultPath$, 2, 1) = ":" Then
        CassDefaultDrive$ = Left$(CassDefaultPath$, 2)
    Else
        CassDefaultPath$ = StartupDrive$
    End If 'Determine SWIM default drive
    If Mid$(SwimDefaultPath$, 2, 1) = ":" Then
        SwimDefaultDrive$ = Left$(SwimDefaultPath$, 2)
    Else
        SwimDefaultPath$ = StartupDrive$
    End If End Sub Sub SetOptions ()
'Set available program options based on user's security access If TableVar("SuperUser") = True Then
        Swim.Users_Menu.Enabled = True
    Else
        Swim.Users_Menu.Enabled = False
    End If If TableVar("Record") = True Then
        Swim.Record_Menu.Enabled = True
    Else
        Swim.Record_Menu.Enabled = False
    End If If TableVar("Browse") = True Then
        Swim.Browse_Menu.Enabled = True
    Else
        Swim.Browse_Menu.Enabled = False
    End If If TableVar("Query") = True Then
        Swim.Query_Menu.Enabled = True
    Else
        Swim.Query_Menu.Enabled = True
    End If If TableVar("Delete") = True Then
        Swim.Delete_Menu.Enabled = True
    Else
        Swim.Delete_Menu.Enabled = False
    End If If TableVar("Purge") = True Then
        Swim.Purge_Menu.Enabled = True
    Else
        Swim.Purge_Menu.Enabled = False
    End If
```

LOGON.FRM - 4

```
    If TableVar("Generate") = True Then            'Generate'
        Swim.Generate_Menu.Enabled = True
    Else
        Swim.Generate_Menu.Enabled = False
    End If If TableVar("Configuration") = True Then
        Swim.Configuration_Menu.Enabled = True
    Else
        Swim.Configuration_Menu.Enabled = False
    End If End Sub Sub Command3D1_Click ()

'Check if UsernameLogon$ is valid
    If OK_Username() = False Then
        MsgBox "Invalid username entered.", MB_ICONSTOP, ProgramName$
        TableVar.Close
        DbVar.Close
        End
    End If 'Check if PasswordLogon$ is valid
    If OK_Password() = False Then
        MsgBox "Invalid password entered.", MB_ICONSTOP, ProgramName$
        TableVar.Close
        DbVar.Close
        End
    End If 'Set available program options based on user's security
    If UCase(UsernameLogon$) <> "SWIM" And UCase(PasswordLogon$) <> "ASKO" Then
        SetOptions
    End If 'Close the database
    TableVar.Close
    DbVar.Close 'Unload the Logon form
    Unload Logon 'Display the CASS main Window
    Swim.Show End Sub Sub Command3D2_Click ()

'Quit the program
    End

End Sub

Sub Form_Load ()

'Find initial path
    FindInitialPath
```

LOGON.FRM - 5

```
    'Read the Configuration file
    ReadConfig StartupPath$ + "\SWIM.INI"

If PasswordOption% = True Then
        'Open password database
        Set DbVar = OpenDatabase(StartupPath$ + "\SWIM.MDB")
        Set TableVar = DbVar.OpenTable("USERS")

'Set form background color
        Logon.BackColor = BackgroundColor

'Center the form on the screen
        CenterForm Logon

'Initialize text boxes
        Text1.Text = ""
        Text2.Text = ""
    Else
        'Unload the Logon form
        Unload Logon 'Display the SWIM main Window
        Swim.Show
    End If End Sub Sub Text1_Change ()

'Enable OK button if something is in Username and Password
    If Len(Trim$(Text1.Text)) > 0 And Len(Trim$(Text2.Text)) > 0 Then
        Command3D1.Enabled = True
    Else
        Command3D1.Enabled = False
    End If End Sub Sub Text1_GotFocus ()

'Highlight all text
    Text1.SelStart = 0
    Text1.SelLength = Len(Text1.Text)

End Sub

Sub Text1_KeyPress (KeyAscii As Integer)

'Convert lowercase letters to uppercase
    If KeyAscii >= 97 And KeyAscii <= 122 Then
        KeyAscii = Asc(UCase$(Chr(KeyAscii)))
    End If End Sub Sub Text1_LostFocus ()
    UsernameLogon$ = Text1.Text
End Sub Sub Text2_Change ()
```

LOGON.FRM - 6

```
    'Enable OK button if something is in Username and Password
    If Len(Trim$(Text1.Text)) > 0 And Len(Trim$(Text2.Text)) > 0 Then
        Command3D1.Enabled = True
    Else
        Command3D1.Enabled = False
    End If End Sub Sub Text2_GotFocus ()

'Highlight all text
    Text2.SelStart = 0
    Text2.SelLength = Len(Text2.Text)

End Sub

Sub Text2_KeyPress (KeyAscii As Integer)

'Convert lowercase letters to uppercase
    If KeyAscii >= 97 And KeyAscii <= 122 Then
        KeyAscii = Asc(UCase$(Chr(KeyAscii)))
    End If End Sub Sub Text2_LostFocus ()
    PasswordLogon$ = Text2.Text
End Sub
```

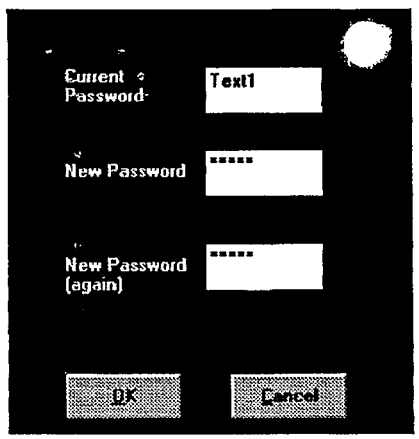

```
PASSWORD.FRM - 1

VERSION 2.00
Begin Form Password
    BackColor       =   &H00FF0000&
    Caption         =   "Change Password"
    ClientHeight    =   4350
    ClientLeft      =   2910
    ClientTop       =   2235
    ClientWidth     =   4155
    Height          =   4755
    HelpContextID   =   2700
    Left            =   2850
    LinkTopic       =   "Form1"
    ScaleHeight     =   4350
    ScaleWidth      =   4155
    Top             =   1890
    Width           =   4275
    Begin TextBox Text3
        ForeColor       =   &H00000000&
        Height          =   495
        Left            =   2040
        PasswordChar    =   "*"
        TabIndex        =   2
        Text            =   "Text3"
        Top             =   2400
        Width           =   1215
    End
    Begin TextBox Text2
        ForeColor       =   &H00000000&
        Height          =   495
        Left            =   2040
        PasswordChar    =   "*"
        TabIndex        =   1
        Text            =   "Text2"
        Top             =   1440
        Width           =   1215
    End
    Begin SSCommand Command3D2
        Caption         =   "&Cancel"
        Font3D          =   0  'None
        ForeColor       =   &H00000000&
        Height          =   495
        Left            =   2280
        Picture         =   (none)
        TabIndex        =   4
        Top             =   3720
        Width           =   1215
    End
    Begin SSCommand Command3D1
        Caption         =   "&OK"
        Enabled         =   0   'False
        Font3D          =   0   'None
        ForeColor       =   &H00000000&
        Height          =   495
        Left            =   600
        Picture         =   (none)
        TabIndex        =   3
        Top             =   3720
        Width           =   1215
    End
    Begin TextBox Text1
        ForeColor       =   &H00000000&
```

```
PASSWORD.FRM - 2
         Height          =    495
         Left            =    2040
         TabIndex        =    0
         Text            =    "Text1"
         Top             =    600
         Width           =    1215
      End
      Begin Label Label3
         BackStyle       =    0  'Transparent
         Caption         =    "New Password (again)"
         ForeColor       =    &H00FFFFFF&
         Height          =    495
         Left            =    600
         TabIndex        =    5
         Top             =    2520
         Width           =    1455
      End
      Begin Label Label2
         BackStyle       =    0  'Transparent
         Caption         =    "New Password"
         ForeColor       =    &H00FFFFFF&
         Height          =    495
         Left            =    600
         TabIndex        =    6
         Top             =    1560
         Width           =    1335
      End
      Begin Label Label1
         BackStyle       =    0  'Transparent
         Caption         =    "Current Password"
         ForeColor       =    &H00FFFFFF&
         Height          =    495
         Left            =    600
         TabIndex        =    7
         Top             =    600
         Width           =    1335
      End
End
```

PASSWORD.FRM - 1

```
Option Explicit
Dim DbVar As Database
Dim TableVar As Table

Sub Command3D1_Click ()

'Find the user's name
    TableVar.MoveFirst
    TableVar.Index = "PrimaryKey"
    TableVar.Seek "=", UCase(UsernameLogon$)

'Verify Old Password and matching new passwords
    If UCase(Text1.Text) = UCase(TableVar!Password) Then
        If UCase(Text2.Text) = UCase(Text3.Text) Then
            'Update the password
            TableVar.Edit
            TableVar("Password") = UCase(Text3.Text)
            TableVar.Update
            Beep
            MsgBox "Password successfully changed.", MB_ICONINFORMATION, Program
Name$
        Else
            Beep
            MsgBox "New passwords do not match each other.  Password not changed
.", MB_ICONSTOP, ProgramName$
        End If
    Else
        Beep
        MsgBox "Old password does not match.  Password not changed.", MB_ICONSTO
P, ProgramName$
    End If 'Close the table and database
    TableVar.Close
    DbVar.Close 'Unload the Password form
    Unload Password End Sub Sub Command3D2_Click ()

'Unlaod the form
    Unload Password

End Sub

Sub Form_Load ()

'Open password database
    Set DbVar = OpenDatabase(StartupPath$ + "\SWIM.MDB")
    Set TableVar = DbVar.OpenTable("USERS")

'Set form background color
    Password.BackColor = BackgroundColor

'Center the form on the screen
    CenterForm Password
```

PASSWORD.FRM - 2

```
    'Initialize text boxes
    Text1.Text = ""
    Text2.Text = ""
    Text3.Text = ""

End Sub

Sub Text1_Change ()

'Enable OK button if something is in Username and both Password
    If Len(Trim$(Text1.Text)) > 0 And Len(Trim$(Text2.Text)) > 0 And Len(Trim$(T
ext3.Text)) > 0 Then
        Command3D1.Enabled = True
    Else
        Command3D1.Enabled = False
    End If End Sub Sub Text1_GotFocus ()

'Highlight all text
    Text1.SelStart = 0
    Text1.SelLength = Len(Text1.Text)

End Sub

Sub Text1_KeyPress (KeyAscii As Integer)

'Convert lowercase letters to uppercase
    If KeyAscii >= 97 And KeyAscii <= 122 Then
        KeyAscii = Asc(UCase$(Chr(KeyAscii)))
    End If End Sub Sub Text2_Change ()

'Enable OK button if something is in Username and both Password
    If Len(Trim$(Text1.Text)) > 0 And Len(Trim$(Text2.Text)) > 0 And Len(Trim$(T
ext3.Text)) > 0 Then
        Command3D1.Enabled = True
    Else
        Command3D1.Enabled = False
    End If End Sub Sub Text2_GotFocus ()

'Highlight all text
    Text2.SelStart = 0
    Text2.SelLength = Len(Text2.Text)

End Sub

Sub Text2_KeyPress (KeyAscii As Integer)

'Convert lowercase letters to uppercase
    If KeyAscii >= 97 And KeyAscii <= 122 Then
        KeyAscii = Asc(UCase$(Chr(KeyAscii)))
```

PASSWORD.FRM - 3

```
    End If

End Sub

Sub Text3_Change ()

'Enable OK button if something is in Username and both Password
    If Len(Trim$(Text1.Text)) > 0 And Len(Trim$(Text2.Text)) > 0 And Len(Trim$(Text3.Text)) > 0 Then
        Command3D1.Enabled = True
    Else
        Command3D1.Enabled = False
    End If End Sub Sub Text3_GotFocus ()

'Highlight all text
    Text3.SelStart = 0
    Text3.SelLength = Len(Text3.Text)

End Sub

Sub Text3_KeyPress (KeyAscii As Integer)

'Convert lowercase letters to uppercase
    If KeyAscii >= 97 And KeyAscii <= 122 Then
        KeyAscii = Asc(UCase$(Chr(KeyAscii)))
    End If End Sub
```

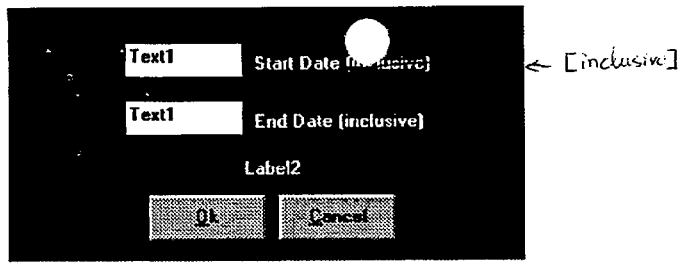

```
PURGE.FRM - 1

VERSION 2.00
Begin Form Purge
    BackColor       =   &H00FF0000&
    Caption         =   "Purge.Caption"
    ClientHeight    =   2610
    ClientLeft      =   2370
    ClientTop       =   2985
    ClientWidth     =   5310
    Height          =   3015
    Left            =   2310
    LinkTopic       =   "Form1"
    ScaleHeight     =   2610
    ScaleWidth      =   5310
    Top             =   2640
    Width           =   5430
    Begin TextBox Text1
        Height      =   375
        Index       =   1
        Left        =   1200
        TabIndex    =   1
        Text        =   "Text1"
        Top         =   960
        Width       =   1215
    End
    Begin TextBox Text1
        Height      =   375
        Index       =   0
        Left        =   1200
        TabIndex    =   0
        Text        =   "Text1"
        Top         =   360
        Width       =   1215
    End
    Begin SSCommand Command3D2
        Caption     =   "&Cancel"
        Font3D      =   0  'None
        ForeColor   =   &H00000000&
        Height      =   495
        Left        =   2760
        Picture     =   (none)
        TabIndex    =   3
        Top         =   1920
        Width       =   1215
    End
    Begin SSCommand Command3D1
        Caption     =   "&Ok"
        Font3D          0  'None
        ForeColor   =   &H00000000&
        Height      =   495
        Left        =   1440
        Picture     =   (none)
        TabIndex    =   2
        Top         =   1920
        Width       =   1215
    End
    Begin Label Label2
        Alignment   =   2  'Center
        BackStyle   =   0  'Transparent
        Caption     =   "Label2"
        ForeColor   =   &H00FFFFFF&
        Height      =   255
```

```
PURGE.FRM - 2
    Left            =       1080
    TabIndex        =       6
    Top             =       1560
    Width           =       3255
End
Begin Label Label1
    BackStyle       =       0  'Transparent
    Caption         =       "End Date (inclusive)"
    ForeColor       =       &H00FFFFFF&
    Height          =       255
    Index           =       1
    Left            =       2520
    TabIndex        =       5
    Top             =       1080
    Width           =       2295
End
Begin Label Label1
    BackStyle       =       0  'Transparent
    Caption         =       "Start Date (inclusive)"
    ForeColor       =       &H00FFFFFF&
    Height          =       255
    Index           =       0
    Left            =       2520
    TabIndex        =       4
    Top             =       480
    Width           =       2295
End
End
```

PURGE.FRM - 1

```
Option Explicit
Dim DbVar As database
Dim TableVar As Table

Sub PurgeData ()
    Dim i%

'Set mouse pointer & caption
    Purge.MousePointer = Hourglass
    Label2.Caption = "Purging data.  Please wait..."
    Label2.Refresh 'Initialize database
    Set DbVar = OpenDatabase(CurrentDatabaseName$)
    Set TableVar = DbVar.OpenTable(CurrentTableName$)

'Delete the records between the dates
    DbVar.Execute "DELETE * From " & CurrentTableName$ & " WHERE (Date>=#" & Low
erDate$ & "# AND Date<=#" & UpperDate$ & "#)"

'Close the table and database
    TableVar.Close
    DbVar.Close

'Set mouse pointer & caption
    Purge.MousePointer = Arrow
    Label2.Caption = ""

End Sub

Sub Command3D1_Click ()
    Dim Response%

'Ask user if the purged data should be saved
    Response% = MsgBox("Saved purged data to file ?", MB_YESNO + MB_ICONQUESTION
, ProgramName$)
    If Response% = IDYES Then
        ExitMethod% = C_CANCEL 'Show the SaveFile form
        SaveFile.Show modal 'Check how the user exited
        If ExitMethod% = C_CANCEL Then
            Exit Sub
        End If
    End If 'Purge the data
    Call PurgeData 'Unload form
    Unload Purge End Sub Sub Command3D2_Click ()

'Unload form
    Unload Purge
```

PURGE.FRM - 2

```
End Sub

Sub Form_Load ()

'Set form background color
    Purge.BackColor = BackgroundColor

'Center the form on the screen
    CenterForm Purge

'Set form caption & message caption
    Purge.Caption = "Purge " + Machine(CurrentMachine%).Description$
    Label2.Caption = ""

'Initialize text boxes
    Text1(0).Text = ""
    Text1(1).Text = ""

End Sub

Sub Text1_Change (Index As Integer)

'Enable OK button if something is in both date boxes
    If Len(Trim$(Text1(0).Text)) > 0 And Len(Trim$(Text1(1).Text)) > 0 And Len(Trim$(Text1(Index).Text)) > 0 Then
        Command3D1.Enabled = True
    Else
        Command3D1.Enabled = False
    End If End Sub Sub Text1_GotFocus (Index As Integer)

'Highlight all text
    Text1(Index).SelStart = 0
    Text1(Index).SelLength = Len(Text1(Index).Text)

End Sub

Sub Text1_LostFocus (Index As Integer)
    Dim dDate$

'Verify that the entered data is numeric
    If Not IsDate(Text1(Index).Text) Then
        Beep
        Text1(Index).SetFocus
        Text1(Index).SelStart = 0
        Text1(Index).SelLength = Len(Text1(Index).Text)
        MsgBox "Entered data is not a date !", MB_ICONSTOP, ProgramName$
        Exit Sub
    End If 'Set variable to VB object
    dDate$ = Text1(Index).Text If Index% = 0 Then
        LowerDate$ = dDate$
    Else
        UpperDate$ = dDate$
```

```
PURGE.FRM - 3
    End If
End Sub
```

| Date | Mat. Thick. | Tensile | HC. | %Clearance | Width Ordered. |
|---|---|---|---|---|---|
| Text1 | Text2 | Text3 | Text4 | Text6 | Text5 |
| Text1 | Text2 | Text3 | Text4 | Text6 | Text5 |

| Date | Material Thickness. | Tensile. | HC. | Percent Clearance | Width Ordered. | Width Actual. | Difference. |
|---|---|---|---|---|---|---|---|
| Table1 | | | | | | | |

Query Statistics
Count: Label12
Average: Label13
Minimum: Label14
Maximum: Label15
Std Dev: Label16

Label18

[OK] [Refresh] [Execute Query]

QUERY.FRM - 1

```
VERSION 2.00
Begin Form Query
    BackColor       =   &H00C0C0C0&
    Caption         =   "Query.Caption"
    ClientHeight    =   6255
    ClientLeft      =   120
    ClientTop       =   870
    ClientWidth     =   9435
    Height          =   6945
    HelpContextID   =   5000
    Left            =   60
    LinkTopic       =   "Form1"
    ScaleHeight     =   6255
    ScaleWidth      =   9435
    Top             =   240
    Width           =   9555
    Begin TextBox Text6
        Height      =   375
        Index       =   1
        Left        =   6300
        TabIndex    =   9
        Text        =   "Text6"
        Top         =   600
        Width       =   1575
    End
    Begin TextBox Text6
        Height      =   375
        Index       =   0
        Left        =   6300
        TabIndex    =   8
        Text        =   "Text6"
        Top         =   240
        Width       =   1575
    End
    Begin TextBox Text1
        Alignment   =   2  'Center
        Height      =   375
        Index       =   0
        Left        =   0
        TabIndex    =   0
        Text        =   "Text1"
        Top         =   240
        Width       =   1575
    End
    Begin SSCommand Command3D1
        Caption     =   "&OK"
        Font3D      =   0  'None
        ForeColor   =   &H00000000&
        Height      =   495
        Left        =   240
        Picture     =   (none)
        TabIndex    =   14
        Top         =   5400
        Width       =   1335
    End
    Begin SSFrame Frame3D1
        Alignment   =   2  'Center
        Caption     =   "Query Statistics"
        Font3D      =   0  'None
        Height      =   1455
        Left        =   2400
```

```
QUERY.FRM - 2

TabIndex        =    21
    Top             =    4680
    Width           =    3135
    Begin Label Label16
        BackStyle       =    0   'Transparent
        Caption         =    "Label16"
        Height          =    255
        Left            =    1680
        TabIndex        =    22
        Top             =    1200
        Width           =    1215
    End
    Begin Label Label6
        BackStyle       =    0   'Transparent
        Caption         =    "Count:"
        Height          =    255
        Left            =    600
        TabIndex        =    23
        Top             =    240
        Width           =    855
    End
    Begin Label Label7
        BackStyle       =    0   'Transparent
        Caption         =    "Average:"
        Height          =    255
        Left            =    600
        TabIndex        =    24
        Top             =    480
        Width           =    855
    End
    Begin Label Label8
        BackStyle       =    0   'Transparent
        Caption         =    "Minimum:"
        Height          =    255
        Left            =    600
        TabIndex        =    25
        Top             =    720
        Width           =    855
    End
    Begin Label Label9
        BackStyle       =    0   'Transparent
        Caption         =    "Maximum:"
        Height          =    255
        Left            =    600
        TabIndex        =    26
        Top             =    960
        Width           =    855
    End
    Begin Label Label10
        BackStyle       =    0   'Transparent
        Caption         =    "Std Dev:"
        Height          =    255
        Left            =    600
        TabIndex        =    27
        Top             =    1200
        Width           =    855
    End
    Begin Label Label12
        BackStyle       =    0   'Transparent
        Caption         =    "Label12"
        Height          =    255
```

```
QUERY.FRM - 3
        Left            =   1680
        TabIndex        =   29
        Top             =   240
        Width           =   1215
    End
    Begin Label Label13
        BackStyle       =   0  'Transparent
        Caption         =   "Label13"
        Height          =   255
        Left            =   1680
        TabIndex        =   30
        Top             =   480
        Width           =   1215
    End
    Begin Label Label14
        BackStyle       =   0  'Transparent
        Caption         =   "Label14"
        Height          =   255
        Left            =   1680
        TabIndex        =   31
        Top             =   720
        Width           =   1215
    End
    Begin Label Label15
        BackStyle       =   0  'Transparent
        Caption         =   "Label15"
        Height          =   255
        Left            =   1680
        TabIndex        =   32
        Top             =   960
        Width           =   1215
    End
End
Begin SSCommand Command3D2
    Caption         =   "&Refresh"
    Font3D          =   0  'None
    ForeColor       =   &H00000000&
    Height          =   495
    Left            =   6360
    Picture         =   (none)
    TabIndex        =   13
    Top             =   5520
    Width           =   1335
End
Begin TextBox Text5
    Height          =   375
    Index           =   1
    Left            =   7875
    TabIndex        =   11
    Text            =   "Text5"
    Top             =   600
    Width           =   1575
End
Begin TextBox Text5
    Height          =   375
    Index           =   0
    Left            =   7875
    TabIndex        =   10
    Text            =   "Text5"
    Top             =   240
    Width           =   1575
```

```
QUERY.FRM - 4

End
   Begin TextBox Text1
      Alignment       =   2   'Center
      Height          =   375
      Index           =   1
      Left            =   0
      TabIndex        =   1
      Text            =   "Text1"
      Top             =   600
      Width           =   1575
   End
   Begin TextBox Text2
      Alignment       =   2   'Center
      Height          =   375
      Index           =   1
      Left            =   1575
      TabIndex        =   3
      Text            =   "Text2"
      Top             =   600
      Width           =   1575
   End
   Begin TextBox Text3
      Alignment       =   2   'Center
      Height          =   375
      Index           =   1
      Left            =   3150
      TabIndex        =   5
      Text            =   "Text3"
      Top             =   600
      Width           =   1575
   End
   Begin TextBox Text4
      Alignment       =   2   'Center
      Height          =   375
      Index           =   1
      Left            =   4725
      TabIndex        =   7
      Text            =   "Text4"
      Top             =   600
      Width           =   1575
   End
   Begin TrueGrid Table1
      AllowArrows     =   -1  'True
      AllowTabs       =   -1  'True
      BackColor       =   &H00FFFFFF&
      DataSource      =   "Data1"
      Editable        =   -1  'True
      EditDropDown    =   -1  'True
      ExposeCellMode  =   0   'Expose upon selection
      FetchMode       =   0   'By cell
      HeadingHeight   =   3
      Height          =   3375
      HorzLines       =   1   'Single LayoutIndex     =   1
      Left            =   0
      LinesPerRow     =   1
      MarqueeUnique   =   -1  'True
      SplitPropsGlobal=   -1  'True
      SplitTabMode    =   0   'Don't tab across splits
      TabCapture      =   0   'False
```

QUERY.FRM - 5

```
         TabIndex         =   19  19
         Top              =   1200
         UseBookmarks     =   -1    'True
         Width            =   9375
         WrapCellPointer  =   0     'False
      End
      Begin Data Data1
         Connect          =   ""
         DatabaseName     =   "C:\SWIM\SWIM.MDB"
         Exclusive        =   0     'False
         Height           =   270
         Left             =   0
         Options          =   0
         ReadOnly         =   0     'False
         RecordSource     =   "RECORD"
         Top              =   4560
         Width            =   1455
      End
      Begin SSCommand Command3D3
         Caption          =   "E&xecute Query"
         Font3D           =   0     'None
         ForeColor        =   &H00000000&
         Height           =   495
         Left             =   7920
         Picture          =   (none)
         TabIndex         =   12
         Top              =   5520
         Width            =   1335
      End
      Begin TextBox Text4
         Alignment        =   2     'Center
         Height           =   375
         Index            =   0
         Left             =   4725
         TabIndex         =   6
         Text             =   "Text4"
         Top              =   240
         Width            =   1575
      End
      Begin TextBox Text3
         Alignment        =   2     'Center
         Height           =   375
         Index            =   0
         Left             =   3150
         TabIndex         =   4
         Text             =   "Text3"
         Top              =   240
         Width            =   1575
      End
      Begin TextBox Text2
         Alignment        =   2     'Center
         Height           =   375
         Index            =   0
         Left             =   1560
         TabIndex         =   2
         Text             =   "Text2"
         Top              =   240
         Width            =   1575
      End
      Begin Label Label11
         Alignment        =   2     'Center
```

```
QUERY.FRM - 6
         BackColor       =   &H00FF0000&    [&HCCFF0000&]
         BorderStyle     =   1  'Fixed Single
         Caption         =   "%Clearance"
         ForeColor       =   &H00FFFFFF&
         Height          =   255
         Left            =   6300
         TabIndex        =   33
         Top             =   0
         Width           =   1575
      End
      Begin Label Label18
         Alignment       =   2  'Center
         BackStyle       =   0  'Transparent
         Caption         =   "Label18"
         Height          =   255
         Left            =   6240
         TabIndex        =   28
         Top             =   5040
         Width           =   3015
      End
      Begin Label Label5
         BackColor       =   &H00FF0000&
         BorderStyle     =   1  'Fixed Single
         Caption         =   "Width Ordered, "
         ForeColor       =   &H00FFFFFF&
         Height          =   255
         Left            =   7875
         TabIndex        =   20
         Top             =   0
         Width           =   1575
      End
      Begin Label Label4
         Alignment       =   2  'Center
         BackColor       =   &H00FF0000&
         BorderStyle     =   1  'Fixed Single
         Caption         =   "HC, "
         ForeColor       =   &H00FFFFFF&
         Height          =   255
         Left            =   4725
         TabIndex        =   18
         Top             =   0
         Width           =   1575
      End
      Begin Label Label3
         Alignment       =   2  'Center
         BackColor       =   &H00FF0000&
         BorderStyle     =   1  'Fixed Single
         Caption         =   "Tensile, "
         ForeColor       =   &H00FFFFFF&
         Height          =   255
         Left            =   3150
         TabIndex        =   17
         Top             =   0
         Width           =   1575
      End
      Begin Label Label2
         Alignment       =   2  'Center
         BackColor       =   &H00FF0000&
         BorderStyle     =   1  'Fixed Single
         Caption         =   "Mat. Thick., "
         ForeColor       =   &H00FFFFFF&
```

```
QUERY.FRM - 7
        Height          =   255
        Left            =   1575
        TabIndex        =   16
        Top             =   0
        Width           =   1575
    End
    Begin Label Label1
        Alignment       =   2  'Center
        BackColor       =   &H00FF0000&
        BorderStyle     =   1  'Fixed Single
        Caption         =   "Date"
        ForeColor       =   &H00FFFFFF&
        Height          =   255
        Left            =   0
        TabIndex        =   15
        Top             =   0
        Width           =   1575
    End
    Begin Menu Report_Menu
        Caption         =   "&Report"
        Begin Menu Summary_Report_Menu
            Caption         =   "&Summary Report"
        End
        Begin Menu Detail_Report_Menu
            Caption         =   "&Detail Report"
        End
        Begin Menu Frequency_Report_Menu
            Caption         =   "&Frequency Distibution"
            Visible         =   0  'False
        End
    End
    Begin Menu Chart_Menu
        Caption         =   "&Chart"
        Begin Menu Frequency_Chart_Menu
            Caption         =   "&Frequency Distibution"
        End
    End
    Begin Menu mnuMainPopup
        Caption         =   "Popup"
        Visible         =   0  'False
        Begin Menu mnuPopup
            Caption         =   "mnuPopup"
            Index           =   0
        End
        Begin Menu mnuPopup
            Caption         =   "mnuPopup"
            Index           =   1
        End
        Begin Menu mnuPopup
            Caption         =   "mnuPopup"
            Index           =   2
        End
        Begin Menu mnuPopup
            Caption         =   "mnuPopup"
            Index           =   3
        End
        Begin Menu mnuPopup
            Caption         =   "mnuPopup"
            Index           =   4
        End
        Begin Menu mnuPopup
```

```
QUERY.FRM - 8
         Caption         =   "mnuPopup"
         Index           =   5
      End
      Begin Menu mnuPopup
         Caption         =   "mnuPopup"
         Index           =   6
      End
      Begin Menu mnuPopup
         Caption         =   "mnuPopup"
         Index           =   7
      End
      Begin Menu mnuPopup
         Caption         =   "mnuPopup"
         Index           =   8
      End
      Begin Menu mnuPopup
         Caption         =   "mnuPopup"
         Index           =   9
      End
   End
End
```

QUERY.FRM - 1

```
Option Explicit
Dim DbVar As Database
Dim TableVar As Table
Dim DsSomeData As Dynaset
Dim SQLQ As String
Dim Range#

Sub DisplayPopupMenu ()
    Dim i%
    Dim Lower$, Upper$

'Fill menu captions based on where the user double-clicked.  Hide any
    'unused menu options
    If PopupMenuCode% = C_MATERIAL_THICKNESS Then
        For i% = 0 To (SummaryMaterialThicknessGroups% - 1)
            mnuPopup(i%).Visible = True
            Lower$ = Formatx(SummaryMaterialThickness(i%).Lower#, 3)
            Upper$ = Formatx(SummaryMaterialThickness(i%).Upper#, 3)
            mnuPopup(i%).Caption = Lower$ + " - " + Upper$
        Next i%
        For i% = SummaryMaterialThicknessGroups% To 9
            mnuPopup(i%).Visible = False
        Next i%

ElseIf PopupMenuCode% = C_TENSILE Then
        For i% = 0 To (SummaryTensileGroups% - 1)
            mnuPopup(i%).Visible = True
            Lower$ = Formatx(SummaryTensile(i%).Lower#, 0)
            Upper$ = Formatx(SummaryTensile(i%).Upper#, 0)
            mnuPopup(i%).Caption = Lower$ + " - " + Upper$
        Next i%
        For i% = SummaryTensileGroups% To 9
            mnuPopup(i%).Visible = False
        Next i%

ElseIf PopupMenuCode% = C_HC Then
        For i% = 0 To (SummaryHCGroups% - 1)
            mnuPopup(i%).Visible = True
            Lower$ = Formatx(SummaryHC(i%).Lower#, Precision%)
            Upper$ = Formatx(SummaryHC(i%).Upper#, Precision%)
            mnuPopup(i%).Caption = Lower$ + " - " + Upper$
        Next i%
        For i% = SummaryHCGroups% To 9
            mnuPopup(i%).Visible = False
        Next i%

ElseIf PopupMenuCode% = C_PERCENT_HC Then
        For i% = 0 To (SummaryPercentHCGroups% - 1)
            mnuPopup(i%).Visible = True
            Lower$ = Formatx(SummaryPercentHC(i%).Lower#, 4)
            Upper$ = Formatx(SummaryPercentHC(i%).Upper#, 4)
            mnuPopup(i%).Caption = Lower$ + " - " + Upper$
        Next i%
        For i% = SummaryPercentHCGroups% To 9
            mnuPopup(i%).Visible = False
        Next i%

ElseIf PopupMenuCode% = C_WIDTH_ORDERED Then
        For i% = 0 To (SummaryWidthOrderedGroups% - 1)
            mnuPopup(i%).Visible = True
```

QUERY.FRM - 2   Formatx

```
            Lower$ = Formatx(SummaryWidthOrdered(i%).Lower#, MultWidthPrecision%
)
            Upper$ = Formatx(SummaryWidthOrdered(i%).Upper#, MultWidthPrecision%
)
            mnuPopup(i%).Caption = Lower$ + " - " + Upper$
        Next i%
        For i% = SummaryWidthOrderedGroups% To 9
            mnuPopup(i%).Visible = False
        Next i%

End If

'Display the popup menu at the location of the double-click
    PopupMenu mnuMainPopup
End Sub Sub Frequency_Menu_Click ()

'Load chart form
    Chart.Show

End Sub

Sub Command3D1_Click ()

Unload Query

End Sub

Sub Command3D2_Click ()

'Initialize data at top of window
    Text1(0).Text = "*"
    Text2(0).Text = "*"
    Text3(0).Text = "*"
    Text4(0).Text = "*"
    Text5(0).Text = "*"
    Text1(1).Text = "*"
    Text2(1).Text = "*"
    Text3(1).Text = "*"
    Text4(1).Text = "*"
    Text5(1).Text = "*"

'Clear statistics
    Label12.Caption = ""
    Label13.Caption = ""
    Label15.Caption = ""
    Label14.Caption = ""
    Label16.Caption = ""

'Disable reports and chart
    Chart_Menu.Enabled = False
    Report_Menu.Enabled = False 'Set datasource
    Data1.DatabaseName = StartupPath$ + "\SWIM.MDB"
    Data1.RecordSource = Machine(CurrentMachine%).TableName$
    Data1.Refresh End Sub
```

QUERY.FRM - 3

```
Sub Command3D3_Click ()
    Dim MoreThanOne%
    Dim One#, Two#, Three#
    Dim Q As QueryDef
    Dim DsStatData As Dynaset
    Dim StatDbVar As Database
    Dim Total#
    Dim Counter%

'Set mouse pointer
    Query.MousePointer = Hourglass

'Display message for user
    Label18.Caption = "Performing Query.  Please wait..."
    Label18.Refresh SQLQ = "SELECT * FROM [" & CurrentTableName$ & "] "
    MoreThanOne% = False 'Date
    If Text1(0).Text <> "*" And Text1(1).Text <> "*" Then
        SQLQ = SQLQ & "WHERE (Date>=#" & LowerDate$ & "# AND Date<=#" & UpperDat
e$ & "#)"
        MoreThanOne% = True
    End If 'Material thickness
    If Text2(0).Text <> "*" And Text2(1).Text <> "*" Then
        If MoreThanOne% = True Then
            SQLQ = SQLQ & "AND (MaterialThickness>=" & LowerMaterialThickness# &
 " AND MaterialThickness<=" & UpperMaterialThickness# & ")"
        Else
            SQLQ = SQLQ & "WHERE (MaterialThickness>=" & LowerMaterialThickness#
 & " AND MaterialThickness<=" & UpperMaterialThickness# & ")"
        End If
        MoreThanOne% = True
    End If 'Tensile
    If Text3(0).Text <> "*" And Text3(1).Text <> "*" Then
        If MoreThanOne% = True Then
            SQLQ = SQLQ & "AND (Tensile>=" & LowerTensile# & " AND Tensile<=" &
UpperTensile# & ")"
        Else
            SQLQ = SQLQ & "WHERE (Tensile>=" & LowerTensile# & " AND Tensile<="
& UpperTensile# & ")"
        End If
        MoreThanOne% = True
    End If 'HC
    If Text4(0).Text <> "*" And Text4(1).Text <> "*" Then
        If MoreThanOne% = True Then
            SQLQ = SQLQ & "AND (HC>=" & LowerHC# & " AND HC<=" & UpperHC# & ")"
        Else
            SQLQ = SQLQ & "WHERE (HC>=" & LowerHC# & " AND HC<=" & UpperHC# & ")
"
        End If
        MoreThanOne% = True
    End If
```

QUERY.FRM - 4

```
    'PercentClearance
    If Text6(0).Text <> "*" And Text6(1).Text <> "*" Then
        If MoreThanOne% = True Then
            SQLQ = SQLQ & "AND (PercentHC>=" & LowerPercentHC# & " AND PercentHC
<=" & UpperPercentHC# & ")"
        Else
            SQLQ = SQLQ & "WHERE (PercentHC>=" & LowerPercentHC# & " AND Percent
HC<=" & UpperPercentHC# & ")"
        End If
        MoreThanOne% = True
    End If 'Width Ordered
    If Text5(0).Text <> "*" And Text5(1).Text <> "*" Then
        If MoreThanOne% = True Then
            SQLQ = SQLQ & "AND (WidthOrdered>=" & LowerWidthOrdered# & " AND Wid
thOrdered<=" & UpperWidthOrdered# & ")"
        Else
            SQLQ = SQLQ & "WHERE (WidthOrdered>=" & LowerWidthOrdered# & " AND W
idthOrdered<=" & UpperWidthOrdered# & ")"
        End If
        MoreThanOne% = True
    End If 'Update data control
    Data1.RecordSource = SQLQ
    Data1.Refresh 'Display message for user
    'Label18.Caption = "DO WHILE Statis 1.  Please wait..."
    'Label18.Refresh
    'Data1.Recordset.MoveFirst
    'Total# = 0
    'Counter% = 0
    'Do Until Data1.Recordset.EOF = True
    '    Total# = Total# + Data1.Recordset("Difference")
    '    Counter% = Counter% + 1
    '    Data1.Recordset.MoveNext
    'Loop
    ''Display message for user
    'Label18.Caption = "DO WHILE Statis 2.  Please wait..."
    'Label18.Refresh
    'Data1.Recordset.MoveFirst
    'Total# = 0
    'Counter% = 0
    'Do Until Data1.Recordset.EOF = True
    '    Total# = Total# + Data1.Recordset("Difference")
    '    Counter% = Counter% + 1
    '    Data1.Recordset.MoveNext
    'Loop 'Calculate Statistics--------------------------------------------------------
    Set StatDbVar = OpenDatabase(CurrentDatabaseName$)

'Display message for user
    Label18.Caption = "Calculating.  Please wait..."
    Label18.Refresh SQLQ = "SELECT Avg(Difference) as Avg, Count(Difference) as Count, Min(Diffe
```

QUERY.FRM - 5    Difference

```
rence) as Min, Max(Difference) as Max, StDev(Difference) as StDev FROM [" & Curr
entTableName$ & "] "
    MoreThanOne% = False 'Date
    If Text1(0).Text <> "*" And Text1(1).Text <> "*" Then
        SQLQ = SQLQ & "WHERE (Date>=#" & LowerDate$ & "# AND Date<=#" & UpperDat
e$ & "#)"
        MoreThanOne% = True
    End If 'Material thickness
    If Text2(0).Text <> "*" And Text2(1).Text <> "*" Then
        If MoreThanOne% = True Then
            SQLQ = SQLQ & "AND (MaterialThickness>=" & LowerMaterialThickness# &
 " AND MaterialThickness<=" & UpperMaterialThickness# & ")"
        Else
            SQLQ = SQLQ & "WHERE (MaterialThickness>=" & LowerMaterialThickness#
 & " AND MaterialThickness<=" & UpperMaterialThickness# & ")"
        End If
        MoreThanOne% = True
    End If 'Tensile
    If Text3(0).Text <> "*" And Text3(1).Text <> "*" Then
        If MoreThanOne% = True Then
            SQLQ = SQLQ & "AND (Tensile>=" & LowerTensile# & " AND Tensile<=" &
UpperTensile# & ")"
        Else
            SQLQ = SQLQ & "WHERE (Tensile>=" & LowerTensile# & " AND Tensile<="
& UpperTensile# & ")"
        End If
        MoreThanOne% = True
    End If 'HC
    If Text4(0).Text <> "*" And Text4(1).Text <> "*" Then
        If MoreThanOne% = True Then
            SQLQ = SQLQ & "AND (HC>=" & LowerHC# & " AND HC<=" & UpperHC# & ")"
        Else
            SQLQ = SQLQ & "WHERE (HC>=" & LowerHC# & " AND HC<=" & UpperHC# & ")
"
        End If
        MoreThanOne% = True
    End If 'PercentClearance
    If Text6(0).Text <> "*" And Text6(1).Text <> "*" Then
        If MoreThanOne% = True Then
            SQLQ = SQLQ & "AND (PercentHC>=" & LowerPercentHC# & " AND PercentHC
<=" & UpperPercentHC# & ")"
        Else
            SQLQ = SQLQ & "WHERE (PercentHC>=" & LowerPercentHC# & " AND Percent
HC<=" & UpperPercentHC# & ")"
        End If
        MoreThanOne% = True
    End If 'Width Ordered
    If Text5(0).Text <> "*" And Text5(1).Text <> "*" Then
```

QUERY.FRM - 6

```
        If MoreThanOne% = True Then
            SQLQ = SQLQ & "AND (WidthOrdered>=" & LowerWidthOrdered# & " AND Wid
thOrdered<=" & UpperWidthOrdered# & ")"
        Else
            SQLQ = SQLQ & "WHERE (WidthOrdered>=" & LowerWidthOrdered# & " AND W
idthOrdered<=" & UpperWidthOrdered# & ")"
        End If
        MoreThanOne% = True
    End If Set Q = StatDbVar.CreateQueryDef("Statistics", SQLQ)
    Set DsStatData = Q.CreateDynaset()
    StatCount% = Roundx(DsStatData("Count"), 1, 0)
    Label12.Caption = StatCount%
    If StatCount% > 0 Then
        StatAvg# = Formatx(DsStatData("Avg"), MultWidthPrecision%)
        Label13.Caption = StatAvg#
        StatMin# = Formatx(DsStatData("Min"), MultWidthPrecision%)
        Label15.Caption = StatMin#
        StatMax# = Formatx(DsStatData("Max"), MultWidthPrecision%)
        Label14.Caption = StatMax#
        StatStDev# = Formatx(DsStatData("StDev"), MultWidthPrecision%)
        Label16.Caption = StatStDev#
        'Enable reports and chart
        Chart_Menu.Enabled = True
        Report_Menu.Enabled = True
    Else
        Label13.Caption = ""
        Label15.Caption = ""
        Label14.Caption = ""
        Label16.Caption = ""
        'Disable reports and chart
        Chart_Menu.Enabled = False
        Report_Menu.Enabled = False
    End If 'Close query and delete
    Q.Close
    StatDbVar.DeleteQueryDef "Statistics"

'Clear message
    Label18.Caption = ""

'Set mouse pointer
    Query.MousePointer = Arrow

End Sub

Sub Form_Load ()
    Dim i%, j%

'Center the form on the screen
    CenterForm Query

'Set form caption
    Query.Caption = "Query Data " & CurrentTableDescription$

'Add units to column titles
    Label2.Caption = Label2.Caption + Distance(Units%)
    Label3.Caption = Label3.Caption + Pressure(Units%)
    Label4.Caption = Label4.Caption + Distance(Units%)
```

QUERY.FRM - 7

```
    Label5.Caption = Label5.Caption + Distance(Units%)
    Table1.ColumnName(2) = Table1.ColumnName(2) + Distance(Units%)
    Table1.ColumnName(3) = Table1.ColumnName(3) + Pressure(Units%)
    Table1.ColumnName(4) = Table1.ColumnName(4) + Distance(Units%)
    Table1.ColumnName(6) = Table1.ColumnName(6) + Distance(Units%)
    Table1.ColumnName(7) = Table1.ColumnName(7) + Distance(Units%)
    Table1.ColumnName(8) = Table1.ColumnName(8) + Distance(Units%)
    'Initialize data at top of window
    Text1(0).Text = "*"
    Text2(0).Text = "*"
    Text3(0).Text = "*"
    Text4(0).Text = "*"
    Text5(0).Text = "*"
    Text6(0).Text = "*"
    Text1(1).Text = "*"
    Text2(1).Text = "*"
    Text3(1).Text = "*"
    Text4(1).Text = "*"
    Text5(1).Text = "*"
    Text6(1).Text = "*"

Label12.Caption = ""
    Label13.Caption = ""
    Label14.Caption = ""
    Label15.Caption = ""
    Label16.Caption = ""
    Label18.Caption = ""

'Disable reports and chart until query is performed
    Chart_Menu.Enabled = False
    Report_Menu.Enabled = False 'Set datasource
    Data1.DatabaseName = CurrentDatabaseName$
    Data1.RecordSource = CurrentTableName$
    Data1.Refresh 'Set focus to ActualWidth column of table
    Table1.ColumnIndex = 6

End Sub

Sub Frequency_Chart_Menu_Click ()

'Set mousepointer
    Query.MousePointer = Hourglass

'Display Chart window
    Chart.Show

'Set mousepointer
    Query.MousePointer = Arrow

End Sub

Sub mnuPopup_Click (Index As Integer)
    Dim Lower$, Upper$

'Set Text properties of textboxes and VB variables based on user's
    'selection on the popup menu
    If PopupMenuCode% = C_MATERIAL_THICKNESS Then
```

QUERY.FRM - 8

```
                                        Summary
                                          ʌ
        Lower$ = Formatx(SummaryMaterialThickness(Index).Lower#, 3)
        Upper$ = Formatx(SummaryMaterialThickness(Index%).Upper#, 3)
        Text2(0).Text = Lower$
        Text2(1).Text = Upper$
        LowerMaterialThickness# = Val(Lower$)
        UpperMaterialThickness# = Val(Upper$)

ElseIf PopupMenuCode% = C_TENSILE Then
        Lower$ = Formatx(SummaryTensile(Index).Lower#, 0)
        Upper$ = Formatx(SummaryTensile(Index%).Upper#, 0)
        Text3(0).Text = Lower$
        Text3(1).Text = Upper$
        LowerTensile# = Val(Lower$)
        UpperTensile# = Val(Upper$)

ElseIf PopupMenuCode% = C_HC Then
        Lower$ = Formatx(SummaryHC(Index).Lower#, Precision%)
        Upper$ = Formatx(SummaryHC(Index%).Upper#, Precision%)
        Text4(0).Text = Lower$
        Text4(1).Text = Upper$
        LowerHC# = Val(Lower$)
        UpperHC# = Val(Upper$)

ElseIf PopupMenuCode% = C_PERCENT_HC Then
        Lower$ = Formatx(SummaryPercentHC(Index).Lower#, 4)
        Upper$ = Formatx(SummaryPercentHC(Index%).Upper#, 4)
        Text6(0).Text = Lower$
        Text6(1).Text = Upper$
        LowerPercentHC# = Val(Lower$)
        UpperPercentHC# = Val(Upper$)

ElseIf PopupMenuCode% = C_WIDTH_ORDERED Then
        Lower$ = Formatx(SummaryWidthOrdered(Index).Lower#, MultWidthPrecision%)
        Upper$ = Formatx(SummaryWidthOrdered(Index%).Upper#, MultWidthPrecision%
)
        Text5(0).Text = Lower$
        Text5(1).Text = Upper$
        LowerPercentHC# = Val(Lower$)
        UpperPercentHC# = Val(Upper$)
    End If End Sub Sub Summary_Report_Menu_Click ()
    Dim FileNum%
    Dim FileName$
    Dim X%, i%

FileNum% = FreeFile
    FileName$ = "PREVIEW.SWM"
    Open FileName$ For Output As FileNum%
    Width #FileNum%, PrinterWidth 'Print the top of the report
    PrintCenter FileNum%, CompanyName$
    Print #FileNum%, ""
    PrintCenter FileNum%, ReportTitle$
    PrintCenter FileNum%, Copyright$
    Print #FileNum%, ""
    PrintCenter FileNum%, "ACCESSED ON: " + Format(Now, "dddd, mmmm dd, yyyy") +
 " AT " + Format(Now, "ttttt")
```

QUERY.FRM - 9

```
    Print #FileNum%, ""
    PrintCenter FileNum%, "ALL DIMENSIONS ARE IN " + Distance(Units%) + " UNLESS
OTHERWISE NOTED."
    Print #FileNum%, ""
    Print #FileNum%, ""
    Print #FileNum%, ""

Print #FileNum%, Tab(10); "          "; Tab(25); " MATERIAL"; Tab(40); "
 "; Tab(55); "HORIZONTAL"; Tab(70); "   WIDTH"
    Print #FileNum%, Tab(10); "   DATES"; Tab(25); "THICKNESS"; Tab(40); " TENSI
LE"; Tab(55); " CLEARANCE"; Tab(70); "  ORDERD"

Print #FileNum%, Tab(0); "Lower:";
    Print #FileNum%, Tab(10); Query.Text1(0).Text;
    Print #FileNum%, Tab(25); Query.Text2(0).Text;
    Print #FileNum%, Tab(40); Query.Text3(0).Text;
    Print #FileNum%, Tab(55); Query.Text4(0).Text;
    Print #FileNum%, Tab(70); Query.Text5(0).Text
    Print #FileNum%, Tab(0); "Upper:";
    Print #FileNum%, Tab(10); Query.Text1(1).Text;
    Print #FileNum%, Tab(25); Query.Text2(1).Text;
    Print #FileNum%, Tab(40); Query.Text3(1).Text;
    Print #FileNum%, Tab(55); Query.Text4(1).Text;
    Print #FileNum%, Tab(70); Query.Text5(1).Text
    Print #FileNum%, ""
    Print #FileNum%, ""

Print #FileNum%, "Count:    " & Formatx(StatCount%, 1)
    Print #FileNum%, "Average:  " & Formatx(StatAvg#, MultWidthPrecision%) + " "
+ Distance(Units%)
    Print #FileNum%, "Minimum:  " & Formatx(StatMin#, MultWidthPrecision%) + " "
+ Distance(Units%)
    Print #FileNum%, "Maximum:  " & Formatx(StatMax#, MultWidthPrecision%) + " "
+ Distance(Units%)
    'Print #FileNum%, "Variance: " & Formatx(StatVar#, MultWidthPrecision%) + "
" + Distance(Units%)
    Print #FileNum%, "StdDev:   " & Formatx(StatStDev#, MultWidthPrecision%) + "
" + Distance(Units%)

'Print All Mults
    'Query.Data1.Recordset.MoveFirst
    'Do While Query.Data1.Recordset.EOF = False
    '    ThisVariance# = Query.Data1.Recordset("Difference")
    '    ThisVariance# = Roundx(ThisVariance#, .001, 3)
    '    For i% = 0 To (Graph1.NumPoints - 1)
    '        If ThisVariance# >= Class(i%).Lower# And ThisVariance# <= Class(i%)
.Upper# Then
    '            Class(i%).Frequency% = Class(i%).Frequency% + 1
    '            Exit For
    '        End If
    '    Next i%
    '    Query.Data1.Recordset.MoveNext
    'Loop Close #FileNum%
    'Launch NOTEPAD - maximized
    X = Shell("NOTEPAD.EXE " + FileName$, 3)

End Sub

Sub Table1_RowChange ()
```

QUERY.FRM - 10

```
    'Data1.Caption = "Mult: " + Str(Data1.Recordset("ID"))
End Sub

Sub Text1_GotFocus (Index As Integer)
    'Highlight all text
    Text1(Index).SelStart = 0
    Text1(Index).SelLength = Len(Text1(Index).Text)

End Sub

Sub Text1_LostFocus (Index As Integer)

If Text1(Index).Text = "*" Then
        Exit Sub
    End If

If Len(Text1(Index).Text) = 0 Then
        Beep
        Text1(Index).SetFocus
        Text1(Index).SelStart = 0
        Text1(Index).SelLength = Len(Text1(Index).Text)
        MsgBox "Date can not be left blank !", MB_ICONSTOP, ProgramName$
        Exit Sub
    End If 'Verify that the entered data is numeric
    If Not IsDate(Text1(Index).Text) Then
        Beep
        Text1(Index).SetFocus
        Text1(Index).SelStart = 0
        Text1(Index).SelLength = Len(Text1(Index).Text)
        MsgBox "Entered data is not a date !", MB_ICONSTOP, ProgramName$
        Exit Sub
    End If 'Set variable to VB object
    dDate$ = Text1(Index).Text If Index% = 0 Then
        LowerDate$ = dDate$
    Else
        UpperDate$ = dDate$
    End If End Sub Sub Text2_DblClick (Index As Integer)

'Display popup menu with ranges of values
    PopupMenuCode% = C_MATERIAL_THICKNESS
    Call DisplayPopupMenu End Sub Sub Text2_GotFocus (Index As Integer)
    'Highlight all text
    Text2(Index).SelStart = 0
    Text2(Index).SelLength = Len(Text2(Index).Text)

End Sub
```

QUERY.FRM - 11

```vb
Sub Text2_LostFocus (Index As Integer)

If Text2(Index).Text = "*" Then
        Exit Sub
    End If

If Len(Text2(Index).Text) = 0 Then
        Beep
        Text2(Index).SetFocus
        Text2(Index).SelStart = 0
        Text2(Index).SelLength = Len(Text2(Index).Text)
        MsgBox "Material thickness can not be left blank !", MB_ICONSTOP, ProgramName$
        Exit Sub
    End If 'Verify that the entered data is numeric
    If Not IsNumeric(Text2(Index).Text) Then
        Beep
        Text2(Index).SetFocus
        Text2(Index).SelStart = 0
        Text2(Index).SelLength = Len(Text2(Index).Text)
        MsgBox "Entered data is not numeric !", MB_ICONSTOP, ProgramName$
        Exit Sub
    End If 'Round the entered number and format to correct number of decimal places
    Text2(Index).Text = Roundx(Val(Text2(Index).Text), .001, 3)

'Verify the entered number is within the acceptable range
    If Text2(Index).Text > MaxMatThickness# Then
        Beep
        Text2(Index).SetFocus
        Text2(Index).SelStart = 0
        Text2(Index).SelLength = Len(Text2(Index).Text)
        MsgBox "Material Thickness can not be greater than " + Str(MaxMatThickness#) + " " + Distance(Units%) + " !", MB_ICONSTOP, ProgramName$
        Exit Sub
    ElseIf Text2(Index).Text < MinMatThickness# Then
        Beep
        Text2(Index).SetFocus
        Text2(Index).SelStart = 0
        Text2(Index).SelLength = Len(Text2(Index).Text)
        MsgBox "Material Thickness can not be less than " + Str(MinMatThickness#) + " " + Distance(Units%) + " !", MB_ICONSTOP, ProgramName$
        Exit Sub
    End If 'Set variable to VB object
    MaterialThickness# = Text2(Index).Text 'If Len(Text3(Index).Text) > 0 Then
    '    'Calculate Horizontal Clearance
    '    Call CalcHC
    'End If
    If Index% = 0 Then
        LowerMaterialThickness# = MaterialThickness#
    Else
        UpperMaterialThickness# = MaterialThickness#
    End If
```

QUERY.FRM - 12

```
End Sub

Sub Text3_DblClick (Index As Integer)

'Display popup menu with ranges of values
    PopupMenuCode% = C_TENSILE
    Call DisplayPopupMenu End Sub Sub Text3_GotFocus (Index As Integer)
    'Highlight all text
    Text3(Index).SelStart = 0
    Text3(Index).SelLength = Len(Text3(Index).Text)

End Sub

Sub Text3_LostFocus (Index As Integer)

If Text3(Index).Text = "*" Then
        Exit Sub
    End If

If Len(Text3(Index).Text) = 0 Then
        Beep
        Text3(Index).SetFocus
        Text3(Index).SelStart = 0
        Text3(Index).SelLength = Len(Text3(Index).Text)
        MsgBox "Tensile can not be left blank !", MB_ICONSTOP, ProgramName$
        Exit Sub
    End If 'Verify that the entered data is numeric
    If Not IsNumeric(Text3(Index).Text) Then
        Beep
        Text3(Index).SetFocus
        Text3(Index).SelStart = 0
        Text3(Index).SelLength = Len(Text3(Index).Text)
        MsgBox "Entered data is not numeric !", MB_ICONSTOP, ProgramName$
        Exit Sub
    End If 'Round the entered number and format to correct number of decimal places
    Text3(Index).Text = Roundx(Val(Text3(Index).Text), 1, 0)

'Check the validity of the entered number
    If Text3(Index).Text > MaxTensile# Then
        Beep
        Text3(Index).SetFocus
        Text3(Index).SelStart = 0
        Text3(Index).SelLength = Len(Text3(Index).Text)
        MsgBox "Tensile can not be greater than" + Str(MaxTensile#) + "K-PSI" +
" !", MB_ICONSTOP, ProgramName$
        Exit Sub
    ElseIf Text3(Index).Text < MinTensile# Then
        Beep
        Text3(Index).SetFocus
        Text3(Index).SelStart = 0
        Text3(Index).SelLength = Len(Text3(Index).Text)
        MsgBox "Tensile can not be less than" + Str(MinTensile#) + "K-PSI" + " !
```

QUERY.FRM - 13

```
", MB_ICONSTOP, ProgramName$   ProgramName$
        Exit Sub
    End If

'Set variable to VB object
    Tensile# = Text3(Index).Text

'If Len(Text2(Index).Text) > 0 Then
    '    'Calculate Horizontal Clearance
    '    Call CalcHC
    'End If If Index% = 0 Then
        LowerTensile# = Tensile#
    Else
        UpperTensile# = Tensile#
    End If End Sub Sub Text4_DblClick (Index As Integer)

'Display popup menu with ranges of values
    PopupMenuCode% = C_HC
    Call DisplayPopupMenu End Sub Sub Text4_GotFocus (Index As Integer)
    'Highlight all text
    Text4(Index).SelStart = 0
    Text4(Index).SelLength = Len(Text4(Index).Text)

End Sub

Sub Text4_LostFocus (Index As Integer)
    'Verify that HC is not blank

If Text4(Index).Text = "*" Then
        Exit Sub
    End If

If Len(Text4(Index).Text) = 0 Then
        Beep
        Text4(Index).SetFocus
        Text4(Index).SelStart = 0
        Text4(Index).SelLength = Len(Text4(Index).Text)
        MsgBox "HC can not be left blank !", MB_ICONSTOP, ProgramName$
        Exit Sub
    End If 'Verify that the entered data is numeric
    If Not IsNumeric(Text4(Index).Text) Then
        Beep
        Text4(Index).SetFocus
        Text4(Index).SelStart = 0
        Text4(Index).SelLength = Len(Text4(Index).Text)
        MsgBox "Entered data is not numeric !", MB_ICONSTOP, ProgramName$
        Exit Sub
    End If
```

QUERY.FRM - 14

```
    'Format the entered number to correct number of decimal places
    Text4(Index).Text = Roundx(Val(Text4(Index).Text), HorzClearInc#, Precision%)

'Check the validity of the entered number
    If Val(Text4(Index).Text) > MaxHC# Then
        Beep
        Text4(Index).SetFocus
        Text4(Index).SelStart = 0
        Text4(Index).SelLength = Len(Text4(Index).Text)
        MsgBox "Horizontal Clearance can not be greater than" + Str(MaxHC#) + Di
stance(Units%) + " !", MB_ICONSTOP, ProgramName$
        Exit Sub
    ElseIf Val(Text4(Index).Text) < MinHC# Then
        Beep
        Text4(Index).SetFocus
        Text4(Index).SelStart = 0
        Text4(Index).SelLength = Len(Text4(Index).Text)
        MsgBox "Horizontal Clearance can not be less than" + Str(MinHC#) + Dista
nce(Units%) + " !", MB_ICONSTOP, ProgramName$
        Exit Sub
    End If 'If Val(Text4(Index).Text) <> HC# And Len(Text2(Index).Text) > 0 And Len(Tex
t3(Index).Text) > 0 Then
    '    Beep
    '    Label13.Visible = True
    'Else
    '    Label13.Visible = False
    'End If 'Set variable to VB object
    HC# = Formatx(Val(Text4(Index).Text), Precision%)

If Index% = 0 Then
        LowerHC# = HC#
    Else
        UpperHC# = HC#
    End If End Sub Sub Text5_DblClick (Index As Integer)

'Display popup menu with ranges of values
    PopupMenuCode% = C_WIDTH_ORDERED
    Call DisplayPopupMenu End Sub Sub Text5_GotFocus (Index As Integer)
    'Highlight all text
    Text5(Index).SelStart = 0
    Text5(Index).SelLength = Len(Text5(Index).Text)

End Sub

Sub Text5_LostFocus (Index As Integer)
Dim WidthOrdered#

If Text5(Index).Text = "*" Then
```

```
QUERY.FRM - 15
        Exit Sub
    End If

'Verify that data has been entered
    If Len(Text5(Index).Text) = 0 Then
        Beep
        Text5(Index).SetFocus
        Text5(Index).SelStart = 0
        Text5(Index).SelLength = Len(Text5(Index).Text)
        MsgBox "Width Ordered can not be left blank!", MB_ICONSTOP, ProgramName$
        Exit Sub
    End If 'Verify that the entered data is numeric
    If Not IsNumeric(Text5(Index).Text) Then
        Beep
        Text5(Index).SetFocus
        Text5(Index).SelStart = 0
        Text5(Index).SelLength = Len(Text5(Index).Text)
        MsgBox "Entered data is not numeric !", MB_ICONSTOP, ProgramName$
        Exit Sub
    End If 'Format width ordered to correct number of decimal places
    WidthOrdered# = Formatx(Val(Text5(Index)), MultWidthPrecision%)
    Text5(Index).Text = Formatx(WidthOrdered#, MultWidthPrecision%)

If Index% = 0 Then
        LowerWidthOrdered# = WidthOrdered#
    Else
        UpperWidthOrdered# = WidthOrdered#
    End If End Sub Sub Text6_DblClick (Index As Integer)

'Display popup menu with ranges of values
    PopupMenuCode% = C_PERCENT_HC
    Call DisplayPopupMenu End Sub Sub Text6_GotFocus (Index As Integer)
    'Highlight all text
    Text6(Index).SelStart = 0
    Text6(Index).SelLength = Len(Text6(Index).Text)

End Sub

Sub Text6_LostFocus (Index As Integer)
    'Verify that %Clearance is not blank

If Text6(Index).Text = "*" Then
        Exit Sub
    End If

If Len(Text6(Index).Text) = 0 Then
```

```
QUERY.FRM - 16
        Beep
        Text6(Index).SetFocus
        Text6(Index).SelStart = 0
        Text6(Index).SelLength = Len(Text6(Index).Text)
        MsgBox "%Clearance can not be left blank !", MB_ICONSTOP, ProgramName$
        Exit Sub
    End If 'Verify that the entered data is numeric
    If Not IsNumeric(Text6(Index).Text) Then
        Beep
        Text6(Index).SetFocus
        Text6(Index).SelStart = 0
        Text6(Index).SelLength = Len(Text6(Index).Text)
        MsgBox "Entered data is not numeric !", MB_ICONSTOP, ProgramName$
        Exit Sub
    End If 'Format the entered number to correct number of decimal places
    Text6(Index).Text = Roundx(Val(Text6(Index).Text), HorzClearInc#, Precision%)

'Check the validity of the entered number
    If Val(Text6(Index).Text) > MaxPercentHC# Then
        Beep
        Text6(Index).SetFocus
        Text6(Index).SelStart = 0
        Text6(Index).SelLength = Len(Text6(Index).Text)
        MsgBox "%Clearance can not be greater than" + Str(MaxPercentHC#) + " !", MB_ICONSTOP, ProgramName$
        Exit Sub
    ElseIf Val(Text6(Index).Text) < MinPercentHC# Then
        Beep
        Text6(Index).SetFocus
        Text6(Index).SelStart = 0
        Text6(Index).SelLength = Len(Text6(Index).Text)
        MsgBox "%Clearance can not be less than" + Str(MinPercentHC#) + " !", MB_ICONSTOP, ProgramName$
        Exit Sub
    End If 'Set variable to VB object
    PercentHC# = Formatx(Val(Text6(Index).Text), Precision%)

If Index% = 0 Then
        LowerPercentHC# = PercentHC#
    Else
        UpperPercentHC# = PercentHC#
    End If End Sub
```

| Date | Material Thickness, | Tensile, | HC |
|---|---|---|---|
| Text1 | Text2 | Text3 | T. |

| Date | Material Thickness. | Tensile, | HC. | Percent Clearance | Width Ordered, | Width Actual, |
|---|---|---|---|---|---|---|
| Table1 | | | | | | |
| | | | | | | |
| | | | | | | |
| | | | | | | |
| | | | | | | |
| | | | | | | |
| | | | | | | |
| | | | | | | |
| | | | | | | |
| | | | | | | |
| | | | | | | |
| | | | | | | |

OK  Cancel  Insert  Delete

RECORD.FRM - 1

```
VERSION 2.00
Begin Form Record
    BackColor       =   &H00C0C0C0&
    Caption         =   "Record.Caption"
    ClientHeight    =   5850
    ClientLeft      =   405
    ClientTop       =   870
    ClientWidth     =   8475
    Height          =   6255
    HelpContextID   =   3000
    Left            =   345
    LinkTopic       =   "Form1"
    ScaleHeight     =   5850
    ScaleWidth      =   8475
    Top             =   525
    Width           =   8595
    Begin TrueGrid Table1
        AllowArrows     =   -1  'True
        AllowTabs       =   -1  'True
        BackColor       =   &H00FFFFFF&
        DataSource      =   "Data1"
        Editable        =   -1  'True
        EditDropDown    =   -1  'True
        ExposeCellMode  =   0   'Expose upon selection
        FetchMode       =   0   'By cell
        HeadingHeight   =   3
        Height          =   3855
        HorzLines       =   1   'Single LayoutIndex     =   1
        Left            =   0
        LinesPerRow     =   1
        MarqueeUnique   =   -1  'True
        SplitPropsGlobal=   -1  'True
        SplitTabMode    =   0   'Don't tab across splits
        TabCapture      =   0   'False
        TabIndex        =   4
        Top             =   840
        UseBookmarks    =   -1  'True
        Width           =   8535
        WrapCellPointer =   0   'False
    End
    Begin Data Data1
        Connect         =   ""
        DatabaseName    =   "C:\SWIM\SWIM.MDB"
        Exclusive       =   0   'False
        Height          =   270
        Left            =   0
        Options         =   0
        ReadOnly        =   0   'False
        RecordSource    =   "RECORD"
        Top             =   4680
        Width           =   1575
    End
    Begin SSCommand Command3D4
        Caption         =   "&Delete"
        Font3D          =   0   'None
        ForeColor       =   &H00000000&
        Height          =   495
        Left            =   7080
        Picture         =   (none)
```

```
RECORD.FRM - 2

TabIndex        =   8
    Top             =   5160
    Width           =   1215
End
Begin SSCommand Command3D3
    Caption         =   "&Insert"
    Font3D          =   0  'None
    ForeColor       =   &H00000000&
    Height          =   495
    Left            =   5760
    Picture         =   (none)
    TabIndex        =   7
    Top             =   5160
    Width           =   1215
End
Begin TextBox Text4
    Alignment       =   2  'Center
    Height          =   375
    Left            =   6450
    MultiLine       =   -1  'True
    TabIndex        =   3
    Text            =   "Text4"
    Top             =   240
    Width           =   2150
End
Begin TextBox Text3
    Alignment       =   2  'Center
    Height          =   375
    Left            =   4300
    MultiLine       =   -1  'True
    TabIndex        =   2
    Text            =   "Text3"
    Top             =   240
    Width           =   2150
End
Begin TextBox Text2
    Alignment       =   2  'Center
    Height          =   375
    Left            =   2150
    MultiLine       =   -1  'True
    TabIndex        =   1
    Text            =   "Text2"
    Top             =   240
    Width           =   2150
End
Begin TextBox Text1
    Alignment       =   2  'Center
    Height          =   375
    Left            =   0
    MultiLine       =   -1  'True
    TabIndex        =   0
    Text            =   "Text1"
    Top             =   240
    Width           =   2150
End
Begin SSCommand Command3D2
    Caption         =   "&Cancel"
    Font3D          =   0  'None
    ForeColor       =   &H00000000&
    Height          =   495
    Left            =   1560
```

```
RECORD.FRM - 3
        Picture         =   (none)
        TabIndex        =   6
        Top             =   5160
        Width           =   1215
    End
    Begin SSCommand Command3D1
        Caption         =   "&OK"
        Font3D          =   0  'None
        ForeColor       =   &H00000000&
        Height          =   495
        Left            =   240
        Picture         =   (none)
        TabIndex        =   5
        Top             =   5160
        Width           =   1215
    End
    Begin Label Label5
        Alignment       =   2  'Center
        BackStyle       =   0  'Transparent
        ForeColor       =   &H00000000&
        Height          =   255
        Left            =   1680
        TabIndex        =   13
        Top             =   4920
        Width           =   5775
    End
    Begin Label Label4
        Alignment       =   2  'Center
        BackColor       =   &H00FF0000&
        BorderStyle     =   1  'Fixed Single
        Caption         =   "HC, "
        ForeColor       =   &H00FFFFFF&
        Height          =   255
        Left            =   6450
        TabIndex        =   12
        Top             =   0
        Width           =   2150
    End
    Begin Label Label3
        Alignment       =   2  'Center
        BackColor       =   &H00FF0000&
        BorderStyle     =   1  'Fixed Single
        Caption         =   "Tensile, "
        ForeColor       =   &H00FFFFFF&
        Height          =   255
        Left            =   4300
        TabIndex        =   11
        Top             =   0
        Width           =   2150
    End
    Begin Label Label2
        Alignment       =   2  'Center
        BackColor       =   &H00FF0000&
        BorderStyle     =   1  'Fixed Single
        Caption         =   "Material Thickness, "
        ForeColor       =   &H00FFFFFF&
        Height          =   255
        Left            =   2150
        TabIndex        =   10
        Top             =   0
        Width           =   2150
```

```
RECORD.FRM - 4

End
   Begin Label Label1
      Alignment    =   2  'Center
      BackColor    =   &H00FF0000&
      BorderStyle  =   1  'Fixed Single
      Caption      =   "Date"
      ForeColor    =   &H00FFFFFF&
      Height       =   255
      Left         =   0
      TabIndex     =   9
      Top          =   0
      Width        =   2150
   End
End
```

RECORD.FRM - 1

```
Option Explicit

Sub Command3D1_Click ()
Dim DbVar As Database
Dim TableVar As Table

'Set the mouse pointer
    Record.MousePointer = Hourglass

'Open machine table
    Set DbVar = OpenDatabase(StartupPath$ + "\SWIM.MDB")
    Set TableVar = DbVar.OpenTable(Machine(CurrentMachine%).TableName$)

'Add all records in Record table to machine table
    If Data1.Recordset.EOF = False And Data1.Recordset.BOF = False Then
        Data1.Recordset.MoveFirst
        Do While Data1.Recordset.EOF = False
            TableVar.AddNew
            TableVar("Date") = Data1.Recordset("Date")
            TableVar("MaterialThickness") = Data1.Recordset("MaterialThickness")
            TableVar("Tensile") = Data1.Recordset("Tensile")
            TableVar("HC") = Data1.Recordset("HC")
            TableVar("PercentHC") = Data1.Recordset("PercentHC")
            TableVar("WidthOrdered") = Data1.Recordset("WidthOrdered")
            TableVar("WidthActual") = Data1.Recordset("WidthActual")
            TableVar("Difference") = TableVar("WidthOrdered") - TableVar("WidthActual")
            TableVar.Update
            Data1.Recordset.MoveNext
        Loop 'Delete all records in the Record table
        Data1.Database.Execute "DELETE * From Record"
    Else
        Beep
        MsgBox "No mults were recorded !", MB_ICONINFORMATION, ProgramName$
    End If 'Close the table and database
    TableVar.Close
    DbVar.Close 'Set the mouse pointer
    Record.MousePointer = Arrow 'Unload the form
    Unload Record End Sub Sub Command3D2_Click ()

'Delete all records in the Record table
    Data1.Database.Execute "DELETE * From Record"

'Unload the form
    Unload Record

End Sub
```

RECORD.FRM - 2

```
Sub Command3D3_Click ()

'Add a new user to the database
    Data1.Recordset.AddNew
    Data1.Recordset("Date") = dDate$
    Data1.Recordset("MaterialThickness") = MaterialThickness#
    Data1.Recordset("Tensile") = Tensile#
    Data1.Recordset("HC") = HC#
    Data1.Recordset("WidthOrdered") = 0
    Data1.Recordset("WidthActual") = 0
    Data1.Recordset.Update
    Data1.Recordset.MoveLast
    Table1.ColumnIndex = 5
    Table1.SetFocus End Sub Sub Command3D4_Click ()

' Delete the current record from the table
    Data1.Recordset.Delete
    If Data1.Recordset.EOF = False Then
        Data1.Recordset.MoveNext
    End If
    Table1.SetFocus End Sub Sub Form_Load ()
    Dim i%, j%, k%, TempMults$, TotalCoils%

'Center the form on the screen
    CenterForm Record

'Set form caption
    Record.Caption = "Record Data " + Machine(CurrentMachine%).Description$ 'Add units to column titles
    Label2.Caption = Label2.Caption + Distance(Units%)
    Label3.Caption = Label3.Caption + Pressure(Units%)
    Label4.Caption = Label4.Caption + Distance(Units%)
    Table1.ColumnName(2) = Table1.ColumnName(2) + Distance(Units%)
    Table1.ColumnName(3) = Table1.ColumnName(3) + Pressure(Units%)
    Table1.ColumnName(4) = Table1.ColumnName(4) + Distance(Units%)
    Table1.ColumnName(6) = Table1.ColumnName(6) + Distance(Units%)
    Table1.ColumnName(7) = Table1.ColumnName(7) + Distance(Units%)
    'Set datasource
    Data1.DatabaseName = StartupPath$ + "\SWIM.MDB"
    Data1.RecordSource = "RECORD"
    Data1.Refresh 'Add records for each mult
    If CassSetup% = True Then
        'Initialize data at top of window
        Text1.Text = dDate$
        Text2.Text = MaterialThickness#
        Text3.Text = Tensile#
        Text4.Text = HC#

'Find out how many master coils were run
        Do
```

RECORD.FRM - 3

```
            TotalCoils% = Val(InputBox("Enter the total number of coils run", Pr
ogramName$, "1"))
        Loop Until TotalCoils% >= 1 And TotalCoils% <= 20

For k% = 1 To TotalCoils%
            For i% = 0 To (NumberDifferentMults% - 1)
                For j% = 1 To Entry(i%).NumberMults%
                    Data1.Recordset.AddNew
                    Data1.Recordset("Date") = dDate$
                    Data1.Recordset("MaterialThickness") = MaterialThickness#
                    Data1.Recordset("Tensile") = Tensile#
                    Data1.Recordset("HC") = HC#
                    Data1.Recordset("PercentHC") = HC# / MaterialThickness#
                    Data1.Recordset("WidthOrdered") = Entry(i%).Female#
                    Data1.Recordset("WidthActual") = 0
                    Data1.Recordset.Update
                Next j%
            Next i%
        Next k%
        Table1.ColumnIndex = 7
    Else
        'Initialize data at top of window
        Text1.Text = dDate$
        Text2.Text = ""
        Text3.Text = ""
        Text4.Text = ""

'Find out how many mults
        Do
            TotalNumberMults% = Val(InputBox("Enter the total number of mults",
ProgramName$, "1"))
        Loop Until TotalNumberMults% >= 1 And TotalNumberMults% <= MaxNumberMult
s%

'Add a record for each mult
        For i% = 0 To (TotalNumberMults% - 1)
            Data1.Recordset.AddNew
            Data1.Recordset("Date") = dDate$
            Data1.Recordset("MaterialThickness") = 0
            Data1.Recordset("Tensile") = 0
            Data1.Recordset("HC") = 0
            Data1.Recordset("WidthOrdered") = 0
            Data1.Recordset("WidthActual") = 0
            Data1.Recordset.Update
        Next i%
        Table1.ColumnIndex = 6
    End If End Sub Sub Text1_GotFocus ()

'Highlight all text
    Text1.SelStart = 0
    Text1.SelLength = Len(Text1.Text)

'Save current value
    OlddDate$ = dDate$

End Sub
```

RECORD.FRM - 4

```vb
Sub Text1_LostFocus ()

'Verify that Date was not left empty
    If Len(Text1.Text) = 0 Then
        Beep
        Text1.SetFocus
        Text1.SelStart = 0
        Text1.SelLength = Len(Text1.Text)
        MsgBox "Date can not be left blank !", MB_ICONSTOP, ProgramName$
        Exit Sub
    End If 'Verify that the entered data is numeric
    If Not IsDate(Text1.Text) Then
        Beep
        Text1.SetFocus
        Text1.SelStart = 0
        Text1.SelLength = Len(Text1.Text)
        MsgBox "Entered data is not a date !", MB_ICONSTOP, ProgramName$
        Exit Sub
    End If 'Set variable to VB object
    dDate$ = Text1.Text If OlddDate$ <> dDate$ Then
        'Replace all records in Record table
        Record.MousePointer = Hourglass
        Label5.Caption = "Replacing date.  Please wait..."
        Data1.Database.Execute "Update RECORD set [Date] = #" & dDate$ & "#"
        Record.MousePointer = Hourglass
        Data1.Refresh
        Label5.Caption = ""
        Record.MousePointer = Arrow
'       Record.MousePointer = Hourglass
'       Label5.Caption = "Replacing date.  Please wait..."
'       Data1.Recordset.MoveFirst
'       Do While Data1.Recordset.EOF = False
'           Data1.Recordset.Edit
'           Data1.Recordset("Date") = dDate$
'           Data1.Recordset.Update
'           Data1.Recordset.MoveNext
'       Loop
'       Record.MousePointer = Arrow
'       Label5.Caption = ""
    End If End Sub Sub Text2_GotFocus ()

'Highlight all text
    Text2.SelStart = 0
    Text2.SelLength = Len(Text2.Text)

'Save current value
    OldMaterialThickness# = MaterialThickness#

End Sub

Sub Text2_LostFocus ()
```

RECORD.FRM - 5

```
    'Verify Material Thickness was not left blank
    If Len(Text2.Text) = 0 Then
        Beep
        Text2.SetFocus
        Text2.SelStart = 0
        Text2.SelLength = Len(Text2.Text)
        MsgBox "Material Thickness can not be left blank !", MB_ICONSTOP, Progra
mName$
        Exit Sub
    End If 'Verify that the entered data is numeric
    If Not IsNumeric(Text2.Text) Then
        Beep
        Text2.SetFocus
        Text2.SelStart = 0
        Text2.SelLength = Len(Text2.Text)
        MsgBox "Entered data is not numeric !", MB_ICONSTOP, ProgramName$
        Exit Sub
    End If 'Round the entered number and format to correct number of decimal places
    Text2.Text = Roundx(Val(Text2.Text), .001, 3)

'Verify the entered number is within the acceptable range
    If Text2.Text > MaxMatThickness# Then
        Beep
        Text2.SetFocus
        Text2.SelStart = 0
        Text2.SelLength = Len(Text2.Text)
        MsgBox "Material Thickness can not be greater than " + Str(MaxMatThickne
ss#) + " " + Distance(Units%) + " !", MB_ICONSTOP, ProgramName$
        Exit Sub
    ElseIf Text2.Text < MinMatThickness# Then
        Beep
        Text2.SetFocus
        Text2.SelStart = 0
        Text2.SelLength = Len(Text2.Text)
        MsgBox "Material Thickness can not be less than " + Str(MinMatThickness#
) + " " + Distance(Units%) + " !", MB_ICONSTOP, ProgramName$
        Exit Sub
    End If 'Set variable to VB object
    MaterialThickness# = Text2.Text 'If Len(Text3.Text) > 0 Then
    '    'Calculate Horizontal Clearance
    '    Call CalcHC
    'End If If OldMaterialThickness# <> MaterialThickness# Then
        'Replace all records in Record table
        Record.MousePointer = Hourglass
        Label5.Caption = "Replacing material thickness.  Please wait..."
        Data1.Database.Execute "Update RECORD set [MaterialThickness] = " & Mate
rialThickness#
        Record.MousePointer = Hourglass
        Data1.Refresh
```

RECORD.FRM - 6

```
        If HC# > 0 Then
            Data1.Database.Execute "Update RECORD set [PercentHC] = " & (HC# / M
aterialThickness#)
            Record.MousePointer = Hourglass
            Data1.Refresh
        End If
        Label5.Caption = ""
        Record.MousePointer = Arrow
    End If End Sub Sub Text3_GotFocus ()

'Highlight all text
    Text3.SelStart = 0
    Text3.SelLength = Len(Text3.Text)

'Save current value
    OldTensile# = Tensile#

End Sub

Sub Text3_LostFocus ()

'Verify that Tensile was not left blank
    If Len(Text3.Text) = 0 Then
        Beep
        Text3.SetFocus
        Text3.SelStart = 0
        Text3.SelLength = Len(Text3.Text)
        MsgBox "Tensile can not be left blank !", MB_ICONSTOP, ProgramName$
        Exit Sub
    End If 'Verify that the entered data is numeric
    If Not IsNumeric(Text3.Text) Then
        Beep
        Text3.SetFocus
        Text3.SelStart = 0
        Text3.SelLength = Len(Text3.Text)
        MsgBox "Entered data is not numeric !", MB_ICONSTOP, ProgramName$
        Exit Sub
    End If 'Round the entered number and format to correct number of decimal places
    Text3.Text = Roundx(Val(Text3.Text), 1, 0)

'Check the validity of the entered number
    If Text3.Text > MaxTensile# Then
        Beep
        Text3.SetFocus
        Text3.SelStart = 0
        Text3.SelLength = Len(Text3.Text)
        MsgBox "Tensile can not be greater than" + Str(MaxTensile#) + "K-PSI" +
 " !", MB_ICONSTOP, ProgramName$
        Exit Sub
    ElseIf Text3.Text < MinTensile# Then
        Beep
        Text3.SetFocus
        Text3.SelStart = 0
```

RECORD.FRM - 7

```
        Text3.SelLength = Len(Text3.Text)
        MsgBox "Tensile can not be less than" + Str(MinTensile#) + "K-PSI" + " ! ", MB_ICONSTOP, ProgramName$
        Exit Sub
    End If 'Set variable to VB object
    Tensile# = Text3.Text 'If Len(Text3.Text) > 0 Then
    '    'Calculate Horizontal Clearance
    '    Call CalcHC
    'End If If OldTensile# <> Tensile# Then
        'Replace all records in Record table
        Record.MousePointer = Hourglass
        Label5.Caption = "Replacing Tensile.  Please wait..."
        Data1.Database.Execute "Update RECORD set [Tensile] = " & Tensile#
        Record.MousePointer = Hourglass
        Data1.Refresh
        Label5.Caption = ""
        Record.MousePointer = Arrow 'Record.MousePointer = Hourglass
        'Label5.Caption = "Replacing tensile.  Please wait..."
        'Data1.Recordset.MoveFirst
        'Do While Data1.Recordset.EOF = False
        '    Data1.Recordset.Edit
        '    Data1.Recordset("Tensile") = Tensile#
        '    Data1.Recordset.Update
        '    Data1.Recordset.MoveNext
        'Loop
        'Record.MousePointer = Arrow
        'Label5.Caption = ""
    End If End Sub Sub Text4_GotFocus ()

'Highlight all text
    Text4.SelStart = 0
    Text4.SelLength = Len(Text4.Text)

'Save current value
    OldHC# = HC#

End Sub

Sub Text4_LostFocus ()

'Verify that HC was not left blank
    If Len(Text4.Text) = 0 Then
        Beep
        Text4.SetFocus
        Text4.SelStart = 0
        Text4.SelLength = Len(Text4.Text)
        MsgBox "HC can not be left blank !", MB_ICONSTOP, ProgramName$
        Exit Sub
    End If
```

RECORD.FRM - 8

```
    'Verify that the entered data is numeric
    If Not IsNumeric(Text4.Text) Then
        Beep
        Text4.SetFocus
        Text4.SelStart = 0
        Text4.SelLength = Len(Text4.Text)
        MsgBox "Entered data is not numeric !", MB_ICONSTOP, ProgramName$
        Exit Sub
    End If 'Format the entered number to correct number of decimal places
    Text4.Text = Roundx(Val(Text4.Text), HorzClearInc#, Precision%)

'Check the validity of the entered number
    If Val(Text4.Text) > MaxHC# Then
        Beep
        Text4.SetFocus
        Text4.SelStart = 0
        Text4.SelLength = Len(Text4.Text)
        MsgBox "Horizontal Clearance can not be greater than" + Str(MaxHC#) + Di
stance(Units%) + " !", MB_ICONSTOP, ProgramName$
        Exit Sub
    ElseIf Val(Text4.Text) < MinHC# Then
        Beep
        Text4.SetFocus
        Text4.SelStart = 0
        Text4.SelLength = Len(Text4.Text)
        MsgBox "Horizontal Clearance can not be less than" + Str(MinHC#) + Dista
nce(Units%) + " !", MB_ICONSTOP, ProgramName$
        Exit Sub
    End If 'If Val(Text4.Text) <> HC# And Len(Text4.Text) > 0 And Len(Text3.Text) > 0 T
hen
    '    Beep
    '    Label13.Visible = True
    'Else
    '    Label13.Visible = False
    'End If 'Set variable to VB object
    HC# = Formatx(Val(Text4.Text), Precision%)

If OldHC# <> HC# Then
        'Replace all records in Record table
        Record.MousePointer = Hourglass
        Label5.Caption = "Replacing HC.  Please wait..."
        Data1.Database.Execute "Update RECORD set [HC] = " & HC#
        Record.MousePointer = Hourglass
        Data1.Refresh If MaterialThickness# > 0 Then
            Data1.Database.Execute "Update RECORD set [PercentHC] = " & (HC# / M
aterialThickness#)
            Record.MousePointer = Hourglass
            Data1.Refresh
        End If
        Label5.Caption = ""
        Record.MousePointer = Arrow
```

RECORD.FRM - 9

End If

End Sub

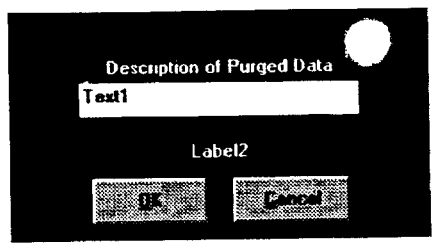

SAVEFILE.FRM - 1

```
VERSION 2.00
Begin Form SaveFile
    BackColor       =   &H00FF0000&
    Caption         =   "SaveFile.Caption"
    ClientHeight    =   2325
    ClientLeft      =   2820
    ClientTop       =   4110
    ClientWidth     =   4305
    Height          =   2730
    Left            =   2760
    LinkTopic       =   "Form1"
    ScaleHeight     =   2325
    ScaleWidth      =   4305
    Top             =   3765
    Width           =   4425
    Begin TextBox Text1
        Height      =   375
        Left        =   720
        TabIndex    =   0
        Text        =   "Text1"
        Top         =   720
        Width       =   2880
    End
    Begin SSCommand Command3D2
        Caption     =   "&Cancel"
        Font3D      =   0  'None
        ForeColor   =   &H00000000&
        Height      =   495
        Left        =   2280
        Picture     =   (none)
        TabIndex    =   2
        Top         =   1680
        Width       =   1215
    End
    Begin SSCommand Command3D1
        Caption     =   "&OK"
        Font3D      =   0  'None
        ForeColor   =   &H00000000&
        Height      =   495
        Left        =   840
        Picture     =   (none)
        TabIndex    =   1
        Top         =   1680
        Width       =   1215
    End
    Begin Label Label2
        Alignment   =   2  'Center
        BackStyle   =   0  'Transparent
        Caption     =   "Label2"
        ForeColor   =   &H00FFFFFF&
        Height      =   255
        Left        =   720
        TabIndex    =   4
        Top         =   1320
        Width       =   2895
    End
    Begin Label Label1
        Alignment   =   2  'Center
        BackStyle   =   0  'Transparent
        Caption     =   "Description of Purged Data"
        ForeColor   =   &H00FFFFFF&
```

SAVEFILE.FRM - 2

```
        Height          =   255
        Left            =   840
        TabIndex        =   3
        Top             =   480
        Width           =   2655
    End
End
```

SAVEFILE.FRM - 1

Option Explicit

```
Sub Command3D1_Click ()
    Dim DbVar As Database
    Dim DbCopyTo As Database
    Dim DbCopyFrom As Database
    Dim TableVar As table
    Dim TableCopyTo As table
    Dim NewTd As New TableDef
    Dim Field() As New Field
    Dim i%, FieldCount%
    Dim dsSomeData As Dynaset
    Dim dsCopyFrom As Dynaset
    Dim SQLQ$ 'Set mouse pointer & Caption
    Label2.Caption = "Saving data.  Please wait..."
    Label2.Refresh
    SaveFile.MousePointer = Hourglass
    Label2.Caption = "Saving data.  Please wait..."

'Get field properties from RECORD table
    Set DbVar = OpenDatabase(StartupPath$ + "\SWIM.MDB")
    Set TableVar = DbVar.OpenTable("RECORD")

'Verify that the entered description is not an existing table name
    For i% = 0 To (DbVar.TableDefs.Count - 1)
        If DbVar.TableDefs(i%).Name = Text1.Text Then
            Beep
            Text1.SetFocus
            Text1.SelStart = 0
            Text1.SelLength = Len(Text1.Text)
            MsgBox "This description is already used by another table !", MB_ICONSTOP, ProgramName$
            Exit Sub
        End If
    Next i%

'Copy the structure of the RECORD table
    ReDim Field(TableVar.Fields.Count - 1)
    TableVar.Close
    DbVar.Close Set DbVar = OpenDatabase(StartupPath$ + "\SWIM.MDB")
    Set TableVar = DbVar.OpenTable("RECORD")
    FieldCount% = (TableVar.Fields.Count)
    For i% = 0 To (FieldCount% - 1)
        Field(i%).Name = TableVar.Fields(i%).Name
        Field(i%).Size = TableVar.Fields(i%).Size
        Field(i%).Type = TableVar.Fields(i%).Type
        Field(i%).Attributes = TableVar.Fields(i%).Attributes
    Next i%
    TableVar.Close
    DbVar.Close 'Add the new table to PURGE database
    Set DbVar = OpenDatabase(StartupPath$ + "\PURGE.MDB")
    NewTd.Name = Text1.Text
    For i% = 0 To (FieldCount% - 1)
        NewTd.Fields.Append Field(i%)
```

SAVEFILE.FRM - 2

```
    Next i%
    DbVar.TableDefs.Append NewTd

'COPY appropriate records from MachineX table to the new table in PURGE data
base
    Set DbCopyFrom = OpenDatabase(CurrentDatabasename$)
    SQLQ = "SELECT * FROM " & CurrentTableName$ & " WHERE (Date>=#" & LowerDate$
 & "# AND Date<=#" & UpperDate$ & "#)"
    Set dsCopyFrom = DbCopyFrom.CreateDynaset(SQLQ$)

Set DbCopyTo = OpenDatabase(StartupPath$ + "\PURGE.MDB")
    Set TableCopyTo = DbVar.OpenTable(Text1.Text)

dsCopyFrom.MoveFirst
    Do While dsCopyFrom.EOF <> True
        TableCopyTo.AddNew
        TableCopyTo("Date") = dsCopyFrom("Date")
        TableCopyTo("MaterialThickness") = dsCopyFrom("MaterialThickness")
        TableCopyTo("Tensile") = dsCopyFrom("Tensile")
        TableCopyTo("HC") = dsCopyFrom("HC")
        TableCopyTo("WidthOrdered") = dsCopyFrom("WidthOrdered")
        TableCopyTo("WidthActual") = dsCopyFrom("WidthActual")
        TableCopyTo("Difference") = dsCopyFrom("Difference")
        TableCopyTo.Update
        dsCopyFrom.MoveNext
    Loop dsCopyFrom.Close
    TableCopyTo.Close
    DbCopyTo.Close
    DbCopyFrom.Close 'DbVar.Execute "DELETE * From " & Machine(CurrentMachine%).TableName$ & " WH
ERE (Date>=#" & LowerDate$ & "# AND Date<=#" & UpperDate$ & "#)"

'Set mouse pointer
    SaveFile.MousePointer = Arrow
    Label2.Caption = ""

'Indicate that user exited with OK
    ExitMethod% = C_OK

'Unlaod form
    Unload SaveFile

End Sub

Sub Command3D2_Click ()

'Indicate that user exited with CANCEL
    ExitMethod% = C_CANCEL

'Unload form
    Unload SaveFile

End Sub

Sub Form_Load ()

'Set form background color
    SaveFile.BackColor = BackgroundColor
```

SAVEFILE.FRM - 3

```
    'Center the form on the screen
    CenterForm SaveFile

'Set form caption & message Caption
    SaveFile.Caption = "Save File"
    Label2.Caption = ""

'Initialize Description
    Text1.Text = CurrentTableDescription$ & ": " & LowerDate$ & " - " & UpperDat
e$ End Sub Sub Text1_Change ()

'Enable OK button if something is entered
    If Len(Trim$(Text1.Text)) > 0 Then
        Command3D1.Enabled = True
    Else
        Command3D1.Enabled = False
    End If End Sub Sub Text1_GotFocus ()

'Highlight all text
    Text1.SelStart = 0
    Text1.SelLength = Len(Text1.Text)

End Sub

Sub Text1_LostFocus ()
    Dim DbVar As Database
    Dim i% 'loop counter

'Verify that Description was not left empty
    If Len(Text1.Text) = 0 Then
        Beep
        Text1.SetFocus
        Text1.SelStart = 0
        Text1.SelLength = Len(Text1.Text)
        MsgBox "Description can not be left blank !", MB_ICONSTOP, ProgramName$
        Exit Sub
    End If 'Verify that the entered description is not an existing table name
    Set DbVar = OpenDatabase(StartupPath$ + "\PURGE.MDB")
    For i% = 0 To (DbVar.TableDefs.Count - 1)
        If DbVar.TableDefs(i%).Name = Text1.Text Then
            Beep
            Text1.SetFocus
            Text1.SelStart = 0
            Text1.SelLength = Len(Text1.Text)
            MsgBox "This description is already used by another table !", MB_ICO
NSTOP, ProgramName$
            Exit Sub
        End If
    Next i%
```

SAVEFILE.FRM - 4

```
    'Close database
    DbVar.Close

End Sub
```

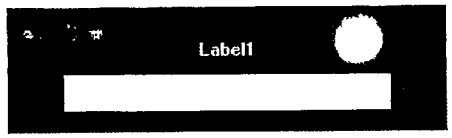

STATUS.FRM - 1

```
VERSION 2.00
Begin Form Status
   BackColor       =   &H00FF0000&
   Caption         =   "Status.Caption"
   ClientHeight    =   1305
   ClientLeft      =   3180
   ClientTop       =   4095
   ClientWidth     =   4545
   Height          =   1710
   Left            =   3120
   LinkTopic       =   "Form1"
   ScaleHeight     =   1305
   ScaleWidth      =   4545
   Top             =   3750
   Width           =   4665
   Begin Gauge Gauge1
      Autosize     =   -1  'True
      ForeColor    =   &H000000FF&
      Height       =   375
      InnerBottom  =   3
      InnerLeft    =   3
      InnerRight   =   3
      InnerTop     =   3
      Left         =   600
      Max          =   100
      NeedleWidth  =   1
      Picture      =   (none)
      TabIndex     =   0
      Top          =   720
      Width        =   3375
   End
   Begin Label Label1
      Alignment    =   2   'Center
      BackStyle    =   0   'Transparent
      Caption      =   "Label1"
      ForeColor    =   &H00FFFFFF&
      Height       =   255
      Left         =   600
      TabIndex     =   1
      Top          =   360
      Width        =   3375
   End
End
```

STATUS.FRM - 1

```
Option Explicit

Sub Form_Load ()

'Set form background color
    Status.BackColor = BackgroundColor

'Center the form on the screen
    BottomRightForm Status

'Set message caption
    Label1.Caption = ""

End Sub

Sub Gauge1_Change ()

'Update caption
    Label1.Caption = Str(Format((Gauge1.Value / Gauge1.Max * 100), "###.0")) & "
% Complete"
    Label1.Refresh End Sub
```

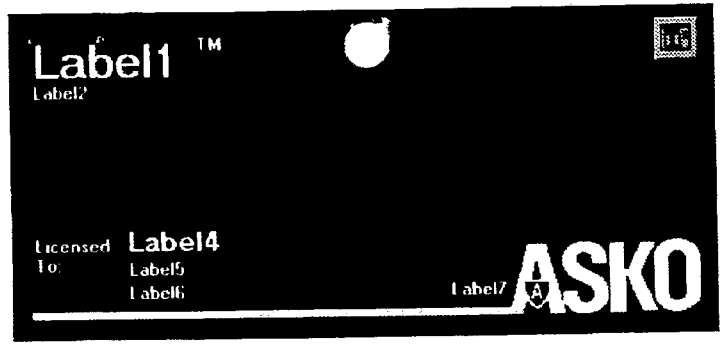

```
SWIM.FRM - 1

VERSION 2.00
Begin Form Swim
    BackColor       =   &H00FF0000&
    Caption         =   "Caption"
    ClientHeight    =   3330
    ClientLeft      =   1560
    ClientTop       =   3195
    ClientWidth     =   7230
    Height          =   4020
    HelpContextID   =   1000
    Left            =   1500
    LinkTopic       =   "Form1"
    ScaleHeight     =   3330
    ScaleWidth      =   7230
    Top             =   2565
    Width           =   7350
    Begin CommonDialog CMDialog1
        Left        =   6600
        Top         =   120
    End
    Begin Label Label8
        BackStyle   =   0  'Transparent
        Caption     =   "TM"
        ForeColor   =   &H00FFFFFF&
        Height      =   255
        Left        =   1920
        TabIndex    =   7
        Top         =   240
        Width       =   495
    End
    Begin Line Line2
        BorderColor =   &H00FFFFFF&
        BorderWidth =   5
        X1          =   240
        X2          =   5160
        Y1          =   3075
        Y2          =   3075
    End
    Begin Image Image1
        Height      =   840
        Left        =   5040
        Picture     =   (Bitmap)
        Top         =   2340
        Width       =   2160
    End
    Begin Label Label7
        Alignment   =   1  'Right Justify
        BackStyle   =   0  'Transparent
        Caption     =   "Label7"
        ForeColor   =   &H00FFFFFF&
        Height      =   255
        Left        =   3360
        TabIndex    =   6
        Top         =   2760
        Width       =   1695
    End
    Begin Label Label6
        BackStyle   =   0  'Transparent
        Caption     =   "Label6"
        ForeColor   =   &H00FFFFFF&
        Height      =   255
```

```
SWIM.FRM - 2
    Left            =   1200
    TabIndex        =   5
    Top             =   2760
    Width           =   2895
End
Begin Label Label5
    BackStyle       =   0  'Transparent
    Caption         =   "Label5"
    ForeColor       =   &H00FFFFFF&
    Height          =   255
    Left            =   1200
    TabIndex        =   4
    Top             =   2520
    Width           =   2895
End
Begin Label Label4
    BackStyle       =   0  'Transparent
    Caption         =   "Label4"
    FontBold        =   -1   'True
    FontItalic      =   0    'False
    FontName        =   "MS Sans Serif"
    FontSize        =   13.5
    FontStrikethru  =   0    'False
    FontUnderline   =   0    'False
    ForeColor       =   &H00FFFFFF&
    Height          =   375
    Left            =   1200
    TabIndex        =   3
    Top             =   2160
    Width           =   2895
End
Begin Label Label3
    BackStyle       =   0  'Transparent
    Caption         =   "Licensed To:"
    ForeColor       =   &H00FFFFFF&
    Height          =   615
    Left            =   240
    TabIndex        =   2
    Top             =   2280
    Width           =   975
End
Begin Label Label2
    BackStyle       =   0  'Transparent
    Caption         =   "Label2"
    ForeColor       =   &H00FFFFFF&
    Height          =   255
    Left            =   240
    TabIndex        =   1
    Top             =   720
    Width           =   5535
End
Begin Label Label1
    AutoSize        =   -1   'True
    BackStyle       =   0    'Transparent
    Caption         =   "Label1"
    FontBold        =   -1   'True
    FontItalic      =   0    'False
    FontName        =   "MS Sans Serif"
    FontSize        =   24
    FontStrikethru  =   0    'False
    FontUnderline   =   0    'False
```

SWIM.FRM - 3

```
    ForeColor       =   &H00FFFFFF&  &H00FFFFFF&
    Height          =   555
    Left            =   240
    TabIndex        =   0
    Top             =   240
    Width           =   1515
End
Begin Line Line1
    BorderColor     =   &H00FF0000&
    BorderWidth     =   12
    X1              =   240
    X2              =   5160
    Y1              =   3090
    Y2              =   3090
End
Begin Menu File_Menu
    Caption         =   "&File"
    HelpContextID   =   2000
    Begin Menu Generate_Menu
        Caption     =   "&Generate Summary"
    End
    Begin Menu View_Menu
        Caption     =   "&View Summary"
        Begin Menu View_Machine_Menu
            Caption =   "Machine0"
            Index   =   0
        End
        Begin Menu View_Machine_Menu
            Caption =   "Machine1"
            Index   =   1
        End
        Begin Menu View_Machine_Menu
            Caption =   "Machine2"
            Index   =   2
        End
        Begin Menu View_Machine_Menu
            Caption =   "Machine3"
            Index   =   3
        End
        Begin Menu View_Machine_Menu
            Caption =   "Machine4"
            Index   =   4
        End
        Begin Menu View_Machine_Menu
            Caption =   "Machine5"
            Index   =   5
        End
        Begin Menu View_Machine_Menu
            Caption =   "Machine6"
            Index   =   6
        End
        Begin Menu View_Machine_Menu
            Caption =   "Machine7"
            Index   =   7
        End
        Begin Menu View_Machine_Menu
            Caption =   "Machine8"
            Index   =   8
        End
        Begin Menu View_Machine_Menu
            Caption =   "Machine9"
```

SWIM.FRM - 4

```
         Index           =   9
      End
   End
   Begin Menu Random_Menu
      Caption          =   "Random"
   End
   Begin Menu File_Sep_Menu0
      Caption          =   "-"
   End
   Begin Menu Purge_Menu
      Caption          =   "&Purge"
      Begin Menu Purge_Machine_Menu
         Caption       =   "Machine0"
         Index         =   0
      End
      Begin Menu Purge_Machine_Menu
         Caption       =   "Machine1"
         Index         =   1
      End
      Begin Menu Purge_Machine_Menu
         Caption       =   "Machine2"
         Index         =   2
      End
      Begin Menu Purge_Machine_Menu
         Caption       =   "Machine3"
         Index         =   3
      End
      Begin Menu Purge_Machine_Menu
         Caption       =   "Machine4"
         Index         =   4
      End
      Begin Menu Purge_Machine_Menu
         Caption       =   "Machine5"
         Index         =   5
      End
      Begin Menu Purge_Machine_Menu
         Caption       =   "Machine6"
         Index         =   6
      End
      Begin Menu Purge_Machine_Menu
         Caption       =   "Machine7"
         Index         =   7
      End
      Begin Menu Purge_Machine_Menu
         Caption       =   "Machine8"
         Index         =   8
      End
      Begin Menu Purge_Machine_Menu
         Caption       =   "Machine9"
         Index         =   9
      End
   End
   Begin Menu Delete_Menu
      Caption          =   "&Delete"
      Begin Menu Delete_Machine_Menu
         Caption       =   "Machine0"
         Index         =   0
      End
      Begin Menu Delete_Machine_Menu
         Caption       =   "Machine1"
         Index         =   1
```

SWIM.FRM - 5

```
        End
        Begin Menu Delete_Machine_Menu
            Caption         =   "Machine2"
            Index           =   2
        End
        Begin Menu Delete_Machine_Menu
            Caption         =   "Machine3"
            Index           =   3
        End
        Begin Menu Delete_Machine_Menu
            Caption         =   "Machine4"
            Index           =   4
        End
        Begin Menu Delete_Machine_Menu
            Caption         =   "Machine5"
            Index           =   5
        End
        Begin Menu Delete_Machine_Menu
            Caption         =   "Machine6"
            Index           =   6
        End
        Begin Menu Delete_Machine_Menu
            Caption         =   "Machine7"
            Index           =   7
        End
        Begin Menu Delete_Machine_Menu
            Caption         =   "Machine8"
            Index           =   8
        End
        Begin Menu Delete_Machine_Menu
            Caption         =   "Machine9"
            Index           =   9
        End
    End
    Begin Menu File_Sep_Menu1
        Caption         =   "-"
    End
    Begin Menu Configuration_Menu
        Caption         =   "&Configuration..."
    End
    Begin Menu File_Sep_Menu2
        Caption         =   "-"
    End
    Begin Menu Password_Menu
        Caption         =   "Change &Password"
    End
    Begin Menu Users_Menu
        Caption         =   "Define &Users..."
    End
    Begin Menu File_Sep_Menu3
        Caption         =   "-"
    End
    Begin Menu Printer_Menu
        Caption         =   "&Printer Setup..."
    End
    Begin Menu File_Sep_Menu4
        Caption         =   "-"
    End
    Begin Menu Exit_menu
        Caption         =   "E&xit"
    End
```

```
SWIM.FRM - 6

End
   Begin Menu Record_Menu
      Caption         =   "&Record"
      HelpContextID   =   3000
      Begin Menu Record_Machine_Menu
         Caption         =   "Machine0"
         Index           =   0
      End
      Begin Menu Record_Machine_Menu
         Caption         =   "Machine1"
         Index           =   1
      End
      Begin Menu Record_Machine_Menu
         Caption         =   "Machine2"
         Index           =   2
      End
      Begin Menu Record_Machine_Menu
         Caption         =   "Machine3"
         Index           =   3
      End
      Begin Menu Record_Machine_Menu
         Caption         =   "Machine4"
         Index           =   4
      End
      Begin Menu Record_Machine_Menu
         Caption         =   "Machine5"
         Index           =   5
      End
      Begin Menu Record_Machine_Menu
         Caption         =   "Machine6"
         Index           =   6
      End
      Begin Menu Record_Machine_Menu
         Caption         =   "Machine7"
         Index           =   7
      End
      Begin Menu Record_Machine_Menu
         Caption         =   "Machine8"
         Index           =   8
      End
      Begin Menu Record_Machine_Menu
         Caption         =   "Machine9"
         Index           =   9
      End
   End
   Begin Menu Browse_Menu
      Caption         =   "&Browse"
      HelpContextID   =   4000
      Begin Menu Browse_Machine_Menu
         Caption         =   "Machine0"
         Index           =   0
      End
      Begin Menu Browse_Machine_Menu
         Caption         =   "Machine1"
         Index           =   1
      End
      Begin Menu Browse_Machine_Menu
         Caption         =   "Machine2"
         Index           =   2
      End
      Begin Menu Browse_Machine_Menu
```

```
SWIM.FRM - 7
            Caption         --  =  "Machine3"
            Index           =   3
        End
        Begin Menu Browse_Machine_Menu
            Caption         =   "Machine4"
            Index           =   4
        End
        Begin Menu Browse_Machine_Menu
            Caption         =   "Machine5"
            Index           =   5
        End
        Begin Menu Browse_Machine_Menu
            Caption         =   "Machine6"
            Index           =   6
        End
        Begin Menu Browse_Machine_Menu
            Caption         =   "Machine7"
            Index           =   7
        End
        Begin Menu Browse_Machine_Menu
            Caption         =   "Machine8"
            Index           =   8
        End
        Begin Menu Browse_Machine_Menu
            Caption         =   "Machine9"
            Index           =   9
        End
        Begin Menu Browse_File_Menu
            Caption         =   "&File..."
        End
    End
    Begin Menu Query_Menu
        Caption             =   "&Query"
        HelpContextID       =   5000
        Begin Menu Query_Machine_Menu
            Caption         =   "Machine0"
            Index           =   0
        End
        Begin Menu Query_Machine_Menu
            Caption         =   "Machine1"
            Index           =   1
        End
        Begin Menu Query_Machine_Menu
            Caption         =   "Machine2"
            Index           =   2
        End
        Begin Menu Query_Machine_Menu
            Caption         =   "Machine3"
            Index           =   3
        End
        Begin Menu Query_Machine_Menu
            Caption         =   "Machine4"
            Index           =   4
        End
        Begin Menu Query_Machine_Menu
            Caption         =   "Machine5"
            Index           =   5
        End
        Begin Menu Query_Machine_Menu
            Caption         =   "Machine6"
            Index           =   6
```

SWIM.FRM - 8

```
      End
      Begin Menu Query_Machine_Menu
         Caption         =   "Machine7"
         Index           =   7
      End
      Begin Menu Query_Machine_Menu
         Caption         =   "Machine8"
         Index           =   8
      End
      Begin Menu Query_Machine_Menu
         Caption         =   "Machine9"
         Index           =   9
      End
      Begin Menu Query_File_Menu
         Caption         =   "&File..."
      End
   End
   Begin Menu Help_Menu
      Caption         =   "&Help"
      Begin Menu Contents_Menu
         Caption         =   "&Contents"
      End
      Begin Menu Search_Menu
         Caption         =   "&Search for Help On..."
      End
      Begin Menu HelponHelp_Menu
         Caption         =   "&How to Use Help"
      End
      Begin Menu HelpSep_Menu
         Caption         =   "-"
      End
      Begin Menu About_Menu
         Caption         =   "&About..."
      End
   End
End
```

SWIM.FRM - 1

```
Option Explicit
Dim X%   'Used for Help API call

Sub GenerateSummaryTable ()
    Dim i%, j%, k%, l%, m%
    Dim DbVar As Database
    Dim SumDbVar As Database
    Dim TableVar As Table
    Dim SumTableVar As Table
    Dim DsSomeData As Dynaset
    Dim DsStatData As Dynaset
    Dim SQLQ As String
    Dim Sum#
    Dim Counter%
    Dim Average#
    Dim Q As QueryDef 'Set mouse pointer
    Swim.MousePointer = Hourglass 'Show gauge
    Status.Show
    Status.Caption = "Generate Summary Table"
    Status.Gauge1.Max = NumberMachines% * SummaryMaterialThicknessGroups% * Summ
aryTensileGroups% * SummaryHCGroups%
    Status.Gauge1.Value = 0

'Perform summary
    For i% = 0 To (NumberMachines% - 1)
        CurrentDatabaseName$ = StartupPath$ + "\SWIM.MDB"
        CurrentTableName$ = Machine(i%).TableName$
        CurrentTableDescription$ = Machine(i%).Description$ 'Initialize database
        Set DbVar = OpenDatabase(StartupPath$ + "\SWIM.MDB")
        Set SumDbVar = OpenDatabase(StartupPath$ + "\SUMMARY.MDB")
        Set SumTableVar = SumDbVar.OpenTable(CurrentTableName$)
        SumDbVar.Execute "DELETE * From " & CurrentTableName$ For j% = 0 To (SummaryMaterialThicknessGroups% - 1)
            For k% = 0 To (SummaryTensileGroups% - 1)
                For l% = 0 To (SummaryHCGroups% - 1)
                    Status.Gauge1.Value = Status.Gauge1.Value + 1
                    For m% = 0 To (SummaryWidthOrderedGroups% - 1)
                        'Set TableVar = DbVar.OpenTable(CurrentTableName$)
                        Debug.Print i%, j%, k%, l%, m%
                        'Select only records that meet criteria
                        'SQLQ = "SELECT * FROM " & CurrentTableName$
                        'SQLQ = SQLQ & " WHERE (MaterialThickness>=" & SummaryMa
terialThickness(j%).Lower# & " AND MaterialThickness<=" & SummaryMaterialThickne
ss(j%).Lower# & ")"
                        'SQLQ = SQLQ & " AND (Tensile>=" & SummaryTensile(k%).Lo
wer# & " AND Tensile<=" & SummaryTensile(k%).Lower# & ")"
                        'SQLQ = SQLQ & " AND (HC>=" & SummaryHC(l%).Lower# & " A
ND HC<=" & SummaryHC(l%).Lower# & ")"
                        'SQLQ = SQLQ & " AND (WidthOrdered>=" & SummaryWidthOrde
red(m%).Lower# & " AND WidthOrdered<=" & SummaryWidthOrdered(m%).Lower# & ")"
                        'Set DsSomeData = DbVar.CreateDynaset(SQLQ)
                        SQLQ = "SELECT Avg(Difference) as Avg, Count(Difference)
 as Count from " & CurrentTableName$
```

SWIM.FRM - 2

```
                            SQLQ
                            ∧
                        SQLQ = SQLQ & " WHERE (MaterialThickness>=" & SummaryMat
erialThickness(j%).Lower# & " AND MaterialThickness<=" & SummaryMaterialThicknes
s(j%).Upper# & ")"
                        SQLQ = SQLQ & " AND (Tensile>=" & SummaryTensile(k%).Low
er# & " AND Tensile<=" & SummaryTensile(k%).Upper# & ")"
                        SQLQ = SQLQ & " AND (HC>=" & SummaryHC(l%).Lower# & " AN
D HC<=" & SummaryHC(l%).Upper# & ")"
                        SQLQ = SQLQ & " AND (WidthOrdered>=" & SummaryWidthOrder
ed(m%).Lower# & " AND WidthOrdered<=" & SummaryWidthOrdered(m%).Upper# & ")"

Set Q = DbVar.CreateQueryDef("Statistics", SQLQ)
                        Set DsStatData = Q.CreateDynaset()

'Sum# = 0
                        'Counter% = 0

'Calculate the Average
                        'If DsSomeData.EOF = False Then
                        '    DsSomeData.MoveFirst
                        '    Do Until DsSomeData.EOF = True
                        '        Sum# = Sum# + DsSomeData("Difference")
                        '        Counter% = Counter% + 1
                        '    Loop
                        'End If SumTableVar.AddNew
                        SumTableVar("LowerMaterialThickness") = SummaryMaterialT
hickness(j%).Lower#
                        SumTableVar("UpperMaterialThickness") = SummaryMaterialT
hickness(j%).Upper#
                        SumTableVar("LowerTensile") = SummaryTensile(k%).Lower#
                        SumTableVar("UpperTensile") = SummaryTensile(k%).Upper#
                        SumTableVar("LowerHC") = SummaryHC(l%).Lower#
                        SumTableVar("UpperHC") = SummaryHC(l%).Upper#
                        SumTableVar("LowerWidthOrdered") = SummaryWidthOrdered(m
%).Lower#
                        SumTableVar("UpperWidthOrdered") = SummaryWidthOrdered(m
%).Upper#

'If DsStatData("Count") > 0 Then 'Counter% > 0 Then
                            SumTableVar("Difference") = DsStatData("Avg") 'Sum#
/ Counter%
                        'End If
                        SumTableVar("Observations") = DsStatData("Count") 'Count
er%

SumTableVar.Update
                        Q.Close
                        DbVar.DeleteQueryDef "Statistics"
                    Next m%
                Next l%
            Next k%
        Next j%
        'TableVar.Close
        SumTableVar.Close
    Next i%

'Global SummaryMaterialThickness() As SummaryType
    'Global SummaryTensile() As SummaryType
    'Global SummaryHC() As SummaryType
    'Global SummaryWidthOrdered() As SummaryType Unload Status
```

SWIM.FRM - 3

```
    'Set mouse pointer
    Swim.MousePointer = Arrow

End Sub

Sub OpenSetup (nMachine%)
'   This routine opens a new setup file for Head 1
    Dim FileName$
    Dim FileNum%
    Dim A$
    Dim i%, j%

Call GetFileName(OpenTheFile, CassDefaultPath$, FileName$, Success)
    If Success Then
        SetupFileName$ = FileName$
        FileNum% = FreeFile
        Open FileName For Input As FileNum%
        'Screen #1 information
        Input #FileNum%, A$
        'OrderNumber$ = Left$(A$, Len(A$))
        Input #FileNum%, A$
        'OrderDescription$ = Left$(A$, Len(A$))
        Input #FileNum%, A$
        MaterialThickness# = Val(A$)
        Input #FileNum%, A$
        Tensile# = Val(A$)
        Input #FileNum%, A$
        HC# = Val(A$)
        Input #FileNum%, A$
        'SetupType$ = Left$(A$, Len(A$))

'Screen #2 information
        Input #FileNum%, A$
        'CoilWidth# = Val(A$)
        Input #FileNum%, A$
        'CoilWeight# = Val(A$)
        Input #FileNum%, A$
        'SideScrap1# = Val(A$)
        Input #FileNum%, A$
        'SideScrap2# = Val(A$)
        Input #FileNum%, A$
        NumberDifferentMults% = Val(A$)
        ReDim Entry(NumberDifferentMults%)
        j% = 0
        For i% = 0 To (NumberDifferentMults% - 1)
            Input #FileNum%, A$
            Entry(i%).Knife# = Val(A$)
            Input #FileNum%, A$
            Entry(i%).WeightOrdered# = Val(A$)
            Input #FileNum%, A$
            Entry(i%).WidthOrdered# = Val(A$)
            Input #FileNum%, A$
            Entry(i%).Female# = Val(A$)
            Input #FileNum%, A$
            Entry(i%).Male# = Val(A$)
            Input #FileNum%, A$
            Entry(i%).NumberMults% = Val(A$)
            Input #FileNum%, A$
            Entry(i%).ActualWeight# = Val(A$)
            j% = j% + Entry(i%).NumberMults%
```

SWIM.FRM - 4

```
        Next i%
        Close #FileNum%
    End If

TotalNumberMults% = j%

End Sub

Sub RecordData (nMachine As Integer)
    Dim Response%

'Set mouse pointer
    Swim.MousePointer = Hourglass

'Set current machine number
    CurrentMachine% = nMachine%

'Ask user if there is a CASS setup file
    Beep
    Response% = MsgBox("Import data from CASS setup file ?", MB_YESNO + MB_ICONQ
UESTION, ProgramName$)
    If Response = IDYES Then
        CassSetup% = True
        Call OpenSetup(nMachine%)
        dDate$ = Format(Now, "mm/dd/yy")
        Swim.MousePointer = Hourglass
        Record.Show modal
    Else
        CassSetup% = False
        Swim.MousePointer = Hourglass
        'Screen1.Show modal
        Record.Show modal
    End If 'Set mouse pointer
    Swim.MousePointer = Arrow End Sub Sub About_Menu_Click ()

Swim.MousePointer = Hourglass
    About.Show modal
    Swim.MousePointer = Arrow End Sub Sub Browse_File_Menu_Click ()

'Set mouse pointer
    Swim.MousePointer = Hourglass

'Initialize current database
    CurrentDatabaseName$ = StartupPath$ + "\PURGE.MDB"

'Get the filename from the user/set CurrentTableName$
    ExitMethod% = C_CANCEL
    FromFile.Show modal If ExitMethod% = C_OK Then
        'Show Browse window
```

SWIM.FRM - 5

```
                    modal
                    ^
        Browse.Show modal
    End If 'Set mouse pointer
    Swim.MousePointer = Arrow End Sub Sub Browse_Machine_Menu_Click (Index As Integer)

'Set mouse pointer
    Swim.MousePointer = Hourglass

'Initialize current table and database
    CurrentMachine% = Index%
    CurrentDatabaseName$ = StartupPath$ + "\SWIM.MDB"
    CurrentTableName$ = Machine(CurrentMachine%).TableName$
    CurrentTableDescription$ = Machine(CurrentMachine%).Description$ 'Show Browse window
    Browse.Show modal 'Set mouse pointer
    Swim.MousePointer = Arrow End Sub Sub Configuration_Menu_Click ()
'Display Configuration window
    Swim.MousePointer = Hourglass
    Config.Show modal
    Swim.MousePointer = Arrow End Sub Sub Contents_Menu_Click ()
' How to use help
    X% = WinHelp(Screen.ActiveForm.hWnd, App.HelpFile, HELP_CONTENTS, 0)
End Sub Sub Delete_Machine_Menu_Click (Index As Integer)

'Set mouse pointer
    Swim.MousePointer = Hourglass

'Initialize current table and database
    CurrentMachine% = Index%
    CurrentDatabaseName$ = StartupPath$ + "\PURGE.MDB"
    CurrentTableName$ = Machine(CurrentMachine%).TableName$
    CurrentTableDescription$ = Machine(CurrentMachine%).Description$ 'Show Purge window
    FromFile.Show modal 'Set mouse pointer
    Swim.MousePointer = Arrow End Sub Sub Exit_Menu_Click ()
    ' This routine exits the CASS program and
```

SWIM.FRM - 6

```
' returns the user to the Windows environment.

'First close the help file
    X% = WinHelp(Screen.ActiveForm.hWnd, App.HelpFile, HELP_QUIT, 0)
    End End Sub Sub Form_Load ()
    Dim i%

'Set mouse pointer
    Swim.MousePointer = Hourglass

'Initialize program variables
    Call Init

'   Initialize form with Implementation Variables
    Label4.Caption = CompanyName$
    Label5.Caption = CompanyAddress1$
    Label6.Caption = CompanyAddress2$
    Label1.Caption = ProgramName$
    Label2.Caption = Copyright$
    Swim.Caption = ProgramCaption$
    Label7.Caption = "License# " + License$ Label8.Left = Label1.Left + Label1.Width
    Label8.Top = Label1.Top 'FindInitialPath - now in logon form
    'Call ReadConfig(StartupPath$ & "\SwimWIN.INI") - now in logon form 'Set form background color
    Swim.BackColor = BackgroundColor 'Make password menu items invisible if PasswordOption=False
    If PasswordOption% = False Then
        Swim.Password_Menu.Visible = False
        Swim.Users_Menu.Visible = False
        Swim.File_Sep_Menu3.Visible = False
    End If 'Display/hide menu options
    For i% = 0 To (NumberMachines% - 1)
        Swim.Record_Machine_Menu(i%).Visible = True
        Swim.Record_Machine_Menu(i%).Caption = Machine(i%).MenuCaption$
        Swim.Browse_Machine_Menu(i%).Visible = True
        Swim.Browse_Machine_Menu(i%).Caption = Machine(i%).MenuCaption$
        Swim.Query_Machine_Menu(i%).Visible = True
        Swim.Query_Machine_Menu(i%).Caption = Machine(i%).MenuCaption$
        Swim.Purge_Machine_Menu(i%).Visible = True
        Swim.Purge_Machine_Menu(i%).Caption = Machine(i%).MenuCaption$
        Swim.Delete_Machine_Menu(i%).Visible = True
        Swim.Delete_Machine_Menu(i%).Caption = Machine(i%).MenuCaption$
        Swim.View_Machine_Menu(i%).Visible = True
        Swim.View_Machine_Menu(i%).Caption = Machine(i%).MenuCaption$
    Next i%
    For i% = NumberMachines To (MaxMachines% - 1)
        Swim.Record_Machine_Menu(i%).Visible = False
        Swim.Browse_Machine_Menu(i%).Visible = False
```

SWIM.FRM - 7

```
            Swim.Query_Machine_Menu(i%).Visible = False
            Swim.Purge_Machine_Menu(i%).Visible = False
            Swim.Delete_Machine_Menu(i%).Visible = False
            Swim.View_Machine_Menu(i%).Visible = False
    Next i%

'Set form location to center of screen
    CenterForm Swim

'Set mouse pointer
    Swim.MousePointer = Arrow

End Sub

Sub Generate_Menu_Click ()
    Dim Response%

'Verify that summary table should be generated
    Beep
    Response% = MsgBox("Generate Summary Table ?", MB_YESNO + MB_ICONQUESTION, P
rogramName$)
    If Response% = IDYES Then
        Call GenerateSummaryTable
    End If End Sub Sub HelponHelp_Menu_Click ()

X% = WinHelp(Screen.ActiveForm.hWnd, App.HelpFile, HELP_HELPONHELP, 0)

End Sub

Sub Password_Menu_Click ()
'Display Password Window
    Swim.MousePointer = Hourglass
    Password.Show modal
    Swim.MousePointer = Arrow
End Sub Sub Printer_Menu_Click ()
'Select printer
    On Error Resume Next
    CMDialog1.Flags = PD_HIDEPRINTTOFILE Or PD_NOPAGENUMS Or PD_PRINTSETUP
    CMDialog1.Action = 5

End Sub

Sub Purge_Machine_Menu_Click (Index As Integer)

'Set mouse pointer
    Swim.MousePointer = Hourglass

'Initialize current table and database
    CurrentMachine% = Index%
    CurrentDatabaseName$ = StartupPath$ + "\SWIM.MDB"
    CurrentTableName$ = Machine(CurrentMachine%).TableName$
    CurrentTableDescription$ = Machine(CurrentMachine%).Description$ 'Show Purge window
    Purge.Show modal
```

SWIM.FRM - 8

```
    'Set mouse pointer
    Swim.MousePointer = Arrow

End Sub

Sub Query_File_Menu_Click ()

'Set mouse pointer
    Swim.MousePointer = Hourglass

'Initialize current database
    CurrentDatabaseName$ = StartupPath$ + "\PURGE.MDB"

'Get the filename from the user/set CurrentTableName$
    ExitMethod% = C_CANCEL
    FromFile.Show modal If ExitMethod% = C_OK Then
        'Show Query window
        Query.Show 'modal
    End If 'Set mouse pointer
    Swim.MousePointer = Arrow End Sub Sub Query_Machine_Menu_Click (Index As Integer)

'Set mouse pointer
    Swim.MousePointer = Hourglass

'Initialize current table and database
    CurrentMachine% = Index%
    CurrentDatabaseName$ = StartupPath$ + "\SWIM.MDB"
    CurrentTableName$ = Machine(CurrentMachine%).TableName$
    CurrentTableDescription$ = Machine(CurrentMachine%).Description$ 'Show Query window
    Query.Show 'modal 'Set mouse pointer
    Swim.MousePointer = Arrow End Sub Sub Random_Menu_Click ()
    Dim i%, j%, k%, l%, m%
    Dim DbVar As Database
    Dim TableVar As Table
    Dim TempDate As Long
    Dim Response%

'Verify that random table should be generated
    Beep
    Response% = MsgBox("Create new random Machine tables ?", MB_YESNO + MB_ICONQUESTION, ProgramName$)
    If Response% = IDNO Then
        Exit Sub
    End If
```

SWIM.FRM - 9

```
    'Set mouse pointer
    Swim.MousePointer = Hourglass

Status.Show
    Status.Gauge1.Max = 50 * 40 * 10
    Status.Gauge1.Value = 0

'Perform Random Number Generation
    For i% = 0 To (NumberMachines% - 1)

Randomize    ' Seed random number generator.

CurrentDatabaseName$ = StartupPath$ + "\SWIM.MDB"
        CurrentTableName$ = Machine(i%).TableName$
        CurrentTableDescription$ = Machine(i%).Description$ 'Initialize database
        Set DbVar = OpenDatabase(CurrentDatabaseName$)
        Set TableVar = DbVar.OpenTable(CurrentTableName$)
        'DbVar.Execute "Delete * from " & CurrentTableName$ TempDate = Date
        For k% = 1 To 50
            Status.Gauge1.Value = Status.Gauge1.Value + 1
            For l% = 1 To 40
                dDate$ = Format$(TempDate, "m/d/yy")
                MaterialThickness# = (6 * Rnd + 1) / 100
                HC# = (4 * Rnd) / 1000
                Tensile# = Int(6 * Rnd + 1) * 50
                For j% = 1 To 10
                    TableVar.AddNew
                    TableVar("Date") = Format$(TempDate, "m/d/yy")
                    TableVar("MaterialThickness") = Roundx(MaterialThickness#, .
001, 3)
                    TableVar("HC") = Roundx(HC#, HorzClearInc#, Precision%)
                    TableVar("Tensile") = Roundx(Tensile#, 1, 0)
                    TableVar("WidthOrdered") = Roundx((6 * Rnd + 1) * 10, .001,
3)
                    TableVar("WidthActual") = TableVar("Widthordered") - Roundx(
(10 * Rnd + 1) / 1000, .001, 3)
                    TableVar("Difference") = Roundx(TableVar("WidthActual") - Ta
bleVar("WidthOrdered"), .001, 3)
                    TableVar.Update
                Next j%
            Next l%
            TempDate = TempDate + 1
        Next k%
        TableVar.Close
    Next i%
    'Dice1 = Int(6 * Rnd + 1)
    'Dice2 = Int(6 * Rnd + 1)

'Unload Status form
    Unload Status

'Set mouse pointer
    Swim.MousePointer = Hourglass

End Sub
```

```
SWIM.FRM - 10

Sub Record_Machine_Menu_Click (Index As Integer)
    Call RecordData(Index)
End Sub Sub Search_Menu_Click ()

X% = WinHelp(Screen.ActiveForm.hWnd, App.HelpFile, HELP_PARTIALKEY, 0)

End Sub

Sub Users_Menu_Click ()
'Display Users window
    Swim.MousePointer = Hourglass
    Users.Show modal
    Swim.MousePointer = Arrow End Sub Sub View_Machine_Menu_Click (Index As Integer)

'Set mouse pointer
    Swim.MousePointer = Hourglass

'Initialize current table and database
    CurrentMachine% = Index%
    CurrentDatabaseName$ = StartupPath$ + "\SUMMARY.MDB"
    CurrentTableName$ = Machine(CurrentMachine%).TableName$
    CurrentTableDescription$ = Machine(CurrentMachine%).Description$ 'Show Browse window
    ViewSum.Show modal 'Set mouse pointer
    Swim.MousePointer = Arrow End Sub
```

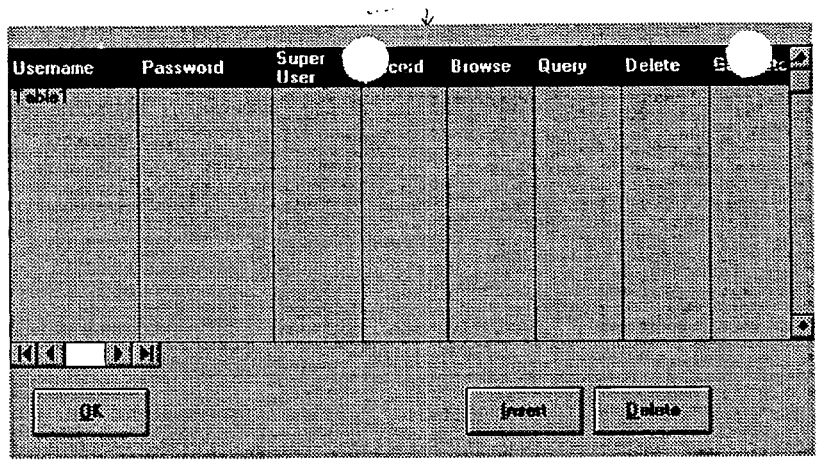

USERS.FRM - 1

```
VERSION 2.00
Begin Form Users
    BackColor       =   &H00C0C0C0&
    Caption         =   "Define Users"
    ClientHeight    =   4440
    ClientLeft      =   1320
    ClientTop       =   1710
    ClientWidth     =   8280
    Height          =   4845
    HelpContextID   =   2800
    Left            =   1260
    LinkTopic       =   "Form1"
    ScaleHeight     =   4440
    ScaleWidth      =   8280
    Top             =   1365
    Width           =   8400
    Begin Data Data1
        Connect         =   ""
        DatabaseName    =   "C:\SWIM\SWIM.MDB"
        Exclusive       =   0   'False
        Height          =   270
        Left            =   0
        Options         =   0
        ReadOnly        =   0   'False
        RecordSource    =   "USERS"
        Top             =   3240
        Visible         =   0   'False
        Width           =   1575
    End
    Begin TrueGrid Table1
        AllowArrows     =   -1  'True
        AllowTabs       =   -1  'True
        BackColor       =   &H00C0C0C0&
        DataSource      =   "Data1"
        Editable        =   -1  'True
        EditDropDown    =   -1  'True
        ExposeCellMode  =   0   'Expose upon selection
        FetchMode       =   0   'By cell
        HeadingHeight   =   2
        Height          =   3015
        HorzLines       =   0   'None LayoutIndex     =   1
        Left            =   0
        LinesPerRow     =   2
        MarqueeUnique   =   -1  'True
        SplitPropsGlobal=   -1  'True
        SplitTabMode    =   0   'Don't tab across splits
        TabCapture      =   0   'False
        TabIndex        =   0
        Top             =   240
        UseBookmarks    =   -1  'True
        Width           =   8295
        WrapCellPointer =   0   'False
    End
    Begin SSCommand Command3D3
        Caption         =   "&OK"
        Font3D          =   0   'None
        ForeColor       =   &H00000000&
        Height          =   495
        Left            =   240
```

```
USERS.FRM - 2
        Picture         =     (none)
        TabIndex        =     1
        Top             =     3720
        Width           =     1215
    End
    Begin SSCommand Command3D2
        Caption         =     "&Delete"
        Font3D          =     0  'None
        ForeColor       =     &H00000000&
        Height          =     495
        Left            =     6000
        Picture         =     (none)
        TabIndex        =     3
        Top             =     3720
        Width           =     1215
    End
    Begin SSCommand Command3D1
        Caption         =     "&Insert"
        Font3D          =     0  'None
        ForeColor       =     &H00000000&
        Height          =     495
        Left            =     4680
        Picture         =     (none)
        TabIndex        =     2
        Top             =     3720
        Width           =     1215
    End
End
```

USERS.FRM - 1

Option Explicit

```
Sub Command3D1_Click ()

'Add a new user to the database
    Data1.Recordset.AddNew
    Data1.Recordset("UserName") = " "
    Data1.Recordset.Update
    Data1.Recordset.MoveLast 'Force them user to enter a Username
    Table1.ColumnIndex = 1
    Table1.SetFocus
    Data1.Recordset.Edit
    Data1.Recordset("UserName") = ""
    SendKeys " {BACKSPACE}"

End Sub

Sub Command3D2_Click ()

'Delete the current user/record from the database
    Data1.Recordset.Delete
    If Data1.Recordset.EOF = False Then
        Data1.Recordset.MoveNext
    End If
    Table1.SetFocus End Sub Sub Command3D3_Click ()

'Close the Users form
    Unload Users

End Sub

Sub Form_Load ()

'Center the form on the screen
    CenterForm Users

'Set form background color
    'Users.BackColor = BackgroundColor

'Open security database
    Data1.DatabaseName = StartupPath$ + "\SWIM.MDB"
    Data1.RecordSource = "USERS"
    Data1.Refresh End Sub Sub Table1_Append ()
'User press down-arrow when on the last user.
'Ask if a new user should be added.
    Dim Response%

Beep
    Response% = MsgBox("Add a new CASS user ?", MB_YESNO + MB_ICONQUESTION, Prog
ramName$)
```

USERS.FRM - 2

```
    If Response = IDYES Then
        'Add a new record/user
        Data1.Recordset.AddNew
        Data1.Recordset("UserName") = " "
        Data1.Recordset.Update
        Data1.Recordset.MoveLast 'Force them user to enter a username
        Table1.ColumnIndex = 1
        Table1.SetFocus
        Data1.Recordset.Edit
        Data1.Recordset("UserName") = ""
        SendKeys " {BACKSPACE}"
    End If
End Sub Sub Table1_RequestEdit (Cancel As Integer, KeyAscii As Integer)
    If Table1.ColumnIndex > 2 Then
        Cancel = True
        If UCase$(Chr$(KeyAscii)) = "Y" Then
            Table1.ColumnText(Table1.ColumnIndex) = True
        ElseIf UCase$(Chr$(KeyAscii)) = "N" Then
            Table1.ColumnText(Table1.ColumnIndex) = False
        Else
            Beep
        End If
    End If
End Sub Sub Table1_Validate (Row As Long, Col As Integer, Value As String, Cancel As Int
eger)

If Col > 2 Then
        Cancel = False
    ElseIf Col = 1 And Trim$(Value) = "" Then
        Cancel = True
        Beep
        MsgBox "Username can not be left empty !", MB_ICONSTOP, ProgramName$
        Exit Sub
    ElseIf Col = 2 And Trim$(Value) = "" Then
        Cancel = True
        Beep
        MsgBox "Password can not be left empty !", MB_ICONSTOP, ProgramName$
    End If End Sub
```

| Lower Material Thickness | Upper Material Thickness | Lower Tensile | Upper Tensile | Lower HC | Upper HC | Lower Width Ordered | Upper Width Ordered | Difference |
|---|---|---|---|---|---|---|---|---|
| Table1 | | | | | | | | |
| | | | | | | | | |
| | | | | | | | | |
| | | | | | | | | |
| | | | | | | | | |
| | | | | | | | | |
| | | | | | | | | |
| | | | | | | | | |
| | | | | | | | | |
| | | | | | | | | |

```
VIEWSUM.FRM - 1

VERSION 2.00
Begin Form ViewSum
    BackColor       =   &H00C0C0C0&
    Caption         =   "ViewSum.Caption"
    ClientHeight    =   5265
    ClientLeft      =   120
    ClientTop       =   1185
    ClientWidth     =   9150
    Height          =   5670
    HelpContextID   =   4000
    Left            =   60
    LinkTopic       =   "Form1"
    ScaleHeight     =   5265
    ScaleWidth      =   9150
    Top             =   840
    Width           =   9270
    Begin TrueGrid Table1
        AllowArrows     =   -1  'True
        AllowTabs       =   -1  'True
        DataSource      =   "Data1"
        Editable        =   -1  'True
        EditDropDown    =   -1  'True
        ExposeCellMode  =   0   'Expose upon selection
        FetchMode       =   0   'By cell
        HeadingHeight   =   3
        Height          =   3855
        HorzLines       =   1   'Single LayoutIndex     =   1
        Left            =   0
        LinesPerRow     =   1
        MarqueeUnique   =   -1  'True
        SplitPropsGlobal=   -1  'True
        SplitTabMode    =   0   'Don't tab across splits
        TabCapture      =   0   'False
        TabIndex        =   1
        Top             =   240
        UseBookmarks    =   -1  'True
        Width           =   9135
        WrapCellPointer =   0   'False
    End
    Begin Data Data1
        Connect         =   ""
        DatabaseName    =   "C:\SWIM\SUMMARY.MDB"
        Exclusive       =   0   'False
        Height          =   270
        Left            =   0
        Options         =   0
        ReadOnly        =   0   'False
        RecordSource    =   "Machine0"
        Top             =   4080
        Width           =   1575
    End
    Begin SSCommand Command3D1
        Caption         =   "&OK"
        Font3D          =   0   'None
        ForeColor       =   &H00000000&
        Height          =   495
        Left            =   120
        Picture         =   (none)
        TabIndex        =   0
```

VIEWSUM.FRM - 2

```
      Top             =    4560  4560
      Width           =    1215
   End
End
```

VIEWSUM.FRM - 1

```
Option Explicit

Sub Command3D2_Click ()

Rollback
    Unload Browse

End Sub

Sub Command3D3_Click ()
    'Add a new user to the database
    Data1.Recordset.AddNew
    Data1.Recordset.Update
    Data1.Recordset.MoveLast
    Table1.ColumnIndex = 5
    Table1.SetFocus
End Sub Sub Command3D4_Click ()

' Delete the current user/record from the database
    Data1.Recordset.Delete
    If Data1.Recordset.EOF = False Then
        Data1.Recordset.MoveNext
    End If
    Table1.SetFocus End Sub Sub Command3D1_Click ()

Unload ViewSum

End Sub

Sub Form_Load ()

'Center the form on the screen
    CenterForm ViewSum

'Set form caption
    ViewSum.Caption = "View Summary Table " & CurrentTableDescription$ 'Set datasource
    Data1.DatabaseName = CurrentDatabaseName$
    Data1.RecordSource = CurrentTableName$
    Data1.Refresh 'Set focus to ActualWidth column of table
    'Table1.ColumnIndex = 6

End Sub
```

CONSTANT.BAS - 1

Option Explicit

'''''''''''''''''''''''''''''''
' Visual Basic global constant file. This file can be loaded
' into a code module.
'
' Some constants are commented out because they have
' duplicates (e.g., NONE appears several places).
'
' If you are updating a Visual Basic 1.0 program to run in
' Visual Basic 2.0, you should replace your global constants
' with the constants in this file.  Note that True and False
' are now built into Visual Basic so are no longer defined in
' this file.
'
'''''''''''''''''''''''''''''''

' General

' Clipboard formats
Global Const CF_LINK = &HBF00
Global Const CF_TEXT = 1
Global Const CF_BITMAP = 2
Global Const CF_METAFILE = 3
Global Const CF_DIB = 8
Global Const CF_PALETTE = 9

' DragOver
Global Const ENTER = 0
Global Const LEAVE = 1
Global Const OVER = 2

' Drag (controls)
Global Const CANCEL = 0
Global Const BEGIN_DRAG = 1
Global Const END_DRAG = 2

' Show parameters
Global Const MODAL = 1
Global Const MODELESS = 0

' Arrange Method
' for MDI Forms
Global Const CASCADE = 0
Global Const TILE_HORIZONTAL = 1
Global Const TILE_VERTICAL = 2
Global Const ARRANGE_ICONS = 3

'ZOrder Method
Global Const BRINGTOFRONT = 0
Global Const SENDTOBACK = 1

' Key Codes
Global Const KEY_LBUTTON = &H1
Global Const KEY_RBUTTON = &H2
Global Const KEY_CANCEL = &H3
Global Const KEY_MBUTTON = &H4     ' NOT contiguous with L & RBUTTON
Global Const KEY_BACK = &H8
Global Const KEY_TAB = &H9
Global Const KEY_CLEAR = &HC
Global Const KEY_RETURN = &HD

CONSTANT.BAS - 2

```
Global Const KEY_SHIFT = &H10
Global Const KEY_CONTROL = &H11
Global Const KEY_MENU = &H12
Global Const KEY_PAUSE = &H13
Global Const KEY_CAPITAL = &H14
Global Const KEY_ESCAPE = &H1B
Global Const KEY_SPACE = &H20
Global Const KEY_PRIOR = &H21
Global Const KEY_NEXT = &H22
Global Const KEY_END = &H23
Global Const KEY_HOME = &H24
Global Const KEY_LEFT = &H25
Global Const KEY_UP = &H26
Global Const KEY_RIGHT = &H27
Global Const KEY_DOWN = &H28
Global Const KEY_SELECT = &H29
Global Const KEY_PRINT = &H2A
Global Const KEY_EXECUTE = &H2B
Global Const KEY_SNAPSHOT = &H2C
Global Const KEY_INSERT = &H2D
Global Const KEY_DELETE = &H2E
Global Const KEY_HELP = &H2F ' KEY_A thru KEY_Z are the same as their ASCII equivalents: 'A' thru 'Z'
' KEY_0 thru KEY_9 are the same as their ASCII equivalents: '0' thru '9'

Global Const KEY_NUMPAD0 = &H60
Global Const KEY_NUMPAD1 = &H61
Global Const KEY_NUMPAD2 = &H62
Global Const KEY_NUMPAD3 = &H63
Global Const KEY_NUMPAD4 = &H64
Global Const KEY_NUMPAD5 = &H65
Global Const KEY_NUMPAD6 = &H66
Global Const KEY_NUMPAD7 = &H67
Global Const KEY_NUMPAD8 = &H68
Global Const KEY_NUMPAD9 = &H69
Global Const KEY_MULTIPLY = &H6A
Global Const KEY_ADD = &H6B
Global Const KEY_SEPARATOR = &H6C
Global Const KEY_SUBTRACT = &H6D
Global Const KEY_DECIMAL = &H6E
Global Const KEY_DIVIDE = &H6F
Global Const KEY_F1 = &H70
Global Const KEY_F2 = &H71
Global Const KEY_F3 = &H72
Global Const KEY_F4 = &H73
Global Const KEY_F5 = &H74
Global Const KEY_F6 = &H75
Global Const KEY_F7 = &H76
Global Const KEY_F8 = &H77
Global Const KEY_F9 = &H78
Global Const KEY_F10 = &H79
Global Const KEY_F11 = &H7A
Global Const KEY_F12 = &H7B
Global Const KEY_F13 = &H7C
Global Const KEY_F14 = &H7D
Global Const KEY_F15 = &H7E
Global Const KEY_F16 = &H7F Global Const KEY_NUMLOCK = &H90
```

CONSTANT.BAS - 3

' Variant VarType tags

Global Const V_EMPTY = 0
Global Const V_NULL = 1
Global Const V_INTEGER = 2
Global Const V_LONG = 3
Global Const V_SINGLE = 4
Global Const V_DOUBLE = 5
Global Const V_CURRENCY = 6
Global Const V_DATE = 7
Global Const V_STRING = 8

' Event Parameters

' ErrNum (LinkError)
Global Const WRONG_FORMAT = 1
Global Const DDE_SOURCE_CLOSED = 6
Global Const TOO_MANY_LINKS = 7
Global Const DATA_TRANSFER_FAILED = 8

' QueryUnload
Global Const FORM_CONTROLMENU = 0
Global Const FORM_CODE = 1
Global Const APP_WINDOWS = 2
Global Const APP_TASKMANAGER = 3
Global Const FORM_MDIFORM = 4

' Properties

' Colors
Global Const BLACK = &H0&
Global Const RED = &HFF&
Global Const GREEN = &HFF00&
Global Const YELLOW = &HFFFF&
Global Const BLUE = &HFF0000
Global Const MAGENTA = &HFF00FF
Global Const CYAN = &HFFFF00
Global Const WHITE = &HFFFFFF ' System Colors
Global Const SCROLL_BARS = &H80000000        ' Scroll-bars gray area.
Global Const DESKTOP = &H80000001            ' Desktop.
Global Const ACTIVE_TITLE_BAR = &H80000002   ' Active window caption.
Global Const INACTIVE_TITLE_BAR = &H80000003 ' Inactive window caption.
Global Const MENU_BAR = &H80000004           ' Menu background.
Global Const WINDOW_BACKGROUND = &H80000005  ' Window background.
Global Const WINDOW_FRAME = &H80000006       ' Window frame.
Global Const MENU_TEXT = &H80000007          ' Text in menus.
Global Const WINDOW_TEXT = &H80000008        ' Text in windows.
Global Const TITLE_BAR_TEXT = &H80000009     ' Text in caption, size box, scr
oll-bar arrow box..
Global Const ACTIVE_BORDER = &H8000000A      ' Active window border.
Global Const INACTIVE_BORDER = &H8000000B    ' Inactive window border.
Global Const APPLICATION_WORKSPACE = &H8000000C ' Background color of multiple d
ocument interface (MDI) applications.
Global Const HIGHLIGHT = &H8000000D          ' Items selected item in a contr
ol.
Global Const HIGHLIGHT_TEXT = &H8000000E     ' Text of item selected in a con
trol.
Global Const BUTTON_FACE = &H8000000F        ' Face shading on command button

CONSTANT.BAS - 4

```
s.
Global Const BUTTON_SHADOW = &H80000010        ' Edge shading on command button
s.
Global Const GRAY_TEXT = &H80000011            ' Grayed (disabled) text.  This
color is set to 0 if the current display driver does not support a solid gray co
lor.
Global Const BUTTON_TEXT = &H80000012          ' Text on push buttons.

' Enumerated Types

' Align (picture box)
Global Const NONE = 0
Global Const ALIGN_TOP = 1
Global Const ALIGN_BOTTOM = 2

' Alignment
Global Const LEFT_JUSTIFY = 0   ' 0 - Left Justify
Global Const RIGHT_JUSTIFY = 1  ' 1 - Right Justify
Global Const CENTER = 2         ' 2 - Center ' BorderStyle (form)
'Global Const NONE = 0           ' 0 - None
Global Const FIXED_SINGLE = 1   ' 1 - Fixed Single
Global Const SIZABLE = 2        ' 2 - Sizable (Forms only)
Global Const FIXED_DOUBLE = 3   ' 3 - Fixed Double (Forms only)

' BorderStyle (Shape and Line)
'Global Const TRANSPARENT = 0    '0 - Transparent
'Global Const SOLID = 1          '1 - Solid
'Global Const DASH = 2           ' 2 - Dash
'Global Const DOT = 3            ' 3 - Dot
'Global Const DASH_DOT = 4       ' 4 - Dash-Dot
'Global Const DASH_DOT_DOT = 5   ' 5 - Dash-Dot-Dot
'Global Const INSIDE_SOLID = 6   ' 6 - Inside Solid ' MousePointer
'Global Const DEFAULT = 0        ' 0 - Default
Global Const ARROW = 1          ' 1 - Arrow
Global Const CROSSHAIR = 2      ' 2 - Cross
Global Const IBEAM = 3          ' 3 - I-Beam
Global Const ICON_POINTER = 4   ' 4 - Icon
Global Const SIZE_POINTER = 5   ' 5 - Size
Global Const SIZE_NE_SW = 6     ' 6 - Size NE SW
Global Const SIZE_N_S = 7       ' 7 - Size N S
Global Const SIZE_NW_SE = 8     ' 8 - Size NW SE
Global Const SIZE_W_E = 9       ' 9 - Size W E
Global Const UP_ARROW = 10      ' 10 - Up Arrow
Global Const HOURGLASS = 11     ' 11 - Hourglass
Global Const NO_DROP = 12       ' 12 - No drop ' DragMode
Global Const MANUAL = 0     ' 0 - Manual
Global Const AUTOMATIC = 1  ' 1 - Automatic ' DrawMode
Global Const BLACKNESS = 1      ' 1 - Blackness
Global Const NOT_MERGE_PEN = 2  ' 2 - Not Merge Pen
Global Const MASK_NOT_PEN = 3   ' 3 - Mask Not Pen
Global Const NOT_COPY_PEN = 4   ' 4 - Not Copy Pen
Global Const MASK_PEN_NOT = 5   ' 5 - Mask Pen Not
Global Const INVERT = 6         ' 6 - Invert
```

CONSTANT.BAS - 5

```
Global Const XOR_PEN = 7           ' 7 - Xor Pen
Global Const NOT_MASK_PEN = 8      ' 8 - Not Mask Pen
Global Const MASK_PEN = 9          ' 9 - Mask Pen
Global Const NOT_XOR_PEN = 10      ' 10 - Not Xor Pen
Global Const NOP = 11              ' 11 - Nop
Global Const MERGE_NOT_PEN = 12    ' 12 - Merge Not Pen
Global Const COPY_PEN = 13         ' 13 - Copy Pen
Global Const MERGE_PEN_NOT = 14    ' 14 - Merge Pen Not
Global Const MERGE_PEN = 15        ' 15 - Merge Pen
Global Const WHITENESS = 16        ' 16 - Whiteness ' DrawStyle
Global Const SOLID = 0             ' 0 - Solid
Global Const DASH = 1              ' 1 - Dash
Global Const DOT = 2               ' 2 - Dot
Global Const DASH_DOT = 3          ' 3 - Dash-Dot
Global Const DASH_DOT_DOT = 4      ' 4 - Dash-Dot-Dot
Global Const INVISIBLE = 5         ' 5 - Invisible
Global Const INSIDE_SOLID = 6      ' 6 - Inside Solid ' FillStyle
' Global Const SOLID = 0             ' 0 - Solid
Global Const TRANSPARENT = 1       ' 1 - Transparent
Global Const HORIZONTAL_LINE = 2   ' 2 - Horizontal Line
Global Const VERTICAL_LINE = 3     ' 3 - Vertical Line
Global Const UPWARD_DIAGONAL = 4   ' 4 - Upward Diagonal
Global Const DOWNWARD_DIAGONAL = 5 ' 5 - Downward Diagonal
Global Const CROSS = 6             ' 6 - Cross
Global Const DIAGONAL_CROSS = 7    ' 7 - Diagonal Cross ' LinkMode (forms and controls)
' Global Const NONE = 0              ' 0 - None
Global Const LINK_SOURCE = 1       ' 1 - Source (forms only)
Global Const LINK_AUTOMATIC = 1    ' 1 - Automatic (controls only)
Global Const LINK_MANUAL = 2       ' 2 - Manual (controls only)
Global Const LINK_NOTIFY = 3       ' 3 - Notify (controls only)

' LinkMode (kept for VB1.0 compatibility, use new constants instead)
Global Const HOT = 1      ' 1 - Hot (controls only)
Global Const SERVER = 1   ' 1 - Server (forms only)
Global Const COLD = 2     ' 2 - Cold (controls only)

' ScaleMode
Global Const USER = 0              ' 0 - User
Global Const TWIPS = 1             ' 1 - Twip
Global Const POINTS = 2            ' 2 - Point
Global Const PIXELS = 3            ' 3 - Pixel
Global Const CHARACTERS = 4        ' 4 - Character
Global Const INCHES = 5            ' 5 - Inch
Global Const MILLIMETERS = 6       ' 6 - Millimeter
Global Const CENTIMETERS = 7       ' 7 - Centimeter ' ScrollBar
' Global Const NONE        = 0 ' 0 - None
Global Const HORIZONTAL = 1  ' 1 - Horizontal
Global Const VERTICAL = 2    ' 2 - Vertical
Global Const BOTH = 3        ' 3 - Both ' Shape
Global Const SHAPE_RECTANGLE = 0
```

CONSTANT.BAS - 6

```
                      SQUARE
                       ∧
Global Const SHAPE_SQUARE = 1
Global Const SHAPE_OVAL = 2
Global Const SHAPE_CIRCLE = 3
Global Const SHAPE_ROUNDED_RECTANGLE = 4
Global Const SHAPE_ROUNDED_SQUARE = 5

' WindowState
Global Const NORMAL = 0      ' 0 - Normal
Global Const MINIMIZED = 1   ' 1 - Minimized
Global Const MAXIMIZED = 2   ' 2 - Maximized ' Check Value
Global Const UNCHECKED = 0   ' 0 - Unchecked
Global Const CHECKED = 1     ' 1 - Checked
Global Const GRAYED = 2      ' 2 - Grayed ' Shift parameter masks
Global Const SHIFT_MASK = 1
Global Const CTRL_MASK = 2
Global Const ALT_MASK = 4

' Button parameter masks
Global Const LEFT_BUTTON = 1
Global Const RIGHT_BUTTON = 2
Global Const MIDDLE_BUTTON = 4

' Function Parameters
' MsgBox parameters
Global Const MB_OK = 0                    ' OK button only
Global Const MB_OKCANCEL = 1              ' OK and Cancel buttons
Global Const MB_ABORTRETRYIGNORE = 2      ' Abort, Retry, and Ignore buttons
Global Const MB_YESNOCANCEL = 3           ' Yes, No, and Cancel buttons
Global Const MB_YESNO = 4                 ' Yes and No buttons
Global Const MB_RETRYCANCEL = 5           ' Retry and Cancel buttons Global Const MB_ICONSTOP = 16             ' Critical message
Global Const MB_ICONQUESTION = 32         ' Warning query
Global Const MB_ICONEXCLAMATION = 48      ' Warning message
Global Const MB_ICONINFORMATION = 64      ' Information message Global Const MB_APPLMODAL = 0             ' Application Modal Message Box
Global Const MB_DEFBUTTON1 = 0            ' First button is default
Global Const MB_DEFBUTTON2 = 256          ' Second button is default
Global Const MB_DEFBUTTON3 = 512          ' Third button is default
Global Const MB_SYSTEMMODAL = 4096        'System Modal ' MsgBox return values
Global Const IDOK = 1        ' OK button pressed
Global Const IDCANCEL = 2    ' Cancel button pressed
Global Const IDABORT = 3     ' Abort button pressed
Global Const IDRETRY = 4     ' Retry button pressed
Global Const IDIGNORE = 5    ' Ignore button pressed
Global Const IDYES = 6       ' Yes button pressed
Global Const IDNO = 7        ' No button pressed ' SetAttr, Dir, GetAttr functions
Global Const ATTR_NORMAL = 0
Global Const ATTR_READONLY = 1
Global Const ATTR_HIDDEN = 2
Global Const ATTR_SYSTEM = 4
Global Const ATTR_VOLUME = 8
```

CONSTANT.BAS - 7  DIRECTORY

```
Global Const ATTR_DIRECTORY = 16
Global Const ATTR_ARCHIVE = 32

'Grid
'ColAlignment,FixedAlignment Properties
Global Const GRID_ALIGNLEFT = 0
Global Const GRID_ALIGNRIGHT = 1
Global Const GRID_ALIGNCENTER = 2

'Fillstyle Property
Global Const GRID_SINGLE = 0
Global Const GRID_REPEAT = 1

'OLE Client Control
'Action
Global Const OLE_CREATE_NEW = 0
Global Const OLE_CREATE_FROM_FILE = 1
Global Const OLE_COPY = 4
Global Const OLE_PASTE = 5
Global Const OLE_UPDATE = 6
Global Const OLE_ACTIVATE = 7
Global Const OLE_EXECUTE = 8
Global Const OLE_CLOSE = 9
Global Const OLE_DELETE = 10
Global Const OLE_SAVE_TO_FILE = 11
Global Const OLE_READ_FROM_FILE = 12
Global Const OLE_CONVERT_TO_TYPE = 13

'ServerType
Global Const OLE_LINKED = 0
Global Const OLE_EMBEDDED = 1
Global Const OLE_STATIC = 2

'UpdateOptions
Global Const OLE_AUTOMATIC = 0
Global Const OLE_FROZEN = 1
Global Const OLE_MANUAL = 2

'Update Event Constants
Global Const OLE_CHANGED = 0
Global Const OLE_SAVED = 1
Global Const OLE_CLOSED = 2
Global Const OLE_RELEASE = 3

'---------------------------------------------------------------
'       Table of Contents for Visual Basic Professional
'
'       1.  3-D Controls
'           (Frame/Panel/Option/Check/Command/Group Push)
'       2.  Animated Button
'       3.  Common Dialog Section
'       4.  Gauge Control
'       5.  Graph Control Section
'       6.  Key Status Control
'       7.  Spin Button
'       8.  MCI Control (Multimedia)
'       9.  Masked Edit Control
'       10. Comm Control
'       11. ODBC Constants
'---------------------------------------------------------------
```

CONSTANT.BAS - 8

```
'----------------------------------------------------------------
'3D Controls
'----------------------------------------------------------------
'Alignment (Check Box)
Global Const SSCB_TEXT_RIGHT = 0         '0 - Text to the right
Global Const SSCB_TEXT_LEFT = 1          '1 - Text to the left 'Alignment (Option Button)
Global Const SSOB_TEXT_RIGHT = 0         '0 - Text to the right
Global Const SSOB_TEXT_LEFT = 1          '1 - Text to the left 'Alignment (Frame)
Global Const SSFR_LEFT_JUSTIFY = 0       '0 - Left justify text
Global Const SSFR_RIGHT_JUSTIFY = 1      '1 - Right justify text
Global Const SSFR_CENTER = 2             '2 - Center text 'Alignment (Panel)
Global Const SSPN_LEFT_TOP = 0           '0 - Text to left and top
Global Const SSPN_LEFT_MIDDLE = 1        '1 - Text to left and middle
Global Const SSPN_LEFT_BOTTOM = 2        '2 - Text to left and bottom
Global Const SSPN_RIGHT_TOP = 3          '3 - Text to right and top
Global Const SSPN_RIGHT_MIDDLE = 4       '4 - Text to right and middle
Global Const SSPN_RIGHT_BOTTOM = 5       '5 - Text to right and bottom
Global Const SSPN_CENTER_TOP = 6         '6 - Text to center and top
Global Const SSPN_CENTER_MIDDLE = 7      '7 - Text to center and middle
Global Const SSPN_CENTER_BOTTOM = 8      '8 - Text to center and bottom 'Autosize (Command Button)
Global Const SS_AUTOSIZE_NONE = 0        '0 - No Autosizing
Global Const SSPB_AUTOSIZE_PICTOBUT = 1  '0 - Autosize Picture to Button
Global Const SSPB_AUTOSIZE_BUTTOPIC = 2  '0 - Autosize Button to Picture 'Autosize (Ribbon Button)
'Global Const SS_AUTOSIZE_NONE       = 0  '0 - No Autosizing
Global Const SSRI_AUTOSIZE_PICTOBUT = 1  '0 - Autosize Picture to Button
Global Const SSRI_AUTOSIZE_BUTTOPIC = 2  '0 - Autosize Button to Picture 'Autosize (Panel)
'Global Const SS_AUTOSIZE_NONE       = 0  '0 - No Autosizing
Global Const SSPN_AUTOSIZE_WIDTH = 1     '1 - Autosize Panel width to Caption
Global Const SSPN_AUTOSIZE_HEIGHT = 2    '2 - Autosize Panel height to Caption
Global Const SSPN_AUTOSIZE_CHILD = 3     '3 - Autosize Child to Panel 'BevelInner (Panel)
Global Const SS_BEVELINNER_NONE = 0      '0 - No Inner Bevel
Global Const SS_BEVELINNER_INSET = 1     '1 - Inset Inner Bevel
Global Const SS_BEVELINNER_RAISED = 2    '2 - Raised Inner Bevel 'BevelOuter (Panel)
Global Const SS_BEVELOUTER_NONE = 0      '0 - No Outer Bevel
Global Const SS_BEVELOUTER_INSET = 1     '1 - Inset Outer Bevel
Global Const SS_BEVELOUTER_RAISED = 2    '2 - Raised Outer Bevel 'FloodType (Panel)
Global Const SS_FLOODTYPE_NONE = 0       '0 - No flood
Global Const SS_FLOODTYPE_L_TO_R = 1     '1 - Left to light
Global Const SS_FLOODTYPE_R_TO_L = 2     '2 - Right to left
Global Const SS_FLOODTYPE_T_TO_B = 3     '3 - Top to bottom
Global Const SS_FLOODTYPE_B_TO_T = 4     '4 - Bottom to top
Global Const SS_FLOODTYPE_CIRCLE = 5     '5 - Widening circle
```

```
CONSTANT.BAS - 9

'Font3D (Panel, Command Button, Option Button, Check Box, Frame)
Global Const SS_FONT3D_NONE = 0            '0 - No 3-D text
Global Const SS_FONT3D_RAISED_LIGHT = 1    '1 - Raised with light shading
Global Const SS_FONT3D_RAISED_HEAVY = 2    '2 - Raised with heavy shading
Global Const SS_FONT3D_INSET_LIGHT = 3     '3 - Inset with light shading
Global Const SS_FONT3D_INSET_HEAVY = 4     '4 - Inset with heavy shading 'PictureDnChange (Ribbon Button)
Global Const SS_PICDN_NOCHANGE = 0         '0 - Use 'Up'bitmap with no change
Global Const SS_PICDN_DITHER = 1           '1 - Dither 'Up'bitmap
Global Const SS_PICDN_INVERT = 2           '2 - Invert 'Up'bitmap 'ShadowColor (Panel, Frame)
Global Const SS_SHADOW_DARKGREY = 0        '0 - Dark grey shadow
Global Const SS_SHADOW_BLACK = 1           '1 - Black shadow 'ShadowStyle (Frame)
Global Const SS_SHADOW_INSET = 0           '0 - Shadow inset
Global Const SS_SHADOW_RAISED = 1          '1 - Shadow raised '----------------------------------------
'Animated Button
'----------------------------------------
'Cycle property
Global Const ANI_ANIMATED = 0
Global Const ANI_MULTISTATE = 1
Global Const ANI_TWO_STATE = 2

'Click Filter property
Global Const ANI_ANYWHERE = 0
Global Const ANI_IMAGE_AND_TEXT = 1
Global Const ANI_IMAGE = 2
Global Const ANI_TEXT = 3

'PicDrawMode Property
Global Const ANI_XPOS_YPOS = 0
Global Const ANI_AUTOSIZE = 1
Global Const ANI_STRETCH = 2

'SpecialOp Property
Global Const ANI_CLICK = 1

'TextPosition Property
Global Const ANI_CENTER = 0
Global Const ANI_LEFT = 1
Global Const ANI_RIGHT = 2
Global Const ANI_BOTTOM = 3
Global Const ANI_TOP = 4

'----------------------------------------
'Common Dialog Control
'----------------------------------------
'Action Property
Global Const DLG_FILE_OPEN = 1
Global Const DLG_FILE_SAVE = 2
Global Const DLG_COLOR = 3
Global Const DLG_FONT = 4
Global Const DLG_PRINT = 5
```

CONSTANT.BAS - 10

Global Const DLG_HELP = 6

'File Open/Save Dialog Flags
Global Const OFN_READONLY = &H1&
Global Const OFN_OVERWRITEPROMPT = &H2&
Global Const OFN_HIDEREADONLY = &H4&
Global Const OFN_NOCHANGEDIR = &H8&
Global Const OFN_SHOWHELP = &H10&
Global Const OFN_NOVALIDATE = &H100&
Global Const OFN_ALLOWMULTISELECT = &H200&
Global Const OFN_EXTENTIONDIFFERENT = &H400&
Global Const OFN_PATHMUSTEXIST = &H800&
Global Const OFN_FILEMUSTEXIST = &H1000&
Global Const OFN_CREATEPROMPT = &H2000&
Global Const OFN_SHAREAWARE = &H4000&
Global Const OFN_NOREADONLYRETURN = &H8000&

'Color Dialog Flags
Global Const CC_RGBINIT = &H1&
Global Const CC_FULLOPEN = &H2&
Global Const CC_PREVENTFULLOPEN = &H4&
Global Const CC_SHOWHELP = &H8&

'Fonts Dialog Flags
Global Const CF_SCREENFONTS = &H1&
Global Const CF_PRINTERFONTS = &H2&
Global Const CF_BOTH = &H3&
Global Const CF_SHOWHELP = &H4&
Global Const CF_INITTOLOGFONTSTRUCT = &H40&
Global Const CF_USESTYLE = &H80&
Global Const CF_EFFECTS = &H100&
Global Const CF_APPLY = &H200&
Global Const CF_ANSIONLY = &H400&
Global Const CF_NOVECTORFONTS = &H800&
Global Const CF_NOSIMULATIONS = &H1000&
Global Const CF_LIMITSIZE = &H2000&
Global Const CF_FIXEDPITCHONLY = &H4000&
Global Const CF_WYSIWYG = &H8000&           'must also have CF_SCRE
ENFONTS & CF_PRINTERFONTS
Global Const CF_FORCEFONTEXIST = &H10000
Global Const CF_SCALABLEONLY = &H20000
Global Const CF_TTONLY = &H40000
Global Const CF_NOFACESEL = &H80000
Global Const CF_NOSTYLESEL = &H100000
Global Const CF_NOSIZESEL = &H200000

'Printer Dialog Flags
Global Const PD_ALLPAGES = &H0&
Global Const PD_SELECTION = &H1&
Global Const PD_PAGENUMS = &H2&
Global Const PD_NOSELECTION = &H4&
Global Const PD_NOPAGENUMS = &H8&
Global Const PD_COLLATE = &H10&
Global Const PD_PRINTTOFILE = &H20&
Global Const PD_PRINTSETUP = &H40&
Global Const PD_NOWARNING = &H80&
Global Const PD_RETURNDC = &H100&
Global Const PD_RETURNIC = &H200&
Global Const PD_RETURNDEFAULT = &H400&
Global Const PD_SHOWHELP = &H800&
Global Const PD_USEDEVMODECOPIES = &H40000

CONSTANT.BAS - 11

Global Const PD_DISABLEPRINTTOFILE = &H80000
Global Const PD_HIDEPRINTTOFILE = &H100000

'Help Constants
Global Const HELP_CONTEXT = &H1              'Display topic in ulTopic
Global Const HELP_QUIT = &H2                 'Terminate help
Global Const HELP_INDEX = &H3                'Display index
Global Const HELP_CONTENTS = &H3
Global Const HELP_HELPONHELP = &H4           'Display help on using help
Global Const HELP_SETINDEX = &H5             'Set the current Index for multi index help
Global Const HELP_SETCONTENTS = &H5
Global Const HELP_CONTEXTPOPUP = &H8
Global Const HELP_FORCEFILE = &H9
Global Const HELP_KEY = &H101                'Display topic for keyword in offabData
Global Const HELP_COMMAND = &H102
Global Const HELP_PARTIALKEY = &H105         'call the search engine in winhelp 'Error Constants
Global Const CDERR_DIALOGFAILURE = &HFFFF Global Const CDERR_GENERALCODES = &H0
Global Const CDERR_STRUCTSIZE = &H1
Global Const CDERR_INITIALIZATION = &H2
Global Const CDERR_NOTEMPLATE = &H3
Global Const CDERR_NOHINSTANCE = &H4
Global Const CDERR_LOADSTRFAILURE = &H5
Global Const CDERR_FINDRESFAILURE = &H6
Global Const CDERR_LOADRESFAILURE = &H7
Global Const CDERR_LOCKRESFAILURE = &H8
Global Const CDERR_MEMALLOCFAILURE = &H9
Global Const CDERR_MEMLOCKFAILURE = &HA
Global Const CDERR_NOHOOK = &HB 'Added for CMDLG.VBX
Global Const CDERR_CANCEL = &HC
Global Const CDERR_NODLL = &HD
Global Const CDERR_ERRPROC = &HE
Global Const CDERR_ALLOC = &HF
Global Const CDERR_HELP = &H10

Global Const PDERR_PRINTERCODES = &H1000
Global Const PDERR_SETUPFAILURE = &H1001
Global Const PDERR_PARSEFAILURE = &H1002
Global Const PDERR_RETDEFFAILURE = &H1003
Global Const PDERR_LOADDRVFAILURE = &H1004
Global Const PDERR_GETDEVMODEFAIL = &H1005
Global Const PDERR_INITFAILURE = &H1006
Global Const PDERR_NODEVICES = &H1007
Global Const PDERR_NODEFAULTPRN = &H1008
Global Const PDERR_DNDMMISMATCH = &H1009
Global Const PDERR_CREATEICFAILURE = &H100A
Global Const PDERR_PRINTERNOTFOUND = &H100B Global Const CFERR_CHOOSEFONTCODES = &H2000
Global Const CFERR_NOFONTS = &H2001

Global Const FNERR_FILENAMECODES = &H3000
Global Const FNERR_SUBCLASSFAILURE = &H3001
Global Const FNERR_INVALIDFILENAME = &H3002

CONSTANT.BAS - 12   *BUFFERTOOSMALL*

Global Const FNERR_BUFFERTOOSMALL = &H3003

Global Const FRERR_FINDREPLACECODES = &H4000
Global Const CCERR_CHOOSECOLORCODES = &H5000

'----------------------------------------
'GAUGE
'----------------------------------------
'Style Property
Global Const GAUGE_HORIZ = 0
Global Const GAUGE_VERT = 1
Global Const GAUGE_SEMI = 2
Global Const GAUGE_FULL = 3

'----------------------------------------
'Graph Control
'----------------------------------------
'General
Global Const G_NONE = 0
Global Const G_DEFAULT = 0

Global Const G_OFF = 0
Global Const G_ON = 1

Global Const G_MONO = 0
Global Const G_COLOR = 1

'Graph Types
Global Const G_PIE2D = 1
Global Const G_PIE3D = 2
Global Const G_BAR2D = 3
Global Const G_BAR3D = 4
Global Const G_GANTT = 5
Global Const G_LINE = 6
Global Const G_LOGLIN = 7
Global Const G_AREA = 8
Global Const G_SCATTER = 9
Global Const G_POLAR = 10
Global Const G_HLC = 11

'Colors
Global Const G_BLACK = 0
Global Const G_BLUE = 1
Global Const G_GREEN = 2
Global Const G_CYAN = 3
Global Const G_RED = 4
Global Const G_MAGENTA = 5
Global Const G_BROWN = 6
Global Const G_LIGHT_GRAY = 7
Global Const G_DARK_GRAY = 8
Global Const G_LIGHT_BLUE = 9
Global Const G_LIGHT_GREEN = 10
Global Const G_LIGHT_CYAN = 11
Global Const G_LIGHT_RED = 12
Global Const G_LIGHT_MAGENTA = 13
Global Const G_YELLOW = 14
Global Const G_WHITE = 15
Global Const G_AUTOBW = 16

```
CONSTANT.BAS - 13

'Patterns
Global Const G_SOLID = 0
Global Const G_HOLLOW = 1
Global Const G_HATCH1 = 2
Global Const G_HATCH2 = 3
Global Const G_HATCH3 = 4
Global Const G_HATCH4 = 5
Global Const G_HATCH5 = 6
Global Const G_HATCH6 = 7
Global Const G_BITMAP1 = 16
Global Const G_BITMAP2 = 17
Global Const G_BITMAP3 = 18
Global Const G_BITMAP4 = 19
Global Const G_BITMAP5 = 20
Global Const G_BITMAP6 = 21
Global Const G_BITMAP7 = 22
Global Const G_BITMAP8 = 23
Global Const G_BITMAP9 = 24
Global Const G_BITMAP10 = 25
Global Const G_BITMAP11 = 26
Global Const G_BITMAP12 = 27
Global Const G_BITMAP13 = 28
Global Const G_BITMAP14 = 29
Global Const G_BITMAP15 = 30
Global Const G_BITMAP16 = 31

'Symbols
Global Const G_CROSS_PLUS = 0
Global Const G_CROSS_TIMES = 1
Global Const G_TRIANGLE_UP = 2
Global Const G_SOLID_TRIANGLE_UP = 3
Global Const G_TRIANGLE_DOWN = 4
Global Const G_SOLID_TRIANGLE_DOWN = 5
Global Const G_SQUARE = 6
Global Const G_SOLID_SQUARE = 7
Global Const G_DIAMOND = 8
Global Const G_SOLID_DIAMOND = 9

'Line Styles
'Global Const G_SOLID = 0
Global Const G_DASH = 1
Global Const G_DOT = 2
Global Const G_DASHDOT = 3
Global Const G_DASHDOTDOT = 4

'Grids
Global Const G_HORIZONTAL = 1
Global Const G_VERTICAL = 2

'Statistics
Global Const G_MEAN = 1
Global Const G_MIN_MAX = 2
Global Const G_STD_DEV = 4
Global Const G_BEST_FIT = 8

'Data Arrays
Global Const G_GRAPH_DATA = 1
Global Const G_COLOR_DATA = 2
Global Const G_EXTRA_DATA = 3
Global Const G_LABEL_TEXT = 4
Global Const G_LEGEND_TEXT = 5
```

CONSTANT.BAS - 14

```
Global Const G_PATTERN_DATA = 6
Global Const G_SYMBOL_DATA = 7
Global Const G_XPOS_DATA = 8
Global Const G_ALL_DATA = 9

'Draw Mode
Global Const G_NO_ACTION = 0
Global Const G_CLEAR = 1
Global Const G_DRAW = 2
Global Const G_BLIT = 3
Global Const G_COPY = 4
Global Const G_PRINT = 5
Global Const G_WRITE = 6

'Print Options
Global Const G_BORDER = 2

'Pie Chart Options            '
Global Const G_NO_LINES = 1
Global Const G_COLORED = 2
Global Const G_PERCENTS = 4

'Bar Chart Options            '
'Global Const G_HORIZONTAL = 1
Global Const G_STACKED = 2
Global Const G_PERCENTAGE = 4
Global Const G_Z_CLUSTERED = 6

'Gantt Chart Options          '
Global Const G_SPACED_BARS = 1

'Line/Polar Chart Options     '
Global Const G_SYMBOLS = 1
Global Const G_STICKS = 2
Global Const G_LINES = 4

'Area Chart Options           '
Global Const G_ABSOLUTE = 1
Global Const G_PERCENT = 2

'HLC Chart Options            '
Global Const G_NO_CLOSE = 1
Global Const G_NO_HIGH_LOW = 2

'----------------------------------------
'Key Status Control
'----------------------------------------
'Style
Global Const KEYSTAT_CAPSLOCK = 0
Global Const KEYSTAT_NUMLOCK = 1
Global Const KEYSTAT_INSERT = 2
Global Const KEYSTAT_SCROLLLOCK = 3

'----------------------------------------
'MCI Control (Multimedia)
'----------------------------------------
'Mode Property
Global Const MCI_MODE_NOT_OPEN = 11
Global Const MCI_MODE_STOP = 12
```

CONSTANT.BAS - 15

```
Global Const MCI_MODE_PLAY = 13
Global Const MCI_MODE_RECORD = 14
Global Const MCI_MODE_SEEK = 15
Global Const MCI_MODE_PAUSE = 16
Global Const MCI_MODE_READY = 17

'NotifyValue Property
Global Const MCI_NOTIFY_SUCCESSFUL = 1
Global Const MCI_NOTIFY_SUPERSEDED = 2
Global Const MCI_ABORTED = 4
Global Const MCI_FAILURE = 8

'Orientation Property
Global Const MCI_ORIENT_HORZ = 0
Global Const MCI_ORIENT_VERT = 1

'RecordMode Porperty
Global Const MCI_RECORD_INSERT = 0
Global Const MCI_RECORD_OVERWRITE = 1

'TimeFormat Property
Global Const MCI_FORMAT_MILLISECONDS = 0
Global Const MCI_FORMAT_HMS = 1
Global Const MCI_FORMAT_FRAMES = 3
Global Const MCI_FORMAT_SMPTE_24 = 4
Global Const MCI_FORMAT_SMPTE_25 = 5
Global Const MCI_FORMAT_SMPTE_30 = 6
Global Const MCI_FORMAT_SMPTE_30DROP = 7
Global Const MCI_FORMAT_BYTES = 8
Global Const MCI_FORMAT_SAMPLES = 9
Global Const MCI_FORMAT_TMSF = 10

'------------------------------------
'Spin Button
'------------------------------------
'SpinOrientation
Global Const SPIN_VERTICAL = 0
Global Const SPIN_HORIZONTAL = 1

'------------------------------------
'Masked Edit Control
'------------------------------------
'ClipMode
Global Const ME_INCLIT = 0
Global Const ME_EXCLIT = 1

'------------------------------------
'Comm Control
'------------------------------------
'Handshaking
Global Const MSCOMM_HANDSHAKE_NONE = 0
Global Const MSCOMM_HANDSHAKE_XONXOFF = 1
Global Const MSCOMM_HANDSHAKE_RTS = 2
Global Const MSCOMM_HANDSHAKE_RTSXONXOFF = 3

'Event constants
Global Const MSCOMM_EV_SEND = 1
Global Const MSCOMM_EV_RECEIVE = 2
```

CONSTANT.BAS - 16

```
Global Const MSCOMM_EV_CTS = 3
Global Const MSCOMM_EV_DSR = 4
Global Const MSCOMM_EV_CD = 5
Global Const MSCOMM_EV_RING = 6
Global Const MSCOMM_EV_EOF = 7

'Error code constants
Global Const MSCOMM_ER_BREAK = 1001
Global Const MSCOMM_ER_CTSTO = 1002
Global Const MSCOMM_ER_DSRTO = 1003
Global Const MSCOMM_ER_FRAME = 1004
Global Const MSCOMM_ER_OVERRUN = 1006
Global Const MSCOMM_ER_CDTO = 1007
Global Const MSCOMM_ER_RXOVER = 1008
Global Const MSCOMM_ER_RXPARITY = 1009
Global Const MSCOMM_ER_TXFULL = 1010

'---------------------------------------------------
' VBMAPIM CONTROL CONSTANTS (MAPI SESSION CONTROL)
'---------------------------------------------------
'Action
Global Const SESSION_SIGNON = 1
Global Const SESSION_SIGNOFF = 2

'---------------------------------------------------
' VBMAPIM CONTROL CONSTANTS (MAPI MESSAGE CONTROL)
'---------------------------------------------------
'Action
Global Const MESSAGE_FETCH = 1            ' Load all messages from message store
Global Const MESSAGE_SENDDLG = 2          ' Send mail bring up default mapi dialog
Global Const MESSAGE_SEND = 3             ' Send mail without default mapi dialog
Global Const MESSAGE_SAVEMSG = 4          ' Save message in the compose buffer
Global Const MESSAGE_COPY = 5             ' Copy current message to compose buffer
Global Const MESSAGE_COMPOSE = 6          ' Initialize compose buffer (previous
                                          ' data is lost
Global Const MESSAGE_REPLY = 7            ' Fill Compose buffer as REPLY
Global Const MESSAGE_REPLYALL = 8         ' Fill Compose buffer as REPLY ALL
Global Const MESSAGE_FORWARD = 9          ' Fill Compose buffer as FORWARD
Global Const MESSAGE_DELETE = 10          ' Delete current message
Global Const MESSAGE_SHOWADBOOK = 11      ' Show Address book
Global Const MESSAGE_SHOWDETAILS = 12     ' Show details of the current recipient
Global Const MESSAGE_RESOLVENAME = 13     ' Resolve the display name of the recipient
Global Const RECIPIENT_DELETE = 14          ' Fill Compose buffer as FORWARD
Global Const ATTACHMENT_DELETE = 15         ' Delete current message '---------------------------------------------------
'   ERROR CONSTANT DECLARATIONS (MAPI CONTROLS)
'---------------------------------------------------
Global Const SUCCESS_SUCCESS = 32000
Global Const MAPI_USER_ABORT = 32001
Global Const MAPI_E_FAILURE = 32002
Global Const MAPI_E_LOGIN_FAILURE = 32003
```

CONSTANT.BAS - 17      FULL

```
Global Const MAPI_E_DISK_FULL = 32004
Global Const MAPI_E_INSUFFICIENT_MEMORY = 32005
Global Const MAPI_E_ACCESS_DENIED = 32006
Global Const MAPI_E_TOO_MANY_SESSIONS = 32008
Global Const MAPI_E_TOO_MANY_FILES = 32009
Global Const MAPI_E_TOO_MANY_RECIPIENTS = 32010
Global Const MAPI_E_ATTACHMENT_NOT_FOUND = 32011
Global Const MAPI_E_ATTACHMENT_OPEN_FAILURE = 32012
Global Const MAPI_E_ATTACHMENT_WRITE_FAILURE = 32013
Global Const MAPI_E_UNKNOWN_RECIPIENT = 32014
Global Const MAPI_E_BAD_RECIPTYPE = 32015
Global Const MAPI_E_NO_MESSAGES = 32016
Global Const MAPI_E_INVALID_MESSAGE = 32017
Global Const MAPI_E_TEXT_TOO_LARGE = 32018
Global Const MAPI_E_INVALID_SESSION = 32019
Global Const MAPI_E_TYPE_NOT_SUPPORTED = 32020
Global Const MAPI_E_AMBIGUOUS_RECIPIENT = 32021
Global Const MAPI_E_MESSAGE_IN_USE = 32022
Global Const MAPI_E_NETWORK_FAILURE = 32023
Global Const MAPI_E_INVALID_EDITFIELDS = 32024
Global Const MAPI_E_INVALID_RECIPS = 32025
Global Const MAPI_E_NOT_SUPPORTED = 32026

Global Const CONTROL_E_SESSION_EXISTS = 32050
Global Const CONTROL_E_INVALID_BUFFER = 32051
Global Const CONTROL_E_INVALID_READ_BUFFER_ACTION = 32052
Global Const CONTROL_E_NO_SESSION = 32053
Global Const CONTROL_E_INVALID_RECIPIENT = 32054
Global Const CONTROL_E_INVALID_COMPOSE_BUFFER_ACTION = 32055
Global Const CONTROL_E_FAILURE = 32056
Global Const CONTROL_E_NO_RECIPIENTS = 32057
Global Const CONTROL_E_NO_ATTACHMENTS = 32058

'---------------------------------------------------------------
'  MISCELLANEOUS GLOBAL CONSTANT DECLARATIONS (MAPI CONTROLS)
'---------------------------------------------------------------
Global Const RECIPTYPE_ORIG = 0
Global Const RECIPTYPE_TO = 1
Global Const RECIPTYPE_CC = 2
Global Const RECIPTYPE_BCC = 3

Global Const ATTACHTYPE_DATA = 0
Global Const ATTACHTYPE_EOLE = 1
Global Const ATTACHTYPE_SOLE = 2

'---------------------------------------------------------------
'  ODBC
'---------------------------------------------------------------
'field type constants
Global Const FT_TRUEFALSE = 1
Global Const FT_BYTE = 2
Global Const FT_INTEGER = 3
Global Const FT_LONG = 4
Global Const FT_CURRENCY = 5
Global Const FT_SINGLE = 6
Global Const FT_DOUBLE = 7
Global Const FT_DATETIME = 8
Global Const FT_STRING = 10
Global Const FT_MEMO = 12
```

CONSTANT.BAS - 18

```
'
' Data Access constants
'

' Option argument values (CreateDynaset, etc)
Global Const DB_DENYWRITE = &H1
Global Const DB_DENYREAD = &H2
Global Const DB_READONLY = &H4
Global Const DB_APPENDONLY = &H8
Global Const DB_INCONSISTENT = &H10
Global Const DB_CONSISTENT = &H20
Global Const DB_SQLPASSTHROUGH = &H40

' SetDataAccessOption
Global Const DB_OPTIONINIPATH = 1

' Field Attributes
Global Const DB_FIXEDFIELD = &H1
Global Const DB_VARIABLEFIELD = &H2
Global Const DB_AUTOINCRFIELD = &H10
Global Const DB_UPDATABLEFIELD = &H20

' Field Data Types
Global Const DB_BOOLEAN = 1
Global Const DB_BYTE = 2
Global Const DB_INTEGER = 3
Global Const DB_LONG = 4
Global Const DB_CURRENCY = 5
Global Const DB_SINGLE = 6
Global Const DB_DOUBLE = 7
Global Const DB_DATE = 8
Global Const DB_TEXT = 10
Global Const DB_LONGBINARY = 11
Global Const DB_MEMO = 12

' TableDef Attributes
Global Const DB_ATTACHEXCLUSIVE = &H10000
Global Const DB_ATTACHSAVEPWD = &H20000
Global Const DB_SYSTEMOBJECT = &H80000002
Global Const DB_ATTACHEDTABLE = &H40000000
Global Const DB_ATTACHEDODBC = &H20000000

' ListTables TableType
Global Const DB_TABLE = 1
Global Const DB_QUERYDEF = 5

' ListTables Attributes (for QueryDefs)
Global Const DB_QACTION = &HF0
Global Const DB_QCROSSTAB = &H10
Global Const DB_QDELETE = &H20
Global Const DB_QUPDATE = &H30
Global Const DB_QAPPEND = &H40
Global Const DB_QMAKETABLE = &H50

' ListIndexes IndexAttributes values
Global Const DB_UNIQUE = 1
Global Const DB_PRIMARY = 2
Global Const DB_PROHIBITNULL = 4
Global Const DB_IGNORENULL = 8
```

CONSTANT.BAS - 19 Attributes

```
' ListIndexes FieldAttributes value
Global Const DB_DESCENDING = 1    'For each field in Index ' CreateDatabase and CompactDatabase Language constants
Global Const DB_LANG_GENERAL = ";LANGID=0x0809;CP=1252;COUNTRY=0"
Global Const DB_LANG_SPANISH = ";LANGID=0x040A;CP=1252;COUNTRY=0"
Global Const DB_LANG_DUTCH = ";LANGID=0x0413;CP=1252;COUNTRY=0"
Global Const DB_LANG_SWEDFIN = ";LANGID=0x040C;CP=1252;COUNTRY=0"    'VB3 and Access 1.1 Databases
Global Const DB_LANG_NORWDAN = ";LANGID=0x0414;CP=1252;COUNTRY=0"    'VB3 and Access 1.1 Databases
Global Const DB_LANG_ICELANDIC = ";LANGID=0x040F;CP=1252;COUNTRY=0"  'VB3 and Access 1.1 Databases
Global Const DB_LANG_NORDIC = ";LANGID=0x041D;CP=1252;COUNTRY=0"     'Access 1.0 Databases only ' CreateDatabase and CompactDatabase options
Global Const DB_VERSION10 = 1       ' Microsoft Access Version 1.0
Global Const DB_ENCRYPT = 2         ' Make database encrypted.
Global Const DB_DECRYPT = 4         ' Decrypt database while compacting.

'Collating order values
Global Const DB_SORTGENERAL = 256   ' Sort by EFGPI rules (English, French, German,Portuguese, Italian)
Global Const DB_SORTSPANISH = 258   ' Sort by Spanish rules
Global Const DB_SORTDUTCH = 259     ' Sort by Dutch rules
Global Const DB_SORTSWEDFIN = 260   ' Sort by Swedish, Finnish rules
Global Const DB_SORTNORWDAN = 261   ' Sort by Norwegian, Danish rules
Global Const DB_SORTICELANDIC = 262 ' Sort by Icelandic rules
Global Const DB_SORTPDXINTL = 4096  ' Sort by Paradox international rules
Global Const DB_SORTPDXSWE = 4097   ' Sort by Paradox Swedish, Finnish rules
Global Const DB_SORTPDXNOR = 4098   ' Sort by Paradox Norwegian, Danish rules
Global Const DB_SORTUNDEFINED = -1  ' Sort rules are undefined or unknown
```

GLOBAL.BAS - 1

```vb
Option Explicit
' SWiM For Windows
' Developed for ASKO, INC. by Wolf Consulting, Inc.
' April 1994.

'Windows 3.1 API Functions used to obtain startup directory.
Declare Function GetModuleHandle% Lib "kernel" (ByVal Filename$)
Declare Function GetModuleFileName% Lib "kernel" (ByVal hModule%, ByVal Filename$, ByVal nSize%)
Declare Function WinHelp Lib "User" (ByVal hWnd As Integer, ByVal lpHelpFile As String, ByVal wCommand As Integer, dwData As Any) As Integer Sub BottomRightForm (Form As Form)

' Set form location to bottom right of screen
    Form.Left = Screen.Width - Form.Width - 100
    Form.Top = Screen.Height - Form.Height - 100

End Sub

Sub CenterForm (Form As Form)
    ' Set form location to center of screen
    Form.Left = Screen.Width / 2 - Form.Width / 2
    Form.Top = Screen.Height / 2 - Form.Height / 2

End Sub

Function Formatx (nNumber As Variant, nDecimals As Integer) As Variant
    If nDecimals = 0 Then
        Formatx = Format(nNumber, "####0")
    ElseIf nDecimals = 1 Then
        Formatx = Format(nNumber, "####0.0")
    ElseIf nDecimals = 2 Then
        Formatx = Format(nNumber, "####0.00")
    ElseIf nDecimals = 3 Then
        Formatx = Format(nNumber, "####0.000")
    ElseIf nDecimals = 4 Then
        Formatx = Format(nNumber, "####0.0000")
    ElseIf nDecimals = 5 Then
        Formatx = Format(nNumber, "####0.00000")
    ElseIf nDecimals = 6 Then
        Formatx = Format(nNumber, "####0.000000")
    End If End Function Function Formatz (nNumber As Variant, nDecimals As Integer) As Variant
Dim TempNumber$
    If nDecimals = 0 Then
        TempNumber$ = Format(nNumber, "####0")
        Formatz = Space$(5 - Len(TempNumber$)) + TempNumber$
    ElseIf nDecimals = 1 Then
        TempNumber$ = Format(nNumber, "####0.0")
        Formatz = Space$(7 - Len(TempNumber$)) + TempNumber$
    ElseIf nDecimals = 2 Then
        TempNumber$ = Format(nNumber, "####0.00")
        Formatz = Space$(8 - Len(TempNumber$)) + TempNumber$
    ElseIf nDecimals = 3 Then
        TempNumber$ = Format(nNumber, "####0.000")
        Formatz = Space$(9 - Len(TempNumber$)) + TempNumber$
```

GLOBAL.BAS - 2

```
    ElseIf nDecimals = 4 Then
        TempNumber$ = Format(nNumber, "####0.0000")
        Formatz = Space$(10 - Len(TempNumber$)) + TempNumber$
    ElseIf nDecimals = 5 Then
        TempNumber$ = Format(nNumber, "####0.00000")
        Formatz = Space$(11 - Len(TempNumber$)) + TempNumber$
    ElseIf nDecimals = 6 Then
        TempNumber$ = Format(nNumber, "####0.000000")
        Formatz = Space$(12 - Len(TempNumber$)) + TempNumber$
    End If End Function Sub GetFileName (GetType%, Path$, Filename$, Success)
'This routine is called when opening , importing, or saving setup files.
    Dim Action%

On Error Resume Next

Swim.CMDialog1.Filter = "Setup File (*.set)|*.set|Import File (*.txt)|*.txt|Print File (*.prn)|*.prn|All Files (*.*)|*.*|"
    Swim.CMDialog1.CancelError = True
    Swim.CMDialog1.Filename = ""
    Swim.CMDialog1.InitDir = Path$ Select Case GetType
        Case OpenTheFile
            Swim.CMDialog1.DialogTitle = "Open Setup"
            Swim.CMDialog1.Flags = OFN_FILEMUSTEXIST Or OFN_HIDEREADONLY
            Swim.CMDialog1.DefaultExt = "SET"
            Swim.CMDialog1.FilterIndex = 1
            Action = 1
        Case SaveTheFile
            Swim.CMDialog1.DialogTitle = "Save Setup"
            Swim.CMDialog1.Flags = OFN_FILEMUSTEXIST Or OFN_HIDEREADONLY Or OFN_OVERWRITEPROMPT
            Swim.CMDialog1.DefaultExt = "SET"
            Swim.CMDialog1.FilterIndex = 1
            If Not CassSetup Then
                Swim.CMDialog1.Filename = SetupFileName$
            End If
            Action = 2
        Case ImportTheFile
            Swim.CMDialog1.DialogTitle = "Import Setup"
            Swim.CMDialog1.Flags = OFN_FILEMUSTEXIST Or OFN_HIDEREADONLY
            Swim.CMDialog1.DefaultExt = "TXT"
            Swim.CMDialog1.FilterIndex = 2
            Action = 1
        Case DeleteTheFile
            Swim.CMDialog1.DialogTitle = "Delete Setup"
            Swim.CMDialog1.Flags = OFN_FILEMUSTEXIST Or OFN_HIDEREADONLY
            Swim.CMDialog1.FilterIndex = 4
            Action = 1
        Case PrintTheFile
            Swim.CMDialog1.DialogTitle = "Print Setup"
            Swim.CMDialog1.Flags = OFN_FILEMUSTEXIST Or OFN_HIDEREADONLY
            Swim.CMDialog1.DefaultExt = "PRN"
            Swim.CMDialog1.FilterIndex = 3
            Action = 1
        Case PreviewTheFile
            Swim.CMDialog1.DialogTitle = "Preview Setup"
```

GLOBAL.BAS - 3

"CMDialog1"

```
            Swim.CMDialog1.Flags = OFN_FILEMUSTEXIST or OFN_HIDEREADONLY
            Swim.CMDialog1.DefaultExt = "PRN"
            Swim.CMDialog1.FilterIndex = 3
            Action = 1
    End Select Swim.CMDialog1.Action = Action        'Perform File Name Dialog If Err = 0 Then
        Filename$ = LCase$(Swim.CMDialog1.Filename)
        Success = True
    Else
        Success = False
    End If End Sub Sub PrintCenter (FileNum%, Text$)
'Print text Text$ centered on page
    Dim TabNo%

TabNo% = Int(PrinterWidth - Len(Text$)) / 2
    Print #FileNum%, Tab(TabNo%); Text$ End Sub Function Roundx (X As Variant, tol As Double, nDecimals As Integer) As Variant
Dim nNumber As Double
' Round nNumber to the next value of tol
    nNumber = tol * Int((X / tol) + .5001)

''''''''''''''''''''''''''''''''''''''''''''''''''''''
    'NOTE:
    ' HAD TO CHANGE +.5 TO +.5001 ABOVE FOR THIS TO
    ' ROUND UP CORRECTLY WITH VISUAL BASIC
    ''''''''''''''''''''''''''''''''''''''''''''''''''''''
    If nDecimals = 0 Then
        Roundx = Format(nNumber, "###0")
    ElseIf nDecimals = 1 Then
        Roundx = Format(nNumber, "###0.0")
    ElseIf nDecimals = 2 Then
        Roundx = Format(nNumber, "###0.00")
    ElseIf nDecimals = 3 Then
        Roundx = Format(nNumber, "###0.000")
    ElseIf nDecimals = 4 Then
        Roundx = Format(nNumber, "###0.0000")
    ElseIf nDecimals = 5 Then
        Roundx = Format(nNumber, "###0.00000")
    ElseIf nDecimals = 6 Then
        Roundx = Format(nNumber, "###0.000000")
    End If End Function
```

```
INIT.BAS - 1

Option Explicit
Global UsernameLogon$
Global PasswordLogon$

'Definition of Global constants and variables
Global Const OpenTheFile% = 1        'For File Open/Save - Indicates to open the
file
Global Const SaveTheFile% = 2        'For File Open/Save - Indicates to close the
file
Global Const ImportTheFile% = 3      'For File Open/Save - Indicates to close the
file
Global Const DeleteTheFile% = 4      'For File Open/Save - Indicates to delete th
e file
Global Const PrintTheFile% = 5       'For File Open/Save - Indicates to print the
file
Global Const PreviewTheFile% = 6     'For File Open/Save - Indicates to preview t
he file
Global Success%                      'logical variable, indicates success
Global CassSetup%                    'logical variable, indicates if new setup
Global Distance$(2)                  'Length measurement    i.e. "in." or "mm"
Global Weight$(2)                    'Weight measurement    i.e. "lb" or "kg"
Global Pressure$(2)                  'Pressure measurement  i.e. "K-PSI"
Global SwimDefaultDrive$             'Swim Default disk drive
Global SwimDefaultPath$              'Swim Default path
Global CassDefaultDrive$             'Swim Default disk drive
Global CassDefaultPath$              'Swim Default path
Global StartupDrive$                 'Startup disk drive
Global StartupPath$                  'Startup path
Global BackgroundColor&              'Stores color of form background color
Global ReportLength$                 'Default Report Length, Long, Abbrev, Short
Global Const PrinterWidth% = 80      'Width of printer/paper
Global PrintCharacters$              'S=Special or D=Default print characters
Global SetupFileName$                'Filename of current setup
Global CurrentMachine%
Global ConfirmDeletes%
Global DateFormat%
Global AutoGenerate%
Global ExitMethod%
Global PopupMenuCode%                'Code used to indicate data for popup menu o
n query form 'Program Maximums
Global Const MaxMachines% = 10
Global Const MaxNumberMults% = 99        'Maximum number of mults on Record
Global Const MinNumberMults% = 1         'Minimum number of mults on Record Global Const C_ENGLISH = 1
Global Const C_METRIC = 2

'Definition of program information
Global Const ProgramName$ = "SWiM"                   'Program name
Global Const ProgramCaption$ = "Slit Width Management"        'Program caption n
ame
Global Const ReportTitle$ = "SWiM - Slit Width Management"    'Report title 'Definition of developer information
Global Const DeveloperName$ = "ASKO, Inc."                              'Nam
e of the developer
Global Const DeveloperAddress1$ = "501 West 7th Avenue"                 'Add
ress of Developer
```

INIT.BAS - 2

*DeveloperAddress2* [handwritten annotation]

```
Global Const DeveloperAddress2$ = "Homestead, PA 15120-1036  USA"        'Address_2 of developer
Global Const DeveloperPhone$ = "(412) 461-4110"                          'Phone number of developer
Global Const Copyright$ = "Copyright 1994 ASKO, Inc.  All Rights Reserved"  'Copyright notice for reports 'Definition of user information
Global Const License$ = "12345"                        'User's license Number
Global Const CompanyName$ = "ABC Company"              'Name of the user
Global Const CompanyAddress1$ = "1000 Corporate Drive" 'Address_1 of user
Global Const CompanyAddress2$ = "Big City, PA 12345"   'Address_2 of user 'Definition of implementation variables
Global Const Units% = C_ENGLISH            'Unit of measure 1=English, 2=Metric
Global Const PasswordOption% = True        'Indicates if Usernames and Passwords are used 'Definition of data validity-check variables
Global Const MinMatThickness# = 0#         'Minimum allowable material thickness (Screen1)
Global Const MaxMatThickness# = .5         'Maximum allowable material thickness (Screen1)
Global Const MinTensile# = 0               'Minimum allowable tensile in K-PSI (Screen1)
Global Const MaxTensile# = 200             'Maximum allowable tensile in K-PSI (Screen1)
Global Const MinHC# = .0005                'Minimum allowable Horizontal Clearance (Screen1)
Global Const MaxHC# = .15                  'Maximum allowable Horizontal Clearance (Screen1)
Global Const MinMultWeight# = 0            'Minimum allowable mult weight (Screen2)
Global Const MaxMultWidth# = 60            'Maximum allowable mult width (Screen2)
Global Const HorzClearInc# = .0005         'Horizontal Clearance Increment
Global Const MultWidthInc# = .001          'Mult Width Increment
Global Const Precision% = 4                'Number of decimal places in Horizontal Clearance increment
Global Const MultWidthPrecision% = 3       'Number of decimal places in Mult Width increment
Global Const OASPrecision% = 3             'Number of decimal places in OAS Spacers
Global Const NumberDigitsMultBuild% = 2    'Number of decimals of mult to build in gagering
Global Const NumberDigitsClearBuild% = 3   'Number of decimals of clearance to build in gagering
Global Const MinPercentHC# = 0             'Minimum allowable %Clearance
Global Const MaxPercentHC# = 100           'Maximum allowable %Clearance 'user defined variable types
Type MachineType
    Description As String       'Description without "Spacer" or "Gagering"
    MenuCaption As String        'Description without "Spacer" or "Gagering"
    TableName As String         'Description without "Spacer" or "Gagering"
End Type Type EntryType
    Knife As Double             'knife selected for mults (screen 2)
```

```
INIT.BAS - 3                    Double
    WeightOrdered As Double         'weight ordered of mults (screen 2)
    WidthOrdered As Double          'width ordered of mults (screen 2)
    NumberMults As Integer          'number of mults per width (screen2)
    ActualWeight As Double          'actual weight of mults (screen2)
    FEMALE As Double                'female cut size (Screen2)
    male As Double                  'male cut size (Screen2)
    MALE_KT As Integer              'male KT (Screen2)
End Type Type ClassType
    Lower As Double                 'lower boundry of class interval
    Upper As Double                 'upper boundry of class interval
    Frequency As Integer            'class frequency (tabulation)
    RelativeFrequency As Double     'class frequency (percentage)
End Type Type SummaryType
    Lower As Double
    Upper As Double
End Type Global Machine() As MachineType
Global Entry() As EntryType
Global Class() As ClassType Global SummaryMaterialThicknessGroups%
Global SummaryTensileGroups%
Global SummaryHCGroups%
Global SummaryPercentHCGroups%
Global SummaryWidthOrderedGroups%

Global SummaryMaterialThickness() As SummaryType
Global SummaryTensile() As SummaryType
Global SummaryHC() As SummaryType
Global SummaryPercentHC() As SummaryType
Global SummaryWidthOrdered() As SummaryType 'Delcare variables and arrays used to store data
Global NumberMachines%              'Number of slitter machines (1-3)
Global CurrentDatabaseName$
Global CurrentTableName$
Global CurrentTableDescription$
Global MaterialThickness#           'Material Thickness (Screen1)
Global Tensile#                     'Tensile Strength (Screen1)
Global HC#                          'Horizonal Clearance (Screen1)
Global PercentHC#                   'Percent Clearance
Global OldMaterialThickness#            'Material Thickness (Screen1)
Global OldTensile#                      'Tensile Strength (Screen1)

Global OldHC#                           'Horizonal Clearance (Screen1)
Global dDate$
Global OlddDate$
                                        'Material Thickness (Screen1)
Global LowerMaterialThickness#          'Tensile Strength (Screen1)
Global LowerTensile#                    'Horizonal Clearance (Screen1)
Global LowerHC#
Global LowerDate$
Global LowerWidthOrdered#
Global LowerPercentHC#                  'Percent Clearance
Global UpperMaterialThickness#          'Material Thickness (Screen1)
Global UpperTensile#                    'Tensile Strength (Screen1)
Global UpperHC#                         'Horizonal Clearance (Screen1)
```

INIT.BAS - 4

```
Global UpperDate$
Global UpperWidthOrdered#
Global UpperPercentHC#                          'Percent Clearance Global TotalNumberMults%                        'Total of number of all mults for all mu
lt entries (Screen2)
Global NumberDifferentMults%                    'Total of number of different mult entri
es (Screen2)

Global StatCount%
Global StatMin#
Global StatMax#
Global StatAvg#
Global StatVar#
Global StatStDev#

'SWiM Constants
Global Const C_ESC = 0
Global Const C_NO_ESC = 1

Global Const C_CANCEL = 0
Global Const C_OK = 1

Global Const C_MATERIAL_THICKNESS = 0
Global Const C_TENSILE = 1
Global Const C_HC = 2
Global Const C_PERCENT_HC = 3
Global Const C_WIDTH_ORDERED = 4

Sub AddMachineData (ArrayIndex%, Description$, MenuCaption$, TableName$)

Machine(ArrayIndex%).Description$ = Description$
    Machine(ArrayIndex%).MenuCaption$ = MenuCaption$
    Machine(ArrayIndex%).TableName$ = TableName$ End Sub Sub Init ()
    Dim i%, J%    'counters 'Initialize units variables
    Distance$(C_ENGLISH) = "in"                 'Enlglish distance units
    Distance$(C_METRIC) = "mm"                  'Metric distance units
    Weight$(C_ENGLISH) = "lb"                   'Enlglish weight units
    Weight$(C_METRIC) = "kg"                    'Metric Weight units
    Pressure$(C_ENGLISH) = "K-PSI"              'Enlglish Pressure units
    Pressure$(C_METRIC) = "kg/mm²"              'Metric Pressure units 'Initialize Machine Arrays
    NumberMachines% = 3
    ReDim Machine(NumberMachines% - 1)

'AddMachineData (ArrayIndex%, Description$, MenuCaption$, TableName$)
    Call AddMachineData(0, "Machine1", "Machine&1", "Machine0")
    Call AddMachineData(1, "Machine2", "Machine&2", "Machine1")
    Call AddMachineData(2, "Machine3", "Machine&3", "Machine2")

'Initialize Summary Arrays
    SummaryMaterialThicknessGroups% = 7
```

```
INIT.BAS - 5                    (Thickness)

ReDim SummaryMaterialThickness(SummaryMaterialThicknessGroups% - 1)
    SummaryMaterialThickness(0).Lower# = 0
    SummaryMaterialThickness(0).Upper# = .0249
    SummaryMaterialThickness(1).Lower# = .025
    SummaryMaterialThickness(1).Upper# = .0639
    SummaryMaterialThickness(2).Lower# = .064
    SummaryMaterialThickness(2).Upper# = .1009
    SummaryMaterialThickness(3).Lower# = .101
    SummaryMaterialThickness(3).Upper# = .1499
    SummaryMaterialThickness(4).Lower# = .15
    SummaryMaterialThickness(4).Upper# = .2009
    SummaryMaterialThickness(5).Lower# = .201
    SummaryMaterialThickness(5).Upper# = .2759
    SummaryMaterialThickness(6).Lower# = .276
    SummaryMaterialThickness(6).Upper# = .5

SummaryTensileGroups% = 4
    ReDim SummaryTensile(SummaryTensileGroups% - 1)
    SummaryTensile(0).Lower# = 0
    SummaryTensile(0).Upper# = 39.99
    SummaryTensile(1).Lower# = 40
    SummaryTensile(1).Upper# = 64.99
    SummaryTensile(2).Lower# = 65
    SummaryTensile(2).Upper# = 100.99
    SummaryTensile(3).Lower# = 101
    SummaryTensile(3).Upper# = 200

SummaryHCGroups% = 1
    ReDim SummaryHC(SummaryHCGroups% - 1)
    SummaryHC(0).Lower# = 0
    SummaryHC(0).Upper# = .15

SummaryPercentHCGroups% = 5
    ReDim SummaryPercentHC(SummaryPercentHCGroups% - 1)
    SummaryPercentHC(0).Lower# = 0
    SummaryPercentHC(0).Upper# = .0799
    SummaryPercentHC(1).Lower# = .08
    SummaryPercentHC(1).Upper# = .1199
    SummaryPercentHC(2).Lower# = .12
    SummaryPercentHC(2).Upper# = .1799
    SummaryPercentHC(3).Lower# = .18
    SummaryPercentHC(3).Upper# = .2499
    SummaryPercentHC(4).Lower# = .25
    SummaryPercentHC(4).Upper# = 1

SummaryWidthOrderedGroups% = 5
    ReDim SummaryWidthOrdered(SummaryWidthOrderedGroups% - 1)
    SummaryWidthOrdered(0).Lower# = 0
    SummaryWidthOrdered(0).Upper# = .999
    SummaryWidthOrdered(1).Lower# = 1
    SummaryWidthOrdered(1).Upper# = 2.999
    SummaryWidthOrdered(2).Lower# = 3
    SummaryWidthOrdered(2).Upper# = 9.999
    SummaryWidthOrdered(3).Lower# = 10
    SummaryWidthOrdered(3).Upper# = 19.999
    SummaryWidthOrdered(4).Lower# = 20
    SummaryWidthOrdered(4).Upper# = 60

'Initialize Variables
    MaterialThickness# = 0              'Material Thickness (Screen1)
```

INIT.BAS - 6

```
    Tensile# = 0            'Tensile Strength (Screen1)
    HC# = 0                 'Horizonal Clearance (Screen1)

End Sub
```

VERSION.BAS - 1

Option Explicit

'Version Numbering System AA.BB.CC
'    AA=Major Release Upgrade
'    BB=Minor Release Upgrade
'    CC=Bug Fix/Patch/Very Minor Upgrade 'Current Version Number
Global Const version$ = "1.00.07"

'Version History
'VERSION#   DATE
'           DESCRIPTION OF CHANGES, REVISIONS, ADDITIONS, ENHANCEMENTS '1.00.00    04/08/94
'           Original documented version of SWIM.

'1.00.01    04/19/94
'           Delivery of next beta-version

'1.00.03    04/25/94
'           Delivery of next beta-version

'1.00.04    04/28/94
'           Implemented CASS-SWiM interface

'1.00.05    05/08/94
'           Disabled Report and Chart menu options in FormLoad() in Query
'               Screen. Added code in Execute Query() to check the count of
'               records returned from the query and disable the Report and
'               Chart menu options if 0 records are returned and clear the
'               statistics. Added code to Refresh to disable Report and Chart
'               menu options.
'           Added code to KeyPress() events in text boxes on Logon and
'               Password forms to convert lowercase letters to uppercase.
'           Resized Query form to be smaller '1.00.06    08/19/94
'           Changed all INIT data to examples provided by ASKO
'           Changed metric units in INIT to kg/mm²
'           Added Label8 to SWIM.FRM for "TM". Added code to FormLoad()
'               to position Label8 after Label1(Program Name).
'           Removed ® after at the end of the ProgramName$ variable
'           Replaced ® with TM in SWiM Help file.
'           Added text for Change Password and Define Users to SWiM help file.
'           Changed column titles on grids to Centered. Added code to
'               formload() events of Record, Browse, and Query to add units
'               to labels and grid column titles.

'1.00.07    08/23/94
'    Changed HC to only one grouping
'    Added %Clearance to all machine tables in SWIM.MDB.
'    Added %Clearance columns to grid on Record form. Revised code that
'        added units to grid columns to skip the %Clearance column. Widened
'        Record form and resided grid columns to accomodate new column. Added
'        Code to LostFocus() events of MaterialThickness and HC to replace
'        %Clearance colum with HC/MaterialThickness. Added code to import
'        CASS setup to automatically calculate and fill in %Clearance.
'    Added %Clearance columns to grid on Browse form. Revised code that

VERSION.BAS - 2

```
'         added units to grid columns to skip the %Clearance column.  Widened
'         Browse form and resided grid columns to accomodate new column.
'     Added %Clearance columns to grid on Query form. Revised code that
'         added units to grid columns to skip the %Clearance column.  Widened
'         Query form and resided grid columns to accomodate new column.
'     Added %Clearance label and textboxes to top of query form.
'     Added MinPercentHC, MaxPercentHC, Lower PercentHC#, and UpperPercentHC#
'         variables to Init().  Added %Clearance to code that executes the
'         query.
'     Added mnuPopup menu controls to Query form.  Created DisplayPopupMenu().
'         Created PopupMenuCode% global variable and constants for MT, Tensile,
'         HC, %HC, and WidthOrdered in Init().  Added code to double-click
'         event of text boxes on Queryform to display a popup menu with the
'         groupings for that item.  Added code to the click event for mnuPopUp
'         to set the VB variables and the text properties of the text boxes
'         based on the user's selction in the popup menu.
'     Added code to Record_Formload() to ask user how many master coils were
'         run when a CASS setup is imported.  Added a new loop to created a
'         group of entries in the Record table for every master coil run.

'QUESTIONS FOR TINA?
'     How to handle the proble of 0 being the low value for HC grouping, but
'         0 not being allowed as an entry in the lower HC text box on the
'         Query form.
```

What is claimed is:

1. A design tool for adjusting an arbor setup in rotary slitting of metal to account for slit width variation, comprising:
   a) a control module, the control module comprising a central processing unit,
   b) an input means in communicative connection with the control module at least for entering of data comprising data sets, each data set comprising a set of values of system variable affecting slit width variation, each set of values of system variables corresponding to an actual slitting run performed upon a slitter machine, each data set also comprising a slit width variation experienced in conjunction with the slitting run corresponding to the set of values of system variables of the data set,
   c) a memory in communicative connection with the control module for storing the data sets, the data sets stored in the list so that the set of values of the system variables of each data set is linked to and identifiable with the corresponding slit width experienced,
   wherein the control module further includes a means for identifying data sets from the list, the identified values of the system variables of the identified data sets falling within defined ranges of values of the system variables, the control module further including a means for performing a statistical analysis upon the identified data sets to provide a predictive indication of slit width variation to be experienced in a future slitting run in which the values of the system variable are within the defined ranges.

2. The design tool set forth in claim 1 wherein the system variables comprise a material thickness, a material tensile strength and a theoretical slit width.

3. The design tool set forth in claim 1 wherein the defined ranges are specified by an operator of the design tool via the input means.

4. The design tool set forth in claim 1 wherein the defined ranges are stored in the memory, a defined range for each system variable being specified by reference to a value of the corresponding system variable entered via the input means, the entered value of the system variable corresponding to the value of the system variable in a future slitting run.

5. The design tool of claim 1 further comprising a means of supplementing the data sets corresponding to actual slitting runs, the supplementing means comprising a means for creating supplemental data sets by data fitting between adjacent data sets in which all but one of the values of the system variables comprising the adjacent data sets are equivalent as between the adjacent data sets.

6. The design tool set forth in claim 1 further comprising a means for determining an arbor setup using the predictive indication of slit width variation, the predictive indication of slit width variation being used as a measurement of an adjustment required to spacing between consecutive knives on an arbor to achieve a desired slit width.

7. The design tool of claim 6 wherein the means for determining the arbor setup, comprises an independently operative, arbor setup design tool in communication with the design tool.

8. The design tool of claim 1 further comprising a means for creating an n-dimensional model of the data sets corresponding to actual slitting runs, wherein n is the number of independent system variables represented in the n-dimensional model, the n-dimensional model comprising a statistical correlation of the data sets corresponding to actual slitting runs, whereby a modeled predictive indication of slit width variation can be obtained upon entrance of values of the represented system variables to be used in a future slitting run.

9. The design tool of claim 8 wherein the modeled predictive indication of slit width variation is determined by the control module, referring to the n-dimensional model, upon entrance, via the input means, of the values of the represented system variables to be used in the future slitting run.

10. A method of adjusting arbor setup in rotary slitting of metal by predicting slit width variation using a design tool, the design tool comprising a control module, the control module comprising a central processing unit, the design tool further comprising an input means in communicative connection with the control module and a memory in communicating connection with the control module, the method comprising the steps of:
   a) entering data sets comprising sets of values of system variables affecting slit width variation using the input means, each of the sets of values of system variables corresponding to an actual slitting run performed on a slitting machine, each data set further comprising a slit width variation experienced corresponding to the set of values of system variables in the data set,
   b) storing the data sets in the memory in the form of a list, the slit width experienced corresponding to each of the sets of values of system variables being linked to the set of system variables corresponding therewith to enable identification therewith,
   c) defining a query range of values for each of the system variables,
   d) identifying data sets in which the value of each of the system variables in the identified data sets falls within the corresponding query range of values upon providing a query command to the command module, the values of the actual slit width experienced corresponding to each of the identified sets of values of system variables being identified with its corresponding set of values of system variables, and
   e) performing a statistical analysis upon the identified values of slit width variation experienced to provide a predictive indication of a slit width variation to be experienced in a future slitting run in which the values of the system variable fall within the defined query ranges.

11. The method of claim 10 wherein the system variables comprise a material thickness, a material tensile strength and a theoretical slit width.

12. The method of claim 10 further comprising the step of entering via the input means the defined query range of values for each of the system variables comprising the data sets.

13. The method of claim 10 further comprising the steps of storing in the memory at least one defined query range for each system variable comprising the data sets, entering via the input means values of system variables to be used in a future slitting run, and specifying one stored, defined query range for each system variable by reference to the value of the system variable to be used in the future slitting run, the specified, defined query range encompassing the value of the corresponding system variable.

14. The method of claim 10 further comprising the step of creating supplemental data sets by statistically fitting data between adjacent data sets in which all but one of the values of the system variables comprising the adjacent data sets are equivalent as between the adjacent data sets.

15. The method of claim 14 wherein the supplemental data sets are stored in the memory for access by the control module.

16. The method of claim 10 further comprising the step of determining the arbor setup using the predictive indication of slit width variation.

17. The method of claim 16 wherein the arbor setup is determined by communication of a second, independently operative design tool with the design tool.

18. The method of claim 10 further comprising the step of creating an n-dimensional model of the data sets wherein n is the number of independent system variables represented in the n-dimensional model, the n-dimensional model comprising a statistical correlation of the data sets corresponding to actual slitting runs, whereby a modeled predictive indication of slit width variation can be obtained upon entrance of the values of the system variables to be used in a future slitting run.

19. The method of claim 18 wherein the modeled predictive indication of slit width variation is provided by the control module, referring to the n-dimensional model, upon entrance, via the input means, of the values of the system variables to be used in the future slitting run.

* * * * *